(12) United States Patent
Smith et al.

(10) Patent No.: US 11,004,943 B2
(45) Date of Patent: May 11, 2021

(54) POROUS AND NANOPOROUS SEMICONDUCTOR MATERIALS AND MANUFACTURE THEREOF

(71) Applicant: Massachusetts Institute of Technology, Cambridge, MA (US)

(72) Inventors: Brendan Derek Smith, Cambridge, MA (US); Jeffrey C. Grossman, Brookline, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 16/376,801

(22) Filed: Apr. 5, 2019

(65) Prior Publication Data

US 2019/0312112 A1 Oct. 10, 2019

Related U.S. Application Data

(60) Provisional application No. 62/653,266, filed on Apr. 5, 2018.

(51) Int. Cl.
| | |
|---|---|
| H01L 29/32 | (2006.01) |
| H01L 29/24 | (2006.01) |
| H01L 29/20 | (2006.01) |
| H01L 29/16 | (2006.01) |
| H01L 21/3065 | (2006.01) |
| H01L 21/308 | (2006.01) |
| H01L 21/324 | (2006.01) |

(52) U.S. Cl.
CPC ............ *H01L 29/32* (2013.01); *H01L 21/308* (2013.01); *H01L 21/3065* (2013.01); *H01L 21/324* (2013.01); *H01L 29/1606* (2013.01); *H01L 29/2003* (2013.01); *H01L 29/24* (2013.01)

(58) Field of Classification Search
CPC . H01L 29/1606; H01L 29/2003; H01L 29/24; H01L 29/30; H01L 29/32
USPC .......................................................... 257/613
See application file for complete search history.

(56) References Cited

U.S. PATENT DOCUMENTS

| | | |
|---|---|---|
| 6,790,785 B1 | 9/2004 | Li et al. |
| 7,843,562 B2 | 11/2010 | Chan et al. |
| 8,299,613 B2 | 10/2012 | Oppermann |
| 8,722,196 B2 | 5/2014 | Yae et al. |
| 9,028,982 B2 | 2/2015 | Yae et al. |

(Continued)

FOREIGN PATENT DOCUMENTS

| | | |
|---|---|---|
| CN | 1922486 | 2/2007 |
| CN | 101960045 | 1/2011 |

(Continued)

OTHER PUBLICATIONS

Invitation to Pay Additional Fees dated Jun. 7, 2019 for Application No. PCT/US2019/026051.

(Continued)

*Primary Examiner* — Matthew E Warren
(74) *Attorney, Agent, or Firm* — Wolf, Greenfield & Sacks, P.C.

(57) ABSTRACT

Methods for forming porous or nanoporous semiconductor materials are described. The methods allow for the formation of arrays pores or nanopores in semiconductor materials with advantageous pore size, spacing, pore volume, material thickness, and other aspects. Porous and nanoporous materials also are provided.

15 Claims, 37 Drawing Sheets

(56) References Cited

U.S. PATENT DOCUMENTS

| | | | |
|---|---|---|---|
| 10,128,341 B2 | 11/2018 | Grossman et al. | |
| 2002/0170875 A1 | 11/2002 | Benzel et al. | |
| 2002/0192680 A1 | 12/2002 | Chan et al. | |
| 2003/0116531 A1 | 6/2003 | Kamins et al. | |
| 2007/0007241 A1 | 1/2007 | DeLause et al. | |
| 2010/0139772 A1 | 6/2010 | Frank et al. | |
| 2013/0034714 A1 | 2/2013 | Canham et al. | |
| 2013/0081679 A1* | 4/2013 | Qu | H01L 31/035227 136/255 |
| 2013/0292839 A1* | 11/2013 | Fukami | C01B 33/02 257/773 |
| 2014/0048126 A1 | 2/2014 | Dorval Courchesne et al. | |
| 2016/0194779 A1* | 7/2016 | Umemoto | C25D 11/18 428/307.3 |
| 2017/0237234 A1 | 8/2017 | Han et al. | |
| 2017/0271459 A1 | 9/2017 | Grossman et al. | |
| 2019/0074212 A1* | 3/2019 | Muri | H01L 29/66734 |
| 2019/0088748 A1 | 3/2019 | Grossman et al. | |
| 2019/0148570 A1* | 5/2019 | Wu | H01L 27/14685 257/187 |

FOREIGN PATENT DOCUMENTS

| | | |
|---|---|---|
| CN | 103210029 | 7/2013 |
| CN | 105408102 | 3/2016 |
| EP | 2439766 A1 | 4/2012 |
| WO | WO 2013/093504 A2 | 6/2013 |
| WO | WO 2014/152435 A1 | 9/2014 |
| WO | WO 2017/161224 A1 | 9/2017 |
| WO | WO 2018/112297 | 6/2018 |

OTHER PUBLICATIONS

Almecija et al., Influence of the cleaning temperature on the permeability of ceramic membranes. Desalination. Sep. 15, 2009;245(1-3):708-13.

Bai et al., Graphene nanomesh. Nat Nanotechnol. Mar. 2010;5(3):190-4. doi: 10.1038/nnano.2010.8. Epub Feb. 14, 2010 Author Manuscript, 11 pages.

Celebi et al., Ultimate permeation across atomically thin porous graphene. Science. Apr. 18, 2014;344(6181):289-92. doi:10.1126/science.1249097.

International Search Report and Written Opinion for Application No. PCT/US2019/026051 dated Aug. 2, 2019.

International Search Report and Written Opinion for Application No. PCT/US2017/022880 dated Jun. 28, 2017.

International Preliminary Report on Patentability for Application No. PCT/US2017/022880 dated Sep. 27, 2018.

Achar et al., Fabrication of ultrathin silicon nanoporous membranes and their application in filtering industrially important biomolecules. IEEE Trans Nanotechnol; Jul. 2013;12(4):583-88.

Alam et al., Oxygen plasma and humidity dependent surface analysis of silicon, silicon dioxide and glass for direct wafer bonding. ECS J Solid State Sci Technol. 2013;2(12):P515-23. Epub Oct. 22, 2013.

Andreazza et al., Nucleation and initial growth of platinum islands by plasma sputter deposition. Surf Coatings Technol. Mar. 1, 2002;151-152:122-7.

Andrew et al., Confining light to deep subwavelength dimensions to enable optical nanopatterning. Science. May 15, 2009;324(5929):917-21. doi: 10.1126/science.1167704. Epub Apr. 9, 2009.

Aqra et al., Surface free energy of alkali and transition metal nanoparticles. Appl Surf Sci. Sep. 30, 2014;314:308-13. Epub Jul. 9, 2014.

Asoh et al., Effect of noble metal catalyst species on the morphology of macroporous silicon formed by metal-assisted chemical etching. Electrochim Acta. 2009;54:5142-5148. Epub Jan. 24, 2009.

Asoh et al., Sub-100-nm ordered silicon hole arrays by metal-assisted chemical etching. Nanoscale Res Lett. Oct. 4, 2013;8(1):410(1-8). doi: 10.1186/1556-276X-8-410.

Bai et al., Titanium dioxide nanomaterials for sensor applications. Chem Rev. 2014; 114(19):10131-76. Epub Jun. 12, 2014.

Bal et al., Interfacial role in room-temperature diffusion of Au into Si substrates. Phys. Rev. B: Condens Matter Mater Phys. 2007;75: 205411(1-6). Epub May 8, 2007.

Bang et al., Mass production of uniform-sized nanoporous silicon nanowire anodes via block copolymer lithography. Energy Environ Sci. 2011;4:3395-9. Epub Aug. 1, 2011.

Bennett et al., Efficient thermoelectric performance in silicon nano-films by vacancy-engineering. Nano Energy. Sep. 2015;16:350-6. Epub Jul. 20, 2015.

Benoit et al., Formation of Si nanowire arrays by metal-assisted chemical etching. ECS Trans. 2008;16(3):245-52.

Booker et al., Metal-assisted chemical etching for very high aspect ratio grooves in n-type silicon wafers. J Michromech Microeng. Nov. 2014;24(12):125026(6pgs).

Branz et al., Nanostructured black silicon and the optical reflectance of graded-density surfaces. Appl Phys Lett. Jun. 2009;94(23):23112, 3 pages. Epub Jun. 11, 2009.

Chakraborty et al., Symmetry-dependent phonon renormalization in monolayer MoS2 transistor. Phys Rev B. 2012;85:161403R(1-4).

Chang et al., Densely packed arrays of ultra-high-aspect-ratio silicon nanowires fabricated using block-copolymer lithography and metal-assisted etching. Adv Funct Mater. Aug. 2009;19(15):2495-500.

Chang et al., Ultra-high aspect ratio high-resolution nanofabrication for hard X-ray diffractive optics. Nat Commun. Jun. 27, 2014;5:4243(1-7). doi: 10.1038/ncomms5243.

Chartier et al., Metal-assisted chemical etching of silicon in HF—$H_2O_2$. Electrochim Acta. Jul. 1, 2008;53(17):5509-16. Epub Mar. 13, 2008.

Chen et al., Titanium dioxide nanomaterials: synthesis, properties, modifications, and applications. Chem Rev. Jul. 2007;107(7):2891-959. Epub Jun. 23, 2007.

Chen et al., Wafer-scale synthesis of single-crystal zigzag silicon nanowire arrays with controlled turning angles. Nano Lett. Mar. 10, 2010;10(3):864-8. doi: 10.1021/n1903391x.

Chern et al., Nonlithographic patterning and metal-assisted chemical etching for manufacturing of tunable light-emitting silicon nanowire arrays. Nano Lett. May 12, 2010;10(5):1582-8. doi: 10.1021/n1903841a. Epub Apr. 27, 2010.

Chong et al., Nanoporous silicon produced by metal-assisted etching: a detailed investigation of optical and contact properties for solar cells. IEEE J Photovoltaics. Mar. 2015;5(2):538-44.

Cohen-Tanugi et al., Water desalination across nanoporous graphene. Nano Lett. Jul. 11, 2012;12(7):3602-8. doi: 10.1021/nl3012853. Epub Jun. 5, 2012.

Conrad et al., Influence of surface defects on the nucleation and growth of thin discontinuous gold films. Int J Electron. 1990;69(1):153-67.

Cromey et al., Effect of elevated temperature on ceramic ultrafiltration of colloidal suspensions. J Environ Eng. 2015;141(6):04014096(1-7).

Daufin et al., Cleaning of inorganic membranes after whey and milk ultrafiltration. Biotechnol Bioeng. Jun. 5, 1991;38(1):82-9.

Dawood et al., Influence of catalytic gold and silver metal nanoparticles on structural, optical, and vibrational properties of silicon nanowires synthesized by metal-assisted chemical etching. J Appl Phys. 2012; 112(7):073509(1-8). doi: 10.1063/1.4757009. Epub Oct. 4, 2012.

Deng et al., Characterization of nanoporous silicon-based DNA biosensor for the detection of *Salmonella enteritidis*. IEEE Sensors Journal. Jun. 2008;8(6):775-80.

Desai et al., Nanoporous anti-fouling silicon membranes for biosensor applications. Biosens Bioelectron. 2000;15(9-10):453-62.

Dzhafarov et al., Effect of nanoporous silicon coating on silicon solar cell performance. Vacuum, 2012;86(12):1875-79.

Elam et al., Conformal coating on ultrahigh-aspect-ratio nanopores of anodic alumina by atomic layer deposition. Chem Mater. 2003;15(18):3507-17.

Faustini et al., Ultraporous nanocrystalline $TiO_2$-based films: synthesis, patterning and application as anti-reflective, self-cleaning, superhydrophilic coatings. Nanoscale. Dec. 14, 2015;7(46):19419-25. doi: 10.1039/c5nr06466j. Epub Oct. 28, 2015.

(56) References Cited

OTHER PUBLICATIONS

Fischbein et al., Electron beam nanosculpting of suspended graphene sheets. Appl Phys Lett. 2008:93(11):113107(1-3). Epub Sep. 16, 2008.

Fissell et al., High-performance silicon nanopore hemofiltration membranes. J Memb Sci. Jan. 5, 2009;326(1):58-63. Epub Sep. 30, 2008.

Fujishima et al., $TiO_2$ photocatalysis and related surface phenomena. Surf. Sci. Rep. 2008;63:515-582.

Gaborski et al., High-performance separation of nanoparticles with ultrathin porous nanocrystalline silicon membranes. ACS Nano. Nov. 23, 2010;4(11):6973-81. doi: 10.1021/nn102064c. Epub Nov. 2, 2010.

Gebhard et al., An efficient PE-ALD process for $TiO_2$ thin films employing a new Ti-precursor. J Mater Chem C. 2016;4:1057-65. Epub Jan. 11, 2016.

Geyer et al., Model for the mass transport during metal-assisted chemical etching with contiguous films as catalysts. J Phys Chem C. 2012;116:13446-13451. Epub May 24, 2012.

Graf et al., Silicon surface treatments and their impact on chemical composition and morphology. Mater Res Soc Symp Proc. 1993;315:23-33.

Guder et al., Tracing the migration history of metal catalysts in metal-assisted chemically etched silicon. ACS Nano. Feb. 26, 2013;7(2):1583-90. doi: 10.1021/nn305413r. Epub Feb. 5, 2013.

Guo et al., Thermal transport in nanoporous Si: Anisotropy and junction effects. Int J Heat Mass Transfer. Oct. 2014;77:131-9. Epub Jun. 5, 2014.

Han et al., Nanoporous silicon-assisted patterning of monolayer MoS2 with thermally controlled porosity: a scalable method for diverse applications. ACS Appl Nano Mater. 2018;1:3548-56. Epub Jun. 6, 2018.

Han et al., Photoluminescent arrays of nanopatterned monolayer MoS2. Adv Funct Mater. Dec. 2017;27(45):1703688(1-12). Epub Oct. 13, 2017.

Harada et al., Catalytic amplification of the soft lithographic patterning of Si. Nonelectrochemical orthogonal fabrication of photoluminescent porous Si pixel arrays. J Am Chem Soc. Sep. 12, 2001;123(36):8709-17. Epub Aug. 16, 2001.

Hashimoto et al., $TiO_2$ photocatalysis: a historical overview and future prospects. Jpn J Appl Phys. 2005;44(12):8269-8285.

Homan et al., Silica-coated gold nanoparticles: surface chemistry, properties, benefits and applications. Sigma-Aldrich Catalog, http://www.sigmaaldrich.com/technical-documents/articles/materials-science/silica-coated-gold-nanoparticles.html, accessed on the internet Oct. 10, 2017, 7 pages.

Hsu et al., Fabrication and characteristics of black silicon for solar cell applications: An overview. Mater Sci Semicond Process. 2014;25:2-17. Epub Feb. 20, 2014.

Huang et al., Metal-assisted chemical etching of silicon: a review. Adv Mater. Jan. 11, 2011;23(2):285-308. doi: 10.1002/adma.201001784.

Huang et al., Extended arrays of vertically aligned sub-10 nm diameter [100] Si nanowires by metal-assisted chemical etching. Nano Lett. Sep. 2008;8(9):3046-51. doi: 10.1021/nl802324y. Epub Aug. 13, 2008.

Huang et al., Fabrication of nanoporous antireflection surfaces on silicon. Sol Energy Mater & Sol Cells. 2008;92:1352-7. Epub Jul. 1, 2008.

Ivanov et al., Electrochemical performance of nanoporous Si as anode for lithium ion batteries in alkyl carbonate and ionic liquid-based electrolytes. J Appl Electrochem. Jan. 2014;44(1):159-68. Epub Aug. 30, 2013.

Jiang et al., Porous graphene as the ultimate membrane for gas separation. Nano Lett. Dec. 2009;9(12):4019-24. doi: 10.1021/nl9021946. Epub Sep. 23, 2009.

Kemmenoe et al., Structure analysis of sputter-coated and ion-beam sputter-coated films: a comparative study. J Microsc. Nov. 1983;132(Pt 2):153-63.

Kim et al., Three-dimensional porous silicon particles for use in high-performance lithium secondary batteries. Angew Chem Int Ed Engl. 2008;47(52):10151-4. doi: 10.1002/anie.200804355.

Klankowski et al., A novel high-power battery-pseudocapacitor hybrid based on fast lithium reactions in silicon anode and titanium dioxide cathode coated on vertically aligned carbon nanofibers. Electrochimica Acta, 2015;178:797-805. Epub Aug. 21, 2015.

Kobayashi et al., Nitric acid oxidation of Si to form ultrathin silicon dioxide layers with a low leakage current density. J Appl Phys. Dec. 2003;94(11):7328-35. Epub Nov. 10, 2003.

Lai et al., Mechanics of catalyst motion during metal assisted chemical etching of silicon. J Phys Chem C. Sep. 2013;117(40):20802-9.

Lee et al., Pore formation in silicon by wet etching using micrometre-sized metal particles as catalysts. J Mater Chem. 2008;18:1015-20. Epub Jan. 21, 2008.

Lee et al., Nanoporous Si as an efficient thermoelectric material. Nano Lett. Nov. 2008;8(11):3750-4. doi: 10.1021/nl802045f. Epub Oct. 24, 2008.

Lee et al., Ballistic phonon transport in holey silicon. Nano Lett. May 13, 2015;15(5):3273-9. doi: 10.1021/acs.nanolett.5b00495. Epub Apr. 10, 2015.

Letant et al., Functionalized silicon membranes for selective bio-organism capture. Nat Mater. Jun. 2003;2(6):391-5; Suppl Info 1 page. Epub Apr. 27, 2013.

Li et al., Metal-assisted chemical etching in $HF/H_2O_2$ produces porous silicon. Appl. Phys. Lett. Oct. 16, 2000;77(16):2572-4.

Li, Metal assisted chemical etching for high aspect ratio nanostructures: A review of characteristics and applications in photovoltaics. Curr Opin Solid State Mater Sci. Apr. 2012;16(2):71-81. Epub Dec. 13, 2011.

Li et al., Computational modeling and analysis of thermoelectric properties of nanoporous silicon. J Appl Phys. 2014;115(12):124316(1-14).

Liu et al., Anisotropic nanoparticles as shape-directing catalysts for the chemical etching of silicon. J Am Chem Soc. Aug. 21, 2013;135(33):12196-9. doi: 10.1021/ja4061867. Epub Aug. 1, 2013.

Liu et al., Hard mask free DRIE of crystalline Si nanobarrel with 6.7nm wall thickness and 50:1 aspect ratio. 2015 28th IEEE Int Conf Micro Electro Mech Syst (MEMS). Date of Conference Jan. 18-22, 2015, Estoril, Portugal; Pub Mar. 2, 2015; pp. 77-80.

Liu et al., Fabrication of bifacial wafer-scale silicon nanowire arrays with ultra-high aspect ratio through controllable metal-assisted chemical etching. Mater Lett. Jan. 15, 2015;139:437-42. Epub Nov. 4, 2014.

Liu et al., Low-temperature plasma etching of high aspect-ratio densely packed 15 to sub-10 nm silicon features derived from PS-PMDS block copolymer patterns. Nanotechnology. Jun. 2014;25(28):285301(1-8).

Lu et al., Nanopore-type black silicon anti-reflection layers fabricated by a one-step silver-assisted chemical etching. Phys Chem Chem Phys. Jun. 28, 2013;15(24):9862-70. doi: 10.1039/c3cp51835c. Epub May 8, 2013.

Lu et al., Anti-reflection layers fabricated by a one-step copper-assisted chemical etching with inverted pyramidal structures intermediate between texturing and nanopore-type black silicon. J Mater Chem A. 2014;2:12043-52. Epub Jun. 4, 2014.

Manfrinato et al., Determining the resolution limits of electron-beam lithography: direct measurement of the point-spread function. Nano Lett. Aug. 13, 2014;14(8):4406-12. doi: 10.1021/nl5013773. Epub Jun. 24, 2014.

Mao et al., Fabrication of porous $TiO_2$—$SiO_2$ multifunctional anti-reflection coatings by sol-gel spin coating method. RSC Adv. 2014;4:58101-7. Epub Oct. 30, 2014.

Merchant et al., DNA translocation through graphene nanopores. Nano Lett. Aug. 11, 2010;10(8):2915-21. doi: 10.1021/nl101046t. Epub Jul. 23, 2010.

Min et al., The role of interparticle and external forces in nanoparticle assembly. Nat Mater. Jul. 2008;7(7):527-38. doi:10.1038/nmat2206.

Mine et al., Direct coating of gold nanoparticles with silica by a seeded polymerization technique. J Colloid Interface Sci. Aug. 15, 2003;264(2):385-90.

(56) References Cited

OTHER PUBLICATIONS

Mouri et al., Tunable photoluminescence of monolayer $MoS_2$ via chemical doping. Nano Lett. 2013;13(12):5944-8. doi: 10.1021/nl403036h. Epub Nov. 12, 2013.
Nakata et al., $TiO_2$ photocatalysis: Design and applications. J. Photochem. Photobiol. C. 2012;13:169-89, doi:10.1016/j.jphotochemrev.2012.06.001. Epub Jun. 9, 2012.
Nan et al., Strong photoluminescence enhancement of MoS(2) through defect engineering and oxygen bonding. ACS Nano. Jun. 24, 2014;8(6):5738-45. doi: 10.1021/nn500532f. Epub May 16, 2014.
Nomura et al., Room-temperature fabrication of transparent flexible thin-film transistors using amorphous oxide semiconductors. Nature. Nov. 25, 2004;432(7016):488-92.
O'Hern et al., Selective ionic transport through tunable subnanometer pores in single-layer graphene membranes. Nano Lett. Mar. 12, 2014;14(3):1234-41. doi: 10.1021/nl404118f. Epub Feb. 3, 2014.
Oh et al., Nanoporous black silicon photocathode for H2 production by photoelectrochemical water splitting. Energy Environ. Sci 2011;4:1690-4. Epub Apr. 5, 2011.
Oh et al., Photochemical reaction in monolayer MoS2 via correlated photoluminescence, raman spectroscopy, and atomic force microscopy. ACS Nano. May 24, 2016;10(5):5230-6. doi: 10.1021/acsnano.6b00895. Epub Apr. 25, 2016.
Parasuraman et al., Deep reactive ion etching of sub-micrometer trenches with ultra-high aspect ratio. Microelectronic Engineering. Jan. 2014;113:35-9. Epub Jul. 17, 2013.
Park et al., Synthesis and electrochemical characterization of anode material with titanium-silicon alloy solid core/nanoporous silicon shell structures for lithium rechargeable batteries. J Power Sources. Dec. 2015;299:537-43. Epub Sep. 21, 2015.
Patil et al., Ultra-high aspect ratio functional nanoporous silicon via nucleated catalysts. RSC Adv. 2017;7:11537-42. Epub Feb. 14, 2017.
Pecora et al., Nanopatterning of silicon nanowires for enhancing visible photoluminescence. Nanoscale. Apr. 28, 2012;4(9):2863-6. doi: 10.1039/c2nr30165b. Epub Mar. 2, 2012.
Peng et al., Motility of metal nanoparticles in silicon and induced anisotropic silicon etching. Adv Funct Mater. Oct. 9, 2008;18(19):3026-35. Epub Sep. 22, 2008.
Perrey et al., Insights into nanoparticle formation mechanisms. J Mater Sci. May 2006;41:2711-22. Epub Apr. 17, 2006.
Reiners et al., Growth and crystallization of $TiO_2$ thin films by atomic layer deposition using a novel amido guanidinate titanium source and tetrakis-dimethylamido-titanium. Chem Mater. 2013;25(15):2934-43. Epub Jul. 2, 2013.
Scheeler et al., Fabrication of porous silicon by metal-assisted etching using highly ordered gold nanoparticle arrays. Nanoscale Res Lett. Aug. 9, 2012;7(1):450(1-7). doi: 10.1186/1556-276X-7-450.
Shi et al., Nanoporous black multi-crystalline silicon solar cells: realization of low reflectance and explanation of high recombination loss. Mater Sci Semicond Process. Apr. 2013;16(2):441-8. Epub Sep. 28, 2012.
Shi et al., Electronic and optical properties of nanoporous silicon for solar-cell applications. ACS Photonics. 2015;2(2):208-15. Epub Dec. 2, 2014.
Smith et al., Catalyst self-assembly for scalable patterning of sub 10 nm ultrahigh aspect ratio nanopores in silicon. ACS Appl Mater Interfaces. Mar. 2016;8(12):8043-9. doi: 10.1021/acsami.6b01927. Epub Mar. 21, 2016.
Smith et al., Mechanism of nanowire formation in metal assisted chemical etching. Electrochim Acta. Mar. 2013;92:139-47. Epub Jan. 5, 2013.
Splendiani et al., Emerging photoluminescence in monolayer MoS2. Nano Lett. Apr. 14, 2010;10(4):1271-5. doi: 10.1021/nl903868w. Epub Mar. 15, 2010.
Striemer et al., Charge- and size-based separation of macromolecules using ultrathin silicon membranes. Nature. Feb. 15, 2007;445(7129):749-53.
Su et al., Ultrathin alumina mask-assisted nanopore patterning on monolayer MoS(2) for highly catalytic efficiency in hydrogen evolution reaction. ACS Appl Mater Interfaces. Mar. 7, 2018;10(9):8026-8035. doi: 10.1021/acsami.7b19197. Epub Feb. 20, 2018.
Tang et al., Holey silicon as an efficient thermoelectric material. Nano Lett. Oct. 13, 2010;10(10):4279-83. doi: 10.1021/nl102931z. Epub Sep. 14, 2010.
Tong et al., Surface plasmon resonance properties of DC magnetron sputtered Ag nanoislands on ITO-glass and In2O3-PET substrates. Electronics Letters. Apr. 10, 2014;50(8):623-634. doi: 10.1049/el.2014.0442.
Toor et al., Multi-scale surface texture to improve blue response of nanoporous black silicon solar cells. Appl. Phys. Lett. 2011;99:103501(1-3). Epub Sep. 6, 2011.
Tsujino et al., Boring deep cylindrical nanoholes in silicon using silver nanoparticles as a catalyst. Adv Mater. Apr. 18, 2005;17(8):1045-1047.
Tsujino et al., Morphology of nanoholes formed in silicon by wet etching in solutions containing HF and $H_2O_2$ at different concentrations using silver nanoparticles as catalysts. Electrochim Acta. 2007; 53:28-34. Epub Jan. 30, 2007.
Uhlir, Electrolytic shaping of germanium and silicon. Bell System Tech J. 1956; 35(2):333-347.
Usher, The contribution of kinetic nucleation theories to studies of Volmer-Weber thin film growth. Appl Surf Sci. May 1985;22-23(Part 2):506-11.
Vanderkooy et al., Silica shell/gold core nanoparticles: correlating shell thickness with the plasmonic red shift upon aggregation. ACS Appl Mater Interfaces. Oct. 2011;3(1):3942-7. doi: 10.1021/am200825f. Epub Sep. 1, 2011.
Vitos et al., The surface energy of metals. Surf Sci. 1998;411:186-202.
Wang et al., Creation of nanopores on graphene planes with MgO template for preparing high-performance supercapacitor electrodes. Nanoscale. Jun. 21, 2014;6(12):6577-84. doi: 10.1039/c4nr00538d.
Wang et al., Large-area free-standing ultrathin single-crystal silicon as processable materials. Nano Lett. 2013;13(9):4393-8. Epub Jul. 22, 2013.
Wang et al., Shape evolution of monolayer MoS(2) crystals grown by chemical vapor deposition. Chem Mater. 2014;26:6371-6379. Epub Nov. 4, 2014.
Wei et al., Mo—O bond doping and related-defect assisted enhancement of photoluminescence in monolayer MoS2. AIP Advances. 2014;4:123004(1-7). Epub Oct. 6, 2014.
Wen et al., Ultra-large-area self-assembled monolayers of nanoparticles. ACS Nano. Nov. 22, 2011;5(11):8868-76. doi: 10.1021/nn2037048. Epub Oct. 25, 2011.
Wu et al., Fabrication of wafer-size monolayer close-packed colloidal crystals via slope self-assembly and thermal treatment. Langmuir. Nov. 19, 2013;29(46):14017-23. doi: 10.1021/la402652t. Epub Oct. 22, 2013.
Wu et al., Layer thinning and etching of mechanically exfoliated MoS2 nanosheets by thermal annealing in air. Small. 2013;9(19):3314-3319.
Wu et al., Thermoporometry characterization of silica microparticles and nanowires. Langmuir. Mar. 4, 2014;30(8):2206-15. doi: 10.1021/la404419h. Epub Feb. 15, 2014.
Yamamoto et al., Anisotropic etching of atomically thin MoS2. J Phys Chem C. 2013;117:25643-9. Epub Nov. 12, 2013.
Yang et al., Basic principles for rational design of high-performance nanostructured silicon-based thermoelectric materials. Chemphyschem. Dec. 23, 2011;12(18):3614-8. doi: 10.1002/cphc.201100514. Epub Oct. 20, 2011.
Ye et al., Defects engineered monolayer mos2 for improved hydrogen evolution reaction. Nano Lett. Feb. 10, 2016;16(2):1097-103. doi: 10.1021/acs.nanolett.5b04331. Epub Jan. 13, 2016.
Yoon et al., Direct visualization of etching trajectories in metal-assisted chemical etching of Si by the chemical oxidation of porous sidewalls. Langmuir. Sep. 29, 2015;31(38):10549-54. doi:10.1021/acs.langmuir.5b02453. Epub Sep. 9, 2015.
Yu et al., Reversible storage of lithium in silver-coated three-dimensional macroporous silicon. Adv Mater. May 25, 2010;22(20):2247-50. doi: 10.1002/adma.200903755.

(56) References Cited

OTHER PUBLICATIONS

Yuan et al., Efficient black silicon solar cell with a density-graded nanoporous surface: Optical properties, performance limitations, and design rules. Appl Phys Lett. 2009;95(12):123501(1-3). Epub Sep. 22, 2009.

Zeng et al., Fabrication of graphene nanomesh by using an anodic aluminum oxide membrane as a template. Adv Mater. Aug. 8, 2012;24(30):4138-42. doi: 10.1002/adma.201104281. Epub Mar. 21, 2012.

Zhang et al., Double-layered $TiO_2$—$SiO_2$ nanostructured films with self-cleaning and antireflective properties. J Phys Chem B. Dec. 21, 2006;110(50):25142-8.

Zhang et al., Preparation of large-area uniform silicon nanowires arrays through metal-assisted chemical etching. J Phys Chem C. 2008;112(12):4444-50.

Zhou et al., Thickness-dependent patterning of MoS2 sheets with well-oriented triangular pits by heating in air. Nano Res. 2013;6(1):703-711.

Zhu et al., Formation of silicon nanoporous structures induced by colloidal gold nanoparticles in $HF/H_2O_2$ solutions. Chem Mater. Jul. 2009;21(13):2721-6. Epub May 22, 2009.

\* cited by examiner

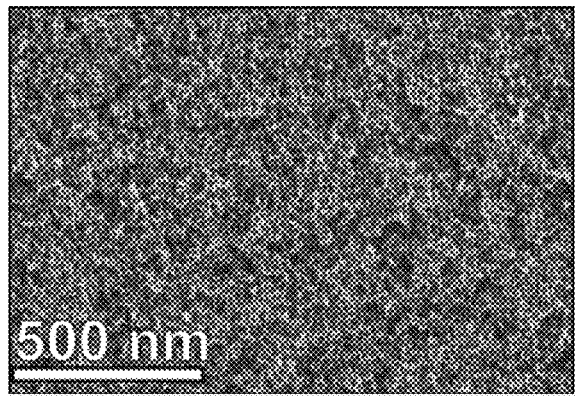
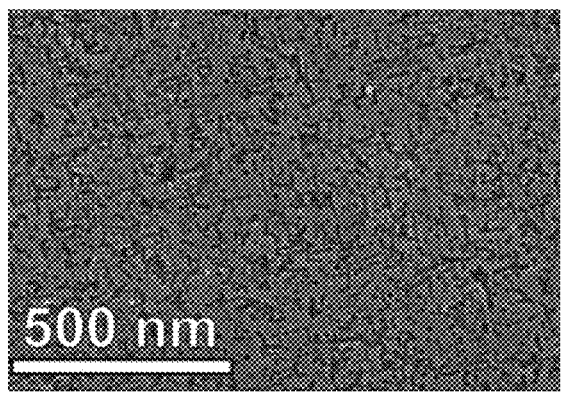
FIG. 11A                FIG. 11B
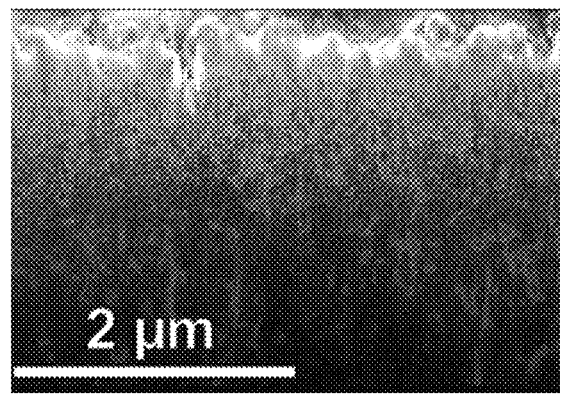
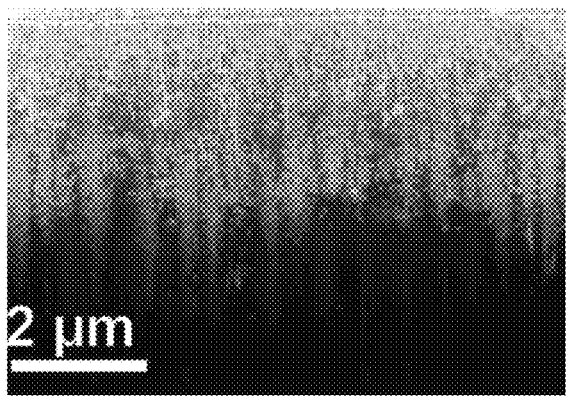
FIG. 11C                FIG. 11D

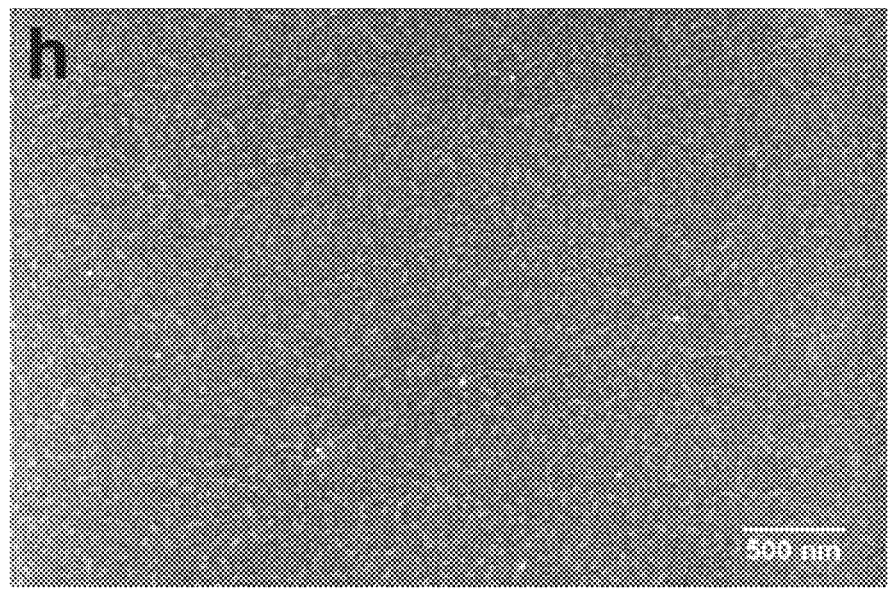
FIG. 17H
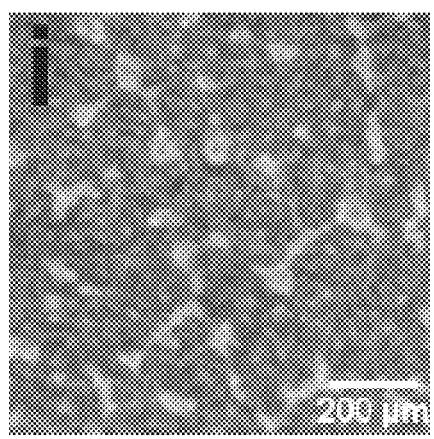 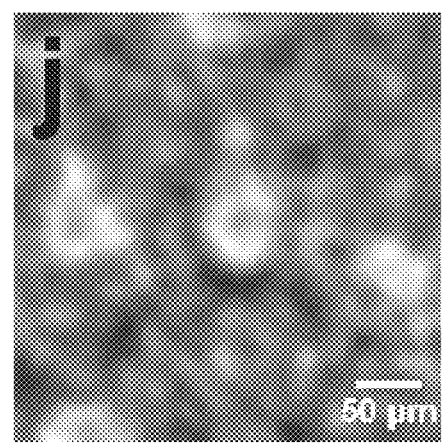
FIG. 17I  FIG. 17J

POROUS AND NANOPOROUS SEMICONDUCTOR MATERIALS AND MANUFACTURE THEREOF

CROSS-REFERENCE TO RELATED APPLICATIONS

This application claims the benefit under 35 U.S.C. § 119(e) of U.S. Provisional Application Ser. No. 62/653,266, filed on Apr. 5, 2018, the contents of which are incorporated herein by reference in their entirety.

This application also incorporates by reference, in its entirety, U.S. patent application Ser. No. 15/462,620, filed Mar. 17, 2017 and published as U.S. Patent Publication No. US 2017/0271459 on Sep. 21, 2017.

FIELD

Aspects described herein relate generally to porous and/or nanoporous semiconductor materials and related methods and applications.

BACKGROUND

The production of nanoporous semiconductor materials is important for many current and potential applications including nanofiltration, thermoelectrics, battery electrodes, photovoltaics, and catalysis. In each of these and other applications, nanoporous semiconductors having decreased pore sizes, decreased inter-pore spacing, and increased pore aspect ratios have been found to be advantageous. However, despite current advancements in nanofabrication technology, nanoporous semiconductor materials are nearing the limits of the accessible parameter space with respect to these design variables.

Accordingly improved methods are needed for producing nanoporous semiconductor materials.

SUMMARY

The current disclosure is related to the synthesis of nanoporous semiconductor materials. Certain embodiments are related to synthesis techniques utilizing metal-assisted chemical etching methods.

In one embodiment, a porous semiconductor material comprises a semiconductor material and a plurality of pores in the semiconductor material. The plurality of pores have an average pore diameter of less than 20 nm, and the plurality of pores define a total volumetric porosity, measured as the total pore volume divided by the total pore volume plus solid material volume, of at least 0.1%. At least 0.05% of the pores pass through the material from one surface to an opposite or different surface, and the material has a thickness which is the material's minimum cross-section and which thickness is at least 0.05 micron.

In another embodiment, a method for forming a nanoporous patterned material comprises covering a portion of a material with a nanoporous semiconductor membrane, and etching the portion of the material through the nanoporous semiconductor membrane. The nanoporous semiconductor membrane comprises pores having an average pore diameter less than 20 nm and an average aspect ratio of greater than 500:1.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIG. 11A is a reproduction of an SEM image of NPSi etched with sputtered Au island catalysts, according to one example;

FIG. 11B is a reproduction of an SEM image of NPSi etched with sputtered Ag island catalysts, according to one example;

FIG. 11C is a reproduction of an SEM cross-sectional image of NPSi etched with sputtered Au island catalysts, according to one example;

FIG. 11D is a reproduction of an SEM cross-sectional image of NPSi etched with sputtered Ag island catalysts, according to one example;

FIG. 17H is an SEM image of a nanoporous $WS_2$ domain following $O_2$ plasma etching using a NPSi mask, according to one example;

FIG. 17I is a magnified view of the sample shown in FIG. 17H;

FIG. 17J is another magnified view of the sample shown in FIG. 17H;

DETAILED DESCRIPTION

Figure 1A:
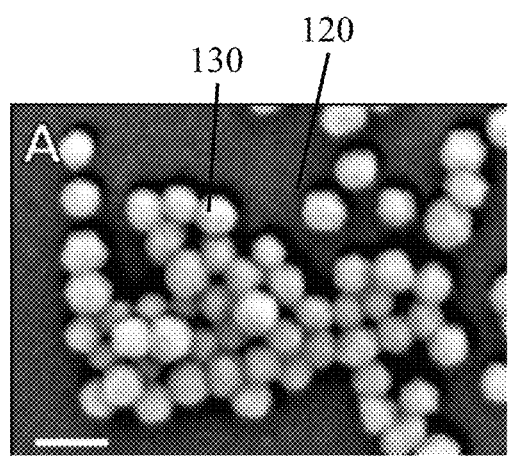
FIG. 1A is a reproduction of an SEM image of a crystalline Si substrate with drop-cast bare 50 nm gold nanoparticles before MACE.

The inventors have recognized and appreciated that current nanofabrication techniques are not always well suited for producing nanoporous semiconductor materials in a scalable manner while retaining the ability to finely control the morphology of the resulting nanoporous semiconductor material. For example, current state-of-the-art electron beam lithography coupled with deep reactive ion etching was recently demonstrated to be capable of fabricating nanobarrel structures with a wall thickness of 6.7 nm and aspect ratio of 50:1. While potentially viable for the fabrication of specific components in nanoelectronics, the extremely high costs and long processing times of electron beam lithography limits the technique to device sizes of square microns, and therefore it is not an appropriate technique for any of the above-mentioned applications which require larger device sizes. Block copolymer lithography has received significant attention as a more scalable alternative to electron beam lithography, and was recently utilized in conjunction with plasma etching to produce sub-10 nm features with aspect ratios of 17:1. However, both techniques still require bombardment of the substrate with ions in a vacuum, and consequently, they are intrinsically limited in their ability to be integrated into a high throughput manufacturing process such as that required for the previously mentioned applications.

Solution-based techniques have also been explored as alternatives to lithography-based techniques. For example, metal-assisted chemical etching (MACE) is an electrochemical technique that relies on noble metal-catalyzed anisotropic etching of nanopores in semiconductor materials via a simple, scalable, and low cost solution-based process. For example, the general reaction mechanism can be explained as follows for a gold catalyst deposited on the surface of a silicon (Si) substrate and placed in an aqueous solution of hydrofluoric acid (HF) and hydrogen peroxide ($H_2O_2$). $H_2O_2$ is first reduced at the nanoparticle surface in what constitutes the cathode reaction. Holes (h+) are generated in this reduction and diffuse from the particle to the Si substrate, which is subsequently oxidized and dissolved by the HF at the anode. The overall reaction also involves the reduction of protons (H+) into hydrogen, which is released as gas ($H_2$). As etching progresses, the gold nanoparticles maintain their proximity to the Si via van der Waals interactions, thus continuing to catalyze the reaction.

MACE has recently been the focus of a large body of work in which noble metal patterns are implemented in the etching of positive features such as nanowires, and negative features including nanopores. Common methods of forming negative nanopores via MACE include deposition of colloidal nanoparticle catalysts on a semiconductor surface, deposition and de-wetting of thin films, or growth from solution. Of these techniques, the deposition of pre-synthesized noble metal nanoparticles by drop-casting or similar methods affords the greatest degree of control over catalyst size, monodispersity, and position. While this process is intrinsically low cost and very scalable, the etching mobility of nanoparticles along crystallographic orientations is far more difficult to control than interconnected lithographically defined, sputtered, or grown patterns with interfaces planar to the substrates. This has been found to result in wandering of the particles laterally and partial loss of anisotropy, leading to significant variation in the pore depth and direction. Causes of this phenomenon may include the non-spherical nature of the particles, dislodging of the particles by the produced hydrogen gas, and non-homogenous injection of holes from the particles into the surrounding semiconductor material. This challenge is compounded for very small nanoparticles, as their shapes become dominated by faceting and no longer resemble spheres.

In view of the above, the inventors have recognized and appreciated numerous benefits associated with methods for producing nanoporous semiconductor materials that overcome the above-noted drawbacks associated with conventional lithographic and MACE techniques. For example, methods described herein may allow for the production of nanoporous semiconductor materials with smaller pore sizes, smaller inter-pore spacing, and larger pore aspect ratios compared to existing methods while also being scalable to larger areas and device sizes.

In addition to the above, the inventors have appreciated that the nanoporous semiconductor materials described herein may be utilized in connection with numerous applications, including, but not limited to, masking and patterning, membrane filtration applications, and sensing, catalysis, and in electronic devices. In particular, the inventors have appreciated that in many of these applications, precise control over porosity, pore size, and/or pore location may be important to obtain desired mechanical, thermal, electrical, and/or transport properties. As discussed further below, the methods and materials described herein may allow for such control over the pore characteristics of nanoporous semiconductor materials such that they may be used in the above-noted applications.

According to some embodiments, a method for producing a nanoporous semiconductor material includes positioning a plurality of nanoparticles onto the surface of a semiconductor substrate (e.g., by drop casting from a solution of nanoparticles) and allowing the nanoparticles to self-assemble into a close-packed monolayer array via solvent evaporation. Each of the nanoparticles includes a sacrificial spacer layer surrounding a smaller noble metal nanoparticle core. For example, in certain embodiments the noble metal nanoparticle core may include gold, silver, platinum, and/or palladium, and the sacrificial spacer layer may be an oxide such as silica ($SiO_2$). After the semiconductor material coated with a layer of nanoparticles, it is immersed in an etching solution (e.g., a MACE solution containing an acid such as hydrofluoric acid and an oxidizer such as hydrogen peroxide), and the sacrificial spacer layer is partially or fully removed, leaving behind a well-spaced array of noble metal nanoparticles (containing some residual, or no, sacrificial material) on the surface of the semiconductor. Accordingly, the sacrificial spacer layers maintain a minimum separation between the noble metal nanoparticles during deposition and self-assembly. The inventors have found that these spaced-apart noble metal nanoparticles may subsequently catalyze etching into the semiconductor surface to form nanopores with smaller diameters, smaller inter-pore spacing, and large pore aspect rations compared to those achievable with conventional solution-based etching techniques. Without wishing to be bound by any particular theory, the size of the etched pores and the inter-pore spacing may be controlled by the controlling the size of the catalytic noble metal nanoparticle, and thickness of the sacrificial spacer layer, respectively.

In certain embodiments, a method of forming a nanoporous semiconductor material includes positioning a plurality of noble-metal-containing nanoparticles are positioned proximate a semiconductor substrate. As used herein, the nanoparticles being positioned proximate the semiconductor substrate generally refers to the nanoparticles being positioned adjacent the surface of the semiconductor substrate, which may include a least a portion of the nanoparticles being in direct contact with the substrate. It should be understood that the plurality of noble-metal-containing nanoparticles may be positioned on the surface using any suitable method such as drop-casting, spin coating, self-assembled monolayer formation techniques such as a Langmuir-Blodgett trough, and so on.

As noted above, in some instances, a noble-metal-containing nanoparticle includes a noble metal core that is at least partially surrounded by a sacrificial material (e.g., a sacrificial spacer layer). As used herein, a sacrificial material generally refers to a material that is intended to be at least partially removed before a semiconductor substrate is processed to form pores therein, and the sacrificial material may be removed by exposing the sacrificial material to an environment (e.g., a solvent) that dissolves the sacrificial material. For example, as noted above, in one embodiment a sacrificial material may include $SiO_2$, which can be rapidly dissolved via exposure to HF in a MACE solution. However, it should be understood that other sacrificial materials and/or solvents also may be suitable, as the current disclosure is not limited in this regard.

Depending on the particular embodiment, the noble-metal-containing nanoparticles may be nanostructures having any suitable shape, including, but not limited to, spheres, rods, wires, cubes, pyramids, prismatic shapes, and irregular shapes. Further, the noble metal core of a noble-metal-containing nanoparticle may have a shape that is generally the same as the overall shape of the nanoparticle, or the core may have a different shape than the nanoparticle. Accordingly, it should be understood that the current disclosure is not limited to any particular shape and/or configuration for a noble metal core and/or a noble-metal-containing nanoparticle.

In some embodiments, a plurality of noble-metal-containing nanoparticles may assemble into an array such as a close-packed array of nanoparticles. As used herein, an array generally refers to at least a partially ordered pattern, such as a two-dimensional pattern, in which at least a portion of the plurality of nanoparticles have a similar spacing relative to one-another. A close-packed array refers to an array in which at least a portion of the nanoparticles are in direct contact with two or more of their nearest-neighbor nanoparticles. For example, in a hexagonal close-packed array, each nanoparticle may be in direct contact with six nearest-neighbor nanoparticles. In some embodiments, the plurality of noble-metal-containing nanoparticles may be arranged in a close-packed array with the sacrificial material of adjacent nanoparticles in direct contact. After removal of the sacrificial material, the noble metal cores may be left in an array that is not close-packed (i.e., a spaced array). As noted above, the plurality of nanoparticles may self-assemble to form an array; i.e., the nanoparticles may naturally arrange themselves into an ordered pattern after being positioned proximate a semiconductor substrate. In some instances, the self-assembly may be driven by evaporation of a solvent, such as an aqueous solution in which the nanoparticles were dispersed.

According to another embodiment, a method for producing a nanoporous semiconductor material includes forming a plurality of noble metal islands on the surface of a semiconductor substrate. In some instances, forming the noble metal islands may include depositing a noble metal onto the semiconductor substrate via a suitable deposition process and allowing the islands to self-assemble as a result of the interfacial energy of the noble metal and the semiconductor substrate. In some instances, the self-assembly of the noble metal islands may result in homogenously sized and spaced islands. After formation of the noble metal islands, a plurality of pores is formed in the semiconductor substrate by etching (e.g., by immersing the semiconductor in a MACE solution). Similar to the embodiments discussed above, the inventors have recognized that the noble metal islands may catalyze the etching of the semiconductor surface to form nanopores with smaller diameters, smaller inter-pore spacing, and large pore aspect rations compared to those achievable with conventional solution-based etching techniques.

It should be understood that noble metal islands may form as a result of any suitable deposition process. For example, in some embodiments, a thin noble metal layer may be deposited by a physical vapor deposition process, such as a sputtering process (e.g., magnetron sputtering), electron beam assisted evaporation, or thermal evaporation. As noted above, the noble metal islands may form naturally as a result of the interfacial energy of the noble metal-semiconductor interface. Without wishing to be bound by any particular theory, in some embodiments, the size and spacing of the noble metal islands may be controlled by suitably controlling the surface energy of the semiconductor surface and/or one or more aspects of the deposition process, such as the amount of material deposited. Moreover, in some instances, a particular deposition process may result in a planar interface between the noble metal island catalysts and the semiconductor substrate surface, which may allow for highly anisotropic etching behavior, which may lead to higher aspect ratio pores.

As used herein, etching generally refers to chemically removing a portion of a (e.g., a semiconductor substrate) via exposure to an etching solution. In some embodiments, such as embodiments utilizing a MACE process, an etching process may be affected by the presence of a catalyst on the surface a substrate (e.g., a semiconductor substrate). Accordingly, methods in accordance with some embodiments may include etching the surface of a substrate in a pattern affected by an array of catalyst particles, such as an array of noble metal nanoparticles or noble metal islands formed after a deposition process (e.g., a sputtering process). In particular, the pattern of the features that are etched into the substrate may be determined, at least in part, by the positions of the catalyst particles in the array. Additionally, it should be understood that the current disclosure is not limited to any particular catalyst particle. For example, noble metal catalyst particles (e.g., nanoparticles and/or islands) are described above, and may include a noble metal such as gold, silver, platinum, palladium, etc. Moreover, in some embodiments, catalyst particles made from other metals such as copper also may be suitable.

In some embodiments, the methods described herein may be used to form nanoporous semiconductor materials having pore sizes and/or an inter-pore spacing of less than 15 nm, less than 10 nm, or less than 6 nm, and the aspect ratio of the pores may be greater than 50:1, greater than 75:1, greater than 100:1, greater than 200:1, greater than 300:1, or greater than 375:1, greater than 400:1, greater than 500:1, greater than 750:1, greater than 1000:1, greater than 2,500:1, greater than 5,000:1, greater than 10,000:1, or higher. In certain embodiments, the porosity of a nanoporous semiconductor material may be greater than 0.5%, greater than 1%, greater than 5%, greater than 10%, or greater than 15%. For example, in one embodiment, the porosity may be about 18%. In some embodiments, the porosity may refer to the fraction of the total surface area of the semiconductor material that is covered with pores (i.e., the total area of the pores defined by the pores divided by the total surface area of the semiconductor substrate). Suitable semiconductor materials include, but are not limited to, silicon, gallium arsenide, indium phosphide, germanium, and silicon-germanium alloy; depending on the particular embodiment, a semiconductor material may be crystalline (i.e., single crystalline or polycrystalline).

Moreover, it should be understood that the current disclosure is not limited to any particular etching solutions. In some embodiments, MACE solutions containing a mixture of an acid (e.g., hydrofluoric acid, and an oxidizer may be suitable, and the particular acid and oxidizer may be selected based on the particular semiconductor material being etched. For instance, a mixture of hydrofluoric acid and hydrogen peroxide may be suitable for etching silicon, and a mixture of sulfuric acid and potassium permanganate may be suitable for etching gallium arsenide and indium phosphide.

In certain embodiments, the methods described herein may further comprise depositing a functional layer onto the surface of the pores of a nanoporous semiconductor material. For instance, the pore surfaces may be functionalized with an oxide material such as an aluminum oxide (e.g., $Al_2O_3$) or a titanium oxide (e.g., $TiO_2$), or other materials such as nitrides. It should be understood that the functional layer may be deposited using any suitable deposition technique, including, but not limited to atomic layer deposition (ALD) and chemical vapor deposition (CVD).

In some embodiments, a plurality of pores in a nanoporous semiconductor material may have an average pore diameter of less than about 10 nm, and the plurality of pore may define a total volumetric porosity of at least 0.5%. For example, the total volumetric porosity may be measured as the total pore volume in the nanoporous semiconductor material divided by the total pore volume plus solid material volume of the nanoporous semiconductor material. In some embodiments, the total volumetric porosity may be greater than about 0.5%, greater than about 0.75%, greater than about 1%, greater than about 2%, greater than about 5%, greater than about 7%, greater than about 10%, greater than about 20%, greater than about 30%, or more. In some instances, the total volumetric porosity may be less than about 50%, less than about 40%, less than about 30%, less than about 20%, less than about 10%, and/or less than about 5%.

In some embodiments, a portion of the pores formed in a nanoporous semiconductor material may pass through the material from a first surface to an opposite or different surface of the material. For example, in some instances, a percentage of pores passing through the material may be at least about 0.05%, at least about 0.075%, at least about 0.1%, at least about 0.25%, at least about 0.5%, at least about 0.75%, at least about 1%, at least about 2.5% at least about 5%, at least about 7.5%, at least about 10%, and/or at least about 20%. In other instances, the percentage of pores passing through the material may be less than about 30%, less than about 20%, less than about 10%, less than about 5%, less than about 1%, and/or less than about 0.5%.

Depending on the particular application, a thickness a nanoporous material, which may be measured as the materials' minimum cross-sectional thickness, may be between about 0.05 microns and about 400 microns. For example, the thickness may be greater than about 0.05 microns, greater than about 0.075 microns, greater than about 0.1 microns, greater than about 0.2 microns, greater than about 0.5 microns, greater than about 0.5 microns, greater than about 1 micron, greater than about 2.5 microns, greater than about 5 microns, greater than about 10 microns, greater than about 25 microns, greater than about 40 microns, greater than about 60 microns, greater than about 75 microns, greater than about 85 microns, greater than about 100 microns, greater than about 150 microns, greater than about 200 microns, greater than about 250 microns, or more. In some instances, the thickness may be less than about 400 microns, less than about 300 microns, less than about 200 microns, less than about 100 microns, less than about 50 microns, less than about 10 microns, less than about 1 micron, less than about 0.5 microns, and/or less than about 0.1 microns.

As noted above, in some applications, the nanoporous semiconductor materials described herein may be used in connection with masking and/or patterning applications. For example, the nanoporous semiconductor materials may be use as a mask to form a desired pattern (such as a pore pattern) on another material. In some embodiments, such masks may be used as etch masks to form nanoporous structures in two-dimensional materials, such as molybdenum disulfide ($MoS_2$) and/or tungsten disulfide ($WS_2$). For example, in one exemplary embodiment, a nanoporous silicon membrane material having an average pore aspect ratio of greater than 1000:1 and pore diameters of less than 20 nm may be used as an etch mask for nanopatterning of two-dimensional $MoS_2$ and/or $WS_2$ materials (or other suitable two-dimensional materials). The masks may have lateral dimensions ranging from 100 μm by 100 μm to 1 cm by 1 cm, and thicknesses ranging from 50 nm to 15 microns. Applying these masks to the two-dimensional materials and subsequently performing an etching process may generate nanopores within the two-dimensional materials having diameters of about 70 nm, and if desired, the pores may be enlarged via thermal annealing in air. The inventors have appreciated that this nanopatterning process may allow for control of the edge-to-area ratio of the two-dimensional material, which may allow for tuning of the properties of the two-dimensional material for various applications, such as filtration, sensing, and/or electrocatalysis. For example, in catalysis applications, a greatly increased edge density enabled by the methods and materials described herein may provide improved catalytic performance, such as in hydrogen evolution reactions.

While a particular patterning application is described above in connection with two-dimensional materials such as $MoS_2$ and $WS_2$, it should be understood that the current disclosure is not limited to any particular type of patterning applications, and that the methods and materials described herein may be applicable to a wide range of patterning applications. Moreover, while particular dimensions and pore characteristics for a nanoporous semiconductor material are described in connection with the above embodiment, it should be understood that various patterning applications may utilize nanoporous semiconductor materials having any suitable combinations of dimensions and pore characteristics, as the current disclosure is not limited in this regard.

Moreover, as noted above, the nanoporous semiconductor materials described herein may be utilized in connection with various filtration membranes. The inventors have appreciated that the presently disclosed materials may provide numerous benefits relative to existing filtration membranes, such as polymer and/or ceramic membranes. For example, the majority of polymer membrane technologies remain stable only at temperatures below 50° C. in aqueous environments and within a pH range of 4-10, and ceramic materials present numerous challenges to achieving the costs and scalability needed for commercialization, especially at very small filtration scales, such as below 1 nm. In contrast, the nanoporous materials described herein may be capable of performing separations on the sub-1 nm molecular scale while also being suitable for use in a variety of chemically and thermally harsh environments. Moreover, the nanoporous materials may be made using the methods described herein, which may facilitate economically feasible manufacturing at large scales.

For example, in some embodiments, nanoporous semiconductor membranes may be produced by first thinning a portion of a semiconductor material to achieve a desired thickness, depositing a metal catalyst onto the thinned portion, and subsequently etching nanopores through the thinned portion, e.g., using the etching methods described herein. In other embodiments, thicker membrane materials may be formed by directly etching semiconductor material without thinning. For example, nanopores may be etched through a semiconductor material having a thickness of between about 200 microns and bout 400 microns. In some instances, the etching may be performed from each of two sides of the material (e.g., opposing sides) by depositing an etch catalyst on each of the two sides. Given the larger thickness of the semiconductor material, the nanopores formed in such materials may have very large aspect ratios, such as greater than 20,000:1, greater than 40,000:1, greater than 60,000:1, greater than 70,000:1 or higher.

EXAMPLES

The following examples are intended to illustrate certain embodiments of the present invention, but do not exemplify the full scope of the invention.

Example 1—Coated Nanoparticle Catalysts

In one set of illustrative examples, an entirely solution-based, modified MACE process is used to synthesize nanoporous silicon (NPSi) with sub-10 nm pore diameters, sub-10 nm inter-pore spacing, and pore aspect ratio of over 100:1. The method simultaneously allows for the fabrication of ordered nanopore arrays in a novel size regime, increases the etching homogeneity and anisotropy of nanoparticle catalyzed MACE, and drastically improves the scalability and high throughput nature of the process relative to conventional lithographic MACE approaches. As discussed in more detail below, the simple two-step process is carried out by first drop-casting silica-shell gold nanoparticles ($SiO_2$-AuNPs) onto a crystalline Si substrate. Solvent evaporation then facilitates $SiO_2$—AuNP self-assembly into close-packed monolayer arrays. Second, immersion of the $SiO_2$—AuNP monolayer coated Si into the MACE solution results in the rapid consumption of the silica shells by HF, leaving behind a well-spaced array of bare AuNPs on the surface. These AuNPs then seamlessly catalyze nanopore formation with an etching fidelity and consistency previously unobserved in the sub-10 nm regime. Through high resolution transmission electron microscopy (TEM) and scanning electron microscopy (SEM), the deposited $SiO_2$—AuNP monolayers and arrays of nanopores are characterized pre- and post-MACE respectively, allowing for the detailed monitoring of pore size, inter-pore spacing, and pore aspect ratio of the resulting NPSi.

$SiO_2$-AuNPs (5 nm and 10 nm gold cores) were purchased from Sigma-Aldrich USA. The 5 nm gold core particles are diluted twice with $H_2O$, followed by five times with acetone. The 10 nm gold core particles are diluted twice with acetone. Silicon wafers (Virginia Semiconductor Inc.) are boron-doped with resistivity 0.001-0.01 Ω·cm and thickness of 275 μm+/−25 μm. The prepared solutions are drop-cast onto a silicon wafer and allowed to dry in air. The coated substrate is then added to the MACE solution (5.65M HF, 0.12M $H_2O_2$) for varying times, as described in more detail below. The sample is removed and rinsed with DI water to stop the reaction. For imaging pore cross-sections, pores are filled with $Al_2O_3$ using atomic layer deposition (ALD, Cambridge NanoTech Savannah) for image contrast and conservation of the porous structure. Particle and pore sizes from SEM and TEM images are analyzed using ImageJ and MATLAB. Samples are imaged using a Zeiss Ultra Plus Field Emission SEM, FEI Helios 660 Focused Ion Beam (for cross-sectional milling) with SEM (with attached EDAX Energy Dispersive X-Ray Spectroscopy [EDS] Detector), and a JEOL 2100 Transmission Electron Microscope.

Figure 1B:
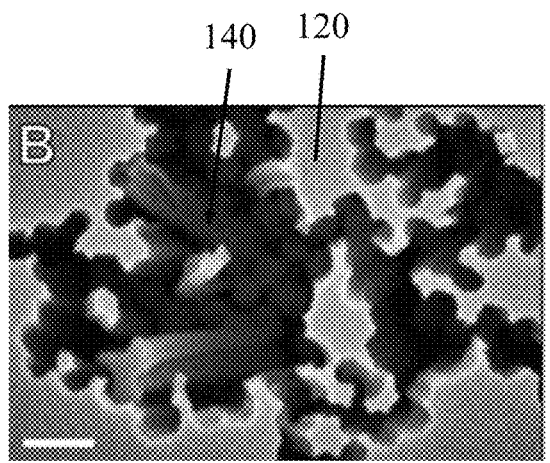
FIG. 1B is a reproduction of an SEM image of a Si substrate, similar to that shown in FIG. 1A, after MACE.
Figure 1C:
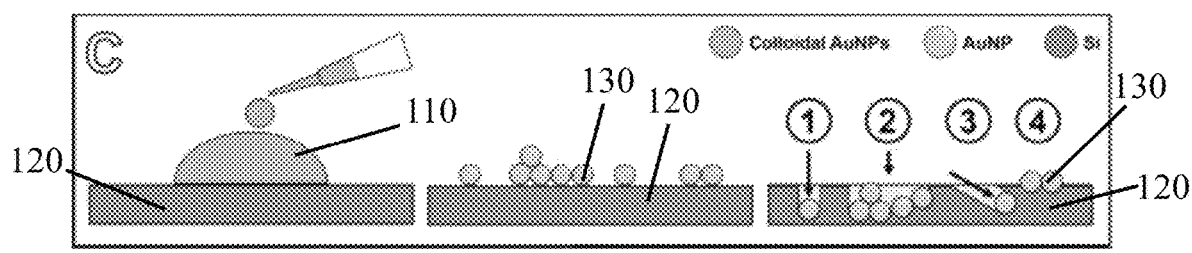
FIG. 1C is a schematic representation of a conventional MACE process.

As noted above, the use of noble metal nanoparticles deposited from solution to catalyze the etching of nanopores via a conventional MACE process in Si offers the benefit of being a scalable route of manufacturing NPSi. FIG. 1C schematically illustrates the conventional MACE process, in which a solution 110 containing colloidal nanoparticles dispersed in a solvent is first deposited onto a silicon substrate 120. The solvent is allowed to evaporate leaving AuNPs 130 on the silicon substrate 120, and subsequently, the AuNPs catalyze etching. However, as illustrated in FIGS. 1A-1C, this method comes with its own set of challenges, primarily the control of the nanoparticle positioning on the surface, and subsequently ensuring that the particle etches in a direction normal to the substrate surface during the process. The former is made difficult by the numerous complex forces which govern the behavior of the nanoparticles both in solution and in the self-assembly process during solvent evaporation. These include van der Waals, electrostatic, steric, solvation, depletion, capillary, convective, and friction forces. The result of these interactions is that nanoparticles will often tend not to form monolayers of periodic spacing, but instead exhibit a clustering behavior. Such a phenomenon is demonstrated in FIGS. 1A-1B (scale bars are 100 nm). FIG. 1A shows the aggregation of bare 50 nm AuNPs 130 deposited via drop casting from solution onto a crystalline Si wafer 120. This behavior is particularly detrimental to the etching of nanopores via the MACE process. FIG. 1B shows an attempt at the etching of nanopores using a similarly aggregated group of bare 50 nm AuNPs; the aggregated groups of nanoparticles result in etching of relatively large, inhomogeneous pits 140. The result of this attempt is the etching of relatively large, inhomogeneous pits 130 in the Si (FIG. 1C-2), a morphology which is of little use to most relevant applications that require size-controlled individual pores. Other potentially undesirable results in conventional MACE process include the lateral etching of the nanocatalyst (FIG. 1C-3), or lack of etching altogether (FIG. 1C-4). AuNPs are understood to catalyze etching preferentially in the <100> direction, but can also deviate from this path due to the non-homogenous injection of holes from other surrounding catalysts and their own facets, or to dislodgement by the hydrogen gas produced during etching.

Figure 1D:
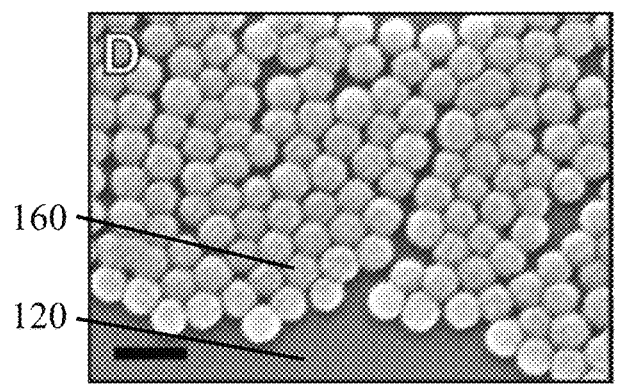
FIG. 1D is a reproduction of an SEM image of a crystalline Si substrate with drop-cast 10 nm core $SiO_2$-AuNPs before MACE, according to one example.
Figure 1E:
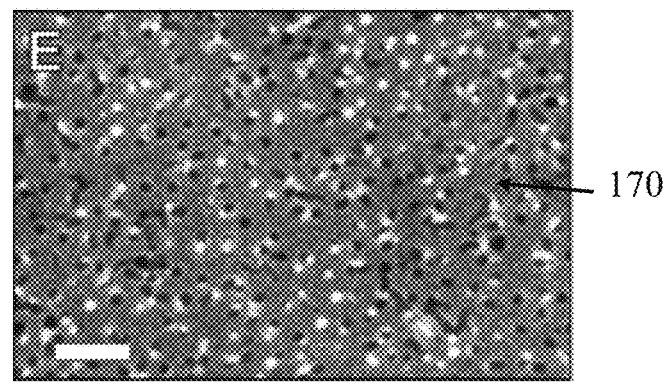
FIG. 1E is a reproduction of an SEM image of a crystalline Si substrate, similar to that of FIG. 1D, after MACE, showing a nanoporous Si material according to one example.
Figure 1F:
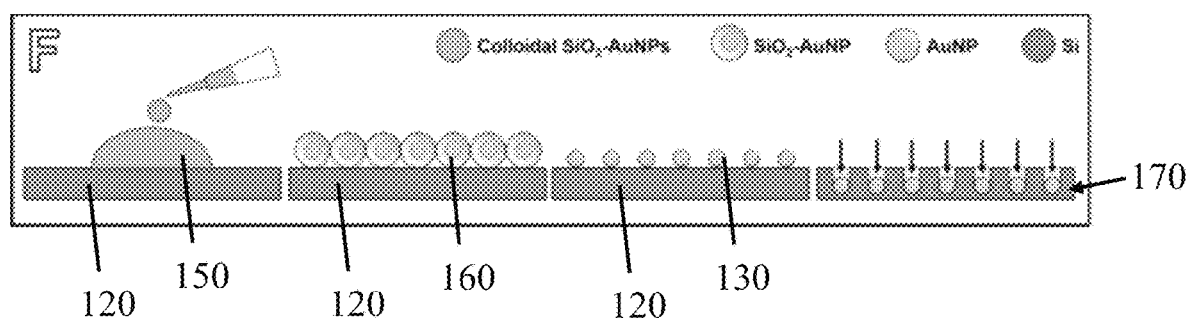
FIG. 1F is a schematic representation of a modified MACE process according to some embodiments.

In contrast, a modified MACE process in accordance with the current disclosure, which involves the self-assembly of $SiO_2$-AuNPs monolayer arrays from solution on a crystalline Si substrate, is illustrated in FIGS. 1D-1F. The overall process is shown schematically, in FIG. 1F. A solution 150 containing colloidal $SiO_2$-AuNPs 160 is drop cast onto a silicon substrate 120. The $SiO_2$ serves as a sacrificial spacer layer, which acts to maintain separation between the AuNP cores during deposition and self-assembly, and as shown in FIGS. 1D and 1F, the $SiO_2$-AuNPs 160 assemble into a well-spaced array after solvent evaporation. Upon immersion into the MACE etchant, the $SiO_2$ shell is rapidly consumed, leaving behind periodically spaced AuNPs 130 which begin the etching process to form the NPSi material 170. FIG. 1D depicts a monolayer of $SiO_2$-AuNPs with 10 nm gold cores and $SiO_2$ shells of 15-20 nm thickness, while FIG. 1E displays an etched Si substrate, i.e., a NPSi material 170, which was initially coated in a similar monolayer, following one hour of exposure to the MACE solution. The scale bars in FIGS. 1D-1E are 100 nm.

Figure 2A:
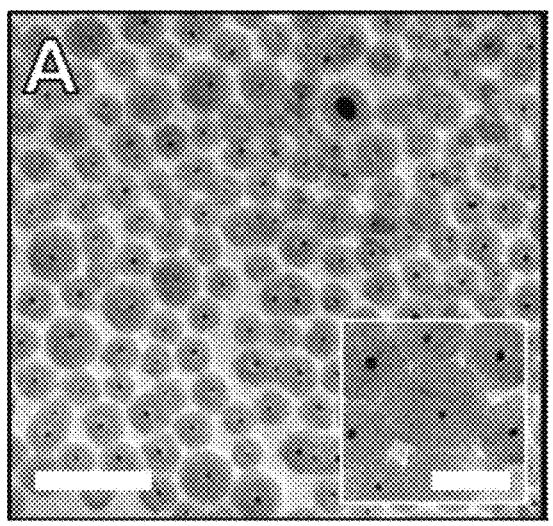
FIG. 2A is a reproduction of a TEM image of 5 nm $SiO_2$-AuNPs drop cast on a Si substrate according to one example.
Figure 2B:
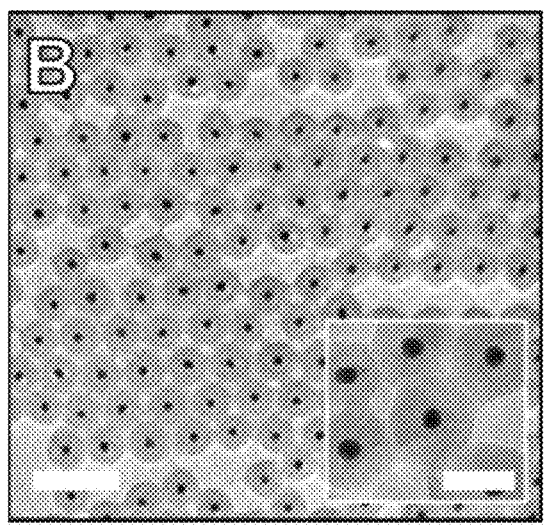
FIG. 2B is a reproduction of a TEM image of 10 nm $SiO_2$-AuNPs drop cast on a Si substrate according to one example.
Figure 2C:
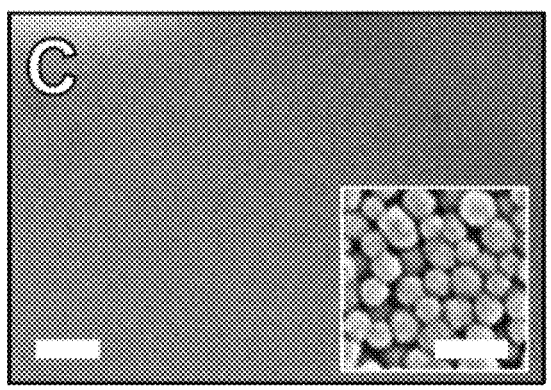
FIG. 2C is a reproduction of an SEM image of 5 nm $SiO_2$-AuNPs drop cast on a Si substrate according to one example.
Figure 2D:
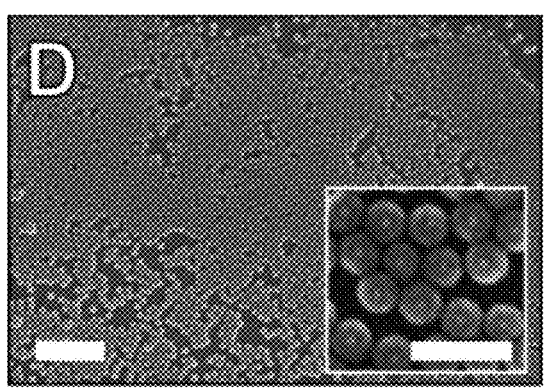
FIG. 2D is a reproduction of an SEM image of 10 nm $SiO_2$-AuNPs drop cast on a Si substrate according to one example.

$SiO_2$-AuNPs can be synthesized in a simple solution chemistry process using tetraethylorthosilicate (TEOS) as a precursor with the ability to precisely control shell thickness ranging from 2-90 nm. In this example, 5 nm and 10 nm diameter gold core $SiO_2$-AuNPs ($SiO_2$ shells thicknesses of 15-20 nm) are used in order to explore a new pore size regime in NPSi as well as to achieve a fine degree of pore size and inter-pore spacing control. FIGS. 2A and 2B display TEM images of 5 nm and 10 nm $SiO_2$-AuNPs, respectively, drop-cast from aqueous solutions of acetone and ultrapure water onto (100) Si wafers; the scale bars are 100 nm, and the inset scale bars are 40 nm for each of FIGS. 2A and 2B. Analysis by TEM (FIGS. 2A, 2B) shows both the outer $SiO_2$ shells and the well-spaced inner gold cores. Some regions of monolayer exhibit a well-ordered hexagonal close packed pattern, while others are slightly more spaced. Also observable are areas of sparse bilayer formation above the more closely packed monolayers (FIG. 2A). The behavior of these partial bilayers during MACE is discussed in more detail below in the context of porosity, inter-pore spacing, and process control. FIGS. 2C and 2D show lower magnification SEM images of similar 5 nm and 10 nm $SiO_2$—AuNP arrays over multiple microns, elucidating the facile scalability of catalyst deposition. The scale bars are 1 μm in FIG. 2C and 500 nm in FIG. 2D, and the inset scale bars the inset scale bars are 100 nm. Though further exploration and optimization of different deposition techniques such as slope assembly need to be carried out in order to achieve centimeter scale arrays of $SiO_2$—AuNP catalysts, there is no fundamental barrier to their realization.

Figure 3A:
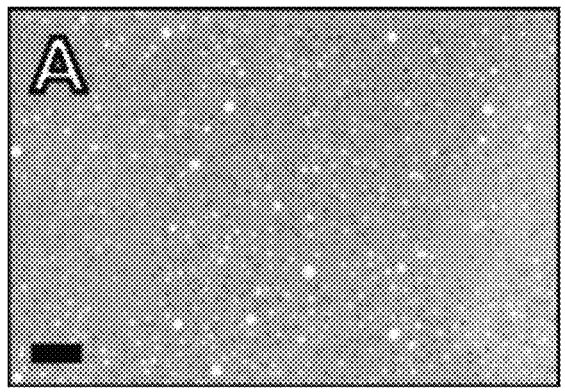
FIG. 3A is a reproduction of an SEM image of drop-cast 5 nm $SiO_2$-AuNPs catalyzing MACE for 15 minutes according to one example.
Figure 3B:
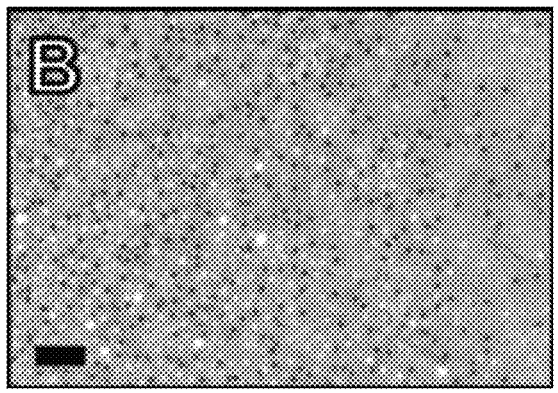
FIG. 3B is a reproduction of an SEM image of drop-cast 5 nm $SiO_2$-AuNPs catalyzing MACE for 30 minutes according to one example.
Figure 3C:
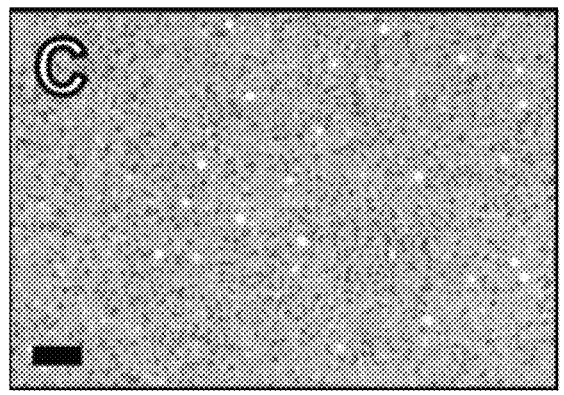
FIG. 3C is a reproduction of an SEM image of drop-cast 5 nm $SiO_2$-AuNPs catalyzing MACE for 60 minutes according to one example.
Figure 3D:
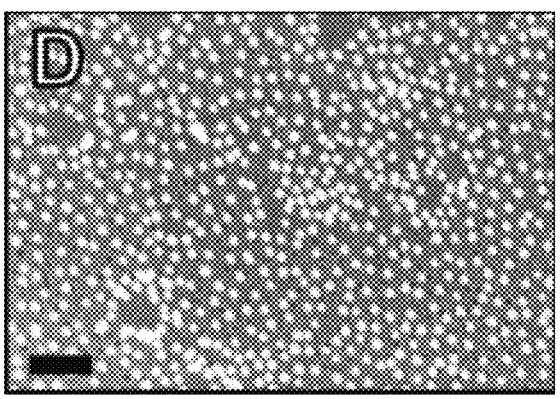
FIG. 3D is a reproduction of an SEM image of drop-cast 10 nm $SiO_2$-AuNPs catalyzing MACE for 15 minutes according to one example.
Figure 3E:
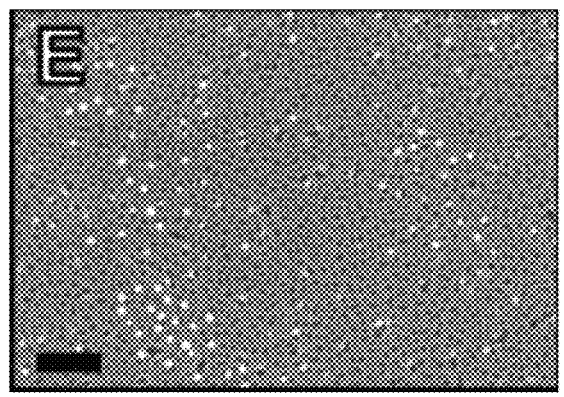
FIG. 3E is a reproduction of an SEM image of drop-cast 10 nm $SiO_2$-AuNPs catalyzing MACE for 30 minutes according to one example.
Figure 3F:
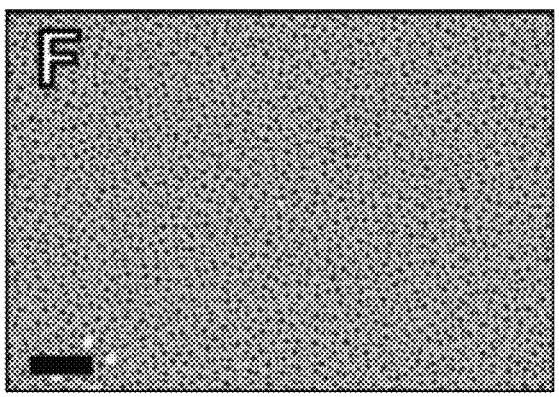
FIG. 3F is a reproduction of an SEM image of drop-cast 10 nm $SiO_2$-AuNPs catalyzing MACE for 60 minutes according to one example.

To demonstrate the time-based progression of the modified MACE process, drop-cast samples were exposed to the etchant solution for 15, 30, and 60 minutes. In particular, FIGS. 3A-3C show SEM for 5 nm gold core particles after 15, 30, and 60 minutes, respectively. Similarly, FIGS. 3D-3F show SEM images for the 10 nm gold core particles after 15, 30, and 60 minutes, respectively. The scale bars in each of the FIGS. 3A-3F are 100 nm. The images in FIG. 3 show progression of the MACE process after dissolution of $SiO_2$ shells. For both particle sizes (5 nm gold core and 10 nm gold core), the $SiO_2$ shells should dissolve almost immediately after introduction to the MACE solution, leaving homogenously spaced arrays of bare AuNPs. Many 5 nm core-particles are observed to begin etching into the Si within 15 minutes (FIG. 3A), while few 10 nm core-particles demonstrate etching within the same time interval (FIG. 3D). After 60 minutes, most of the particles have etched into the Si and are no longer visible on the surface for both 5 nm and 10 nm samples. Even though ideally, all particles should etch into Si once their $SiO_2$ shells are dissolved, there are two possible reasons as to why this may not occur: (1) Once a particles' shell has etched, it may make contact with the Si surface either on a facet vertex or an edge of one of its crystal grains. Since hole injection rate from a single particle is directly proportional to its contact surface area with the Si, its etching rate would be drastically lower than a particle with a planar interface between its facet and the Si surface. (2) Depending on the distribution of $SiO_2$ shell thicknesses of particles, some particles may start etching before their neighbors in close proximity, which may cause a small number of particles to stay on the surface due to the lack of hole injection in the near vicinity from surrounding particles which have already penetrated the substrate.

Since directional etching is promoted by uniform hole injection into the Si, particles lacking adjacent neighboring particles are less likely to etch downwards, or at all. A promising observation is that little to no lateral or cluster etching has taken place after 60 minutes, possibly explained by the high degree of uniformity in hole injection from the closely spaced AuNPs which seems to promote anisotropic etching in the <100> direction. As a result, the inventors concluded that the quality of NPSi depends primarily on the quality and monodispersity of the $SiO_2$-AuNPs being MACE processed, as well as the quality of the self-assembled monolayer (SAM) produced.

Figure 4A:
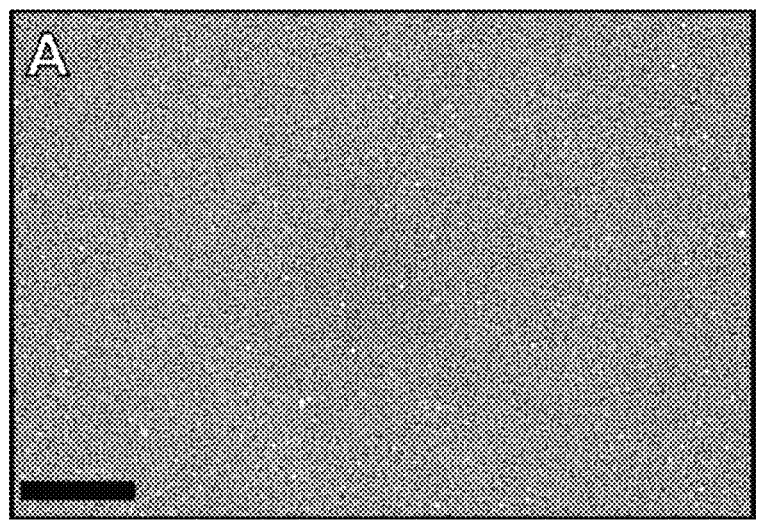
FIG. 4A is a reproduction of an SEM image of NPSi produced via 60 minutes of modified mace using drop-cast 5 nm $SiO_2$-AuNPs according to one example.
Figure 4B:
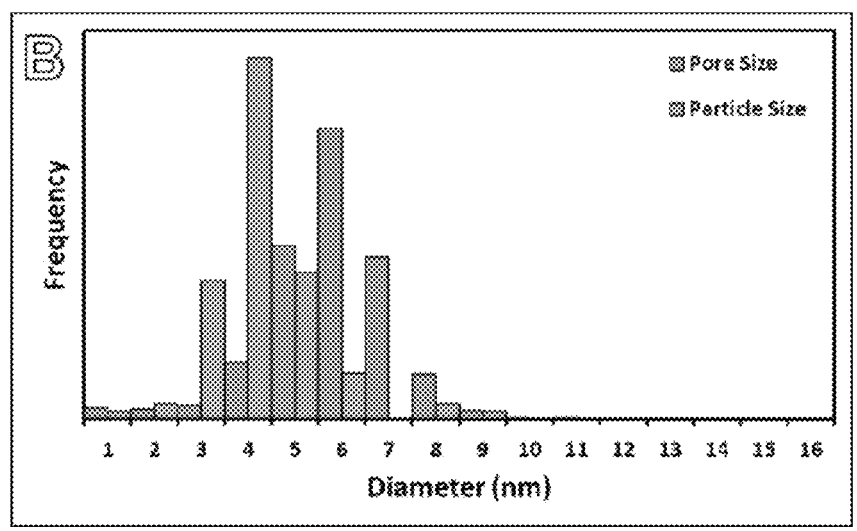
FIG. 4B is a histogram of Au core and pore size distributions for the NPSi material show in in FIG. 4A.
Figure 4C:
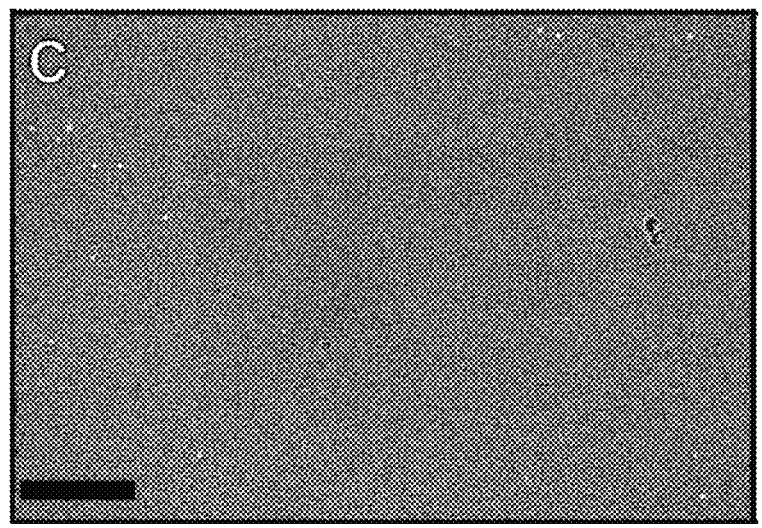
FIG. 4C is a reproduction of an SEM image of NPSi produced via 60 minutes of modified mace using drop-cast 10 nm $SiO_2$-AuNPs according to one example.
Figure 4D:
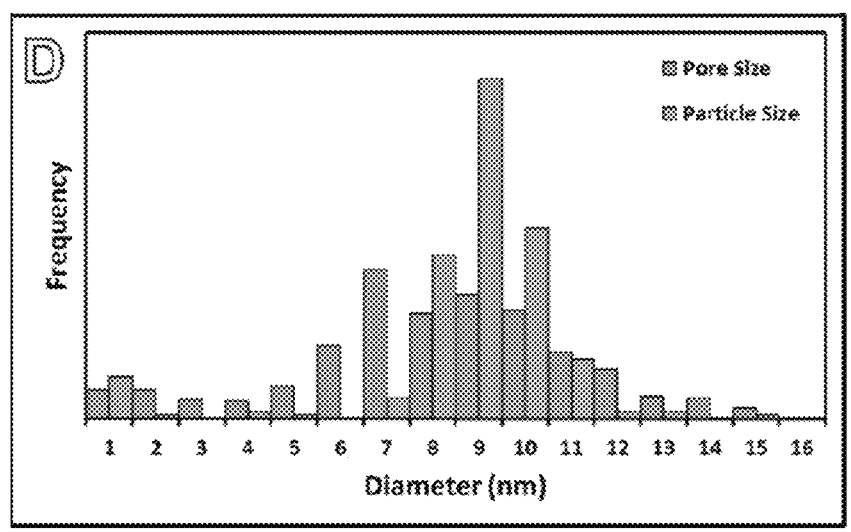
FIG. 4D is a histogram of Au core and pore size distributions for the NPSi material shown in FIG. 4C.

To quantitatively elucidate the morphology of the fabricated NPSi, NPSi materials produced via a 60 minute modified MACE process were analyzed on various length scales to obtain information on pore size and inter-pore spacing by statistical analysis. FIGS. 4A and 4C depict SEM images of the NPSi material produced via 60 minutes of the modified MACE process using drop-cast 5 nm and 10 nm $SiO_2$-AuNPs, respectively (scale bars are 500 nm). FIGS. 4B and 4D show histograms of the Au core (particle) and pore size distributions for the 5 nm and 10 nm $SiO_2$-AuNPs, respectively. The commercially purchased stock 5 nm $SiO_2$-AuNPs particles were found to have a mean gold core diameter of 4 nm+/−1 nm, while the NPSi produced by the modified MACE method according to the current disclosure exhibited a resulting mean pore diameter of 6 nm+/−1 nm, and a porosity of 12.5%+/−1% (across three different samples) after MACE. Commercially purchased stock 10 nm $SiO_2$-AuNPs had a mean diameter of 9 nm+/−2 nm, and were shown to produce a mean pore size of 8 nm+/−3 nm and a porosity of 18.0%+/−3% (across three different samples) in the MACE process. Some of the discrepancy between gold core size and final pore size can be attributed to pore deformation occurring as a result of SEM imaging, likely a result of the high-voltage electron beam effects on the Si. In addition, gold core size and pore size were characterized by TEM and SEM respectively, which could also contribute to observed disagreement for the 10 nm sample. This approach is necessitated by the extreme difficulty of TEM sample preparation for the post-MACE high-porosity nanoporous silicon. Data from over 1000 pores and 400 particles are used for analysis. Similar results are observed over several microns of substrate, and the consistency of etching and coverage is solely limited by the $SiO_2$—AuNP monolayer quality and coverage. Even if particles are not assembled in ideal monolayers, the $SiO_2$ spacer ensures a minimum spacing of $$\left(\frac{\sqrt{3}}{4}d_t - d_{AuNP}\right)$$

where dt is the particle diameter including the gold core and silica shell, and dAUNP is the gold core diameter for up to a trilayer of $SiO_2$-AuNPs. The deposition of more than a monolayer does, however, result in a less controllable process by decreasing inter-pore spacing and increasing porosity unpredictably. As such, the ability to obtain large area monolayer arrays of $SiO_2$-AuNPs on the Si surface is crucial for a successful result. Both the sub-10 nm pore sizes and >12% porosities achieved here represent advances over previous ground breaking work by Gaborski et al. that showed NPSi with 10-40 nm pore sizes and 1.44% porosity.

Figure 5A:
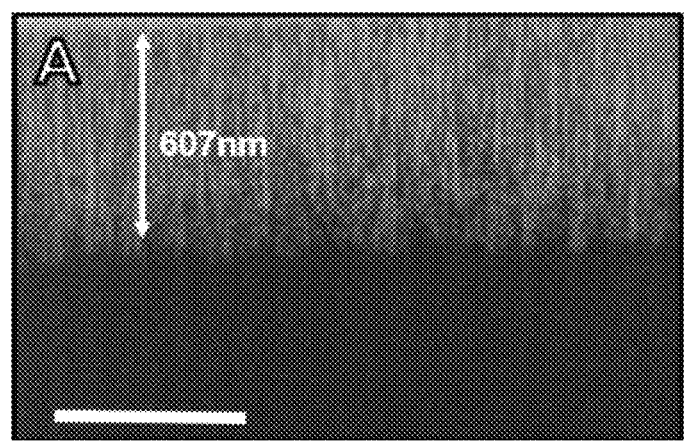
FIG. 5A is a reproduction of an SEM cross-sectional image of FIB milled NPSi produced via a modified MACE process with 5 nm $SiO_2$-AuNPs according to one example.
Figure 5B:
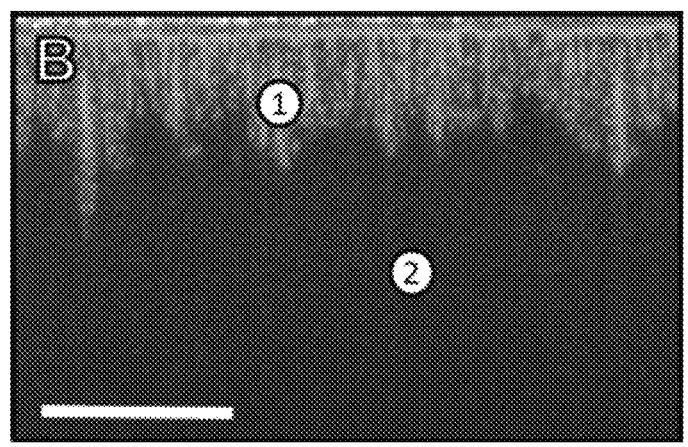
FIG. 5B is a reproduction of an SEM cross-sectional image of FIB milled NPSi produced via a modified MACE process with 10 nm $SiO_2$-AuNPs according to one example.
Figure 5C:
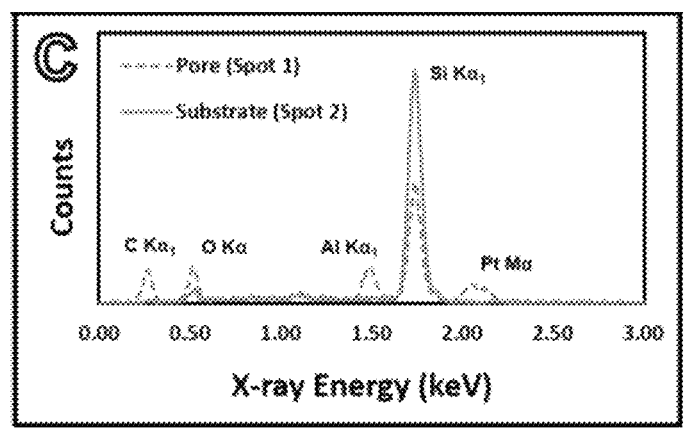
FIG. 5C is a graph showing EDS analysis of the SEM image of FIG. 5B.
Figure 6A:
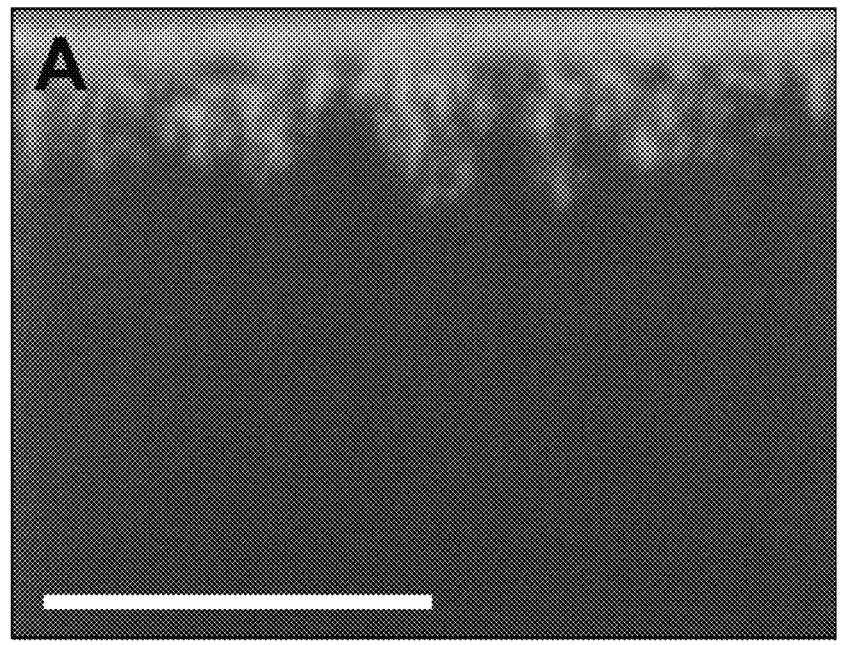
FIG. 6A is a reproduction of an SEM cross-sectional image of FIB milled NPSi produced via a modified MACE process with 5 nm $SiO_2$-AuNPs and an etching time of 30 minutes, according to one example.
Figure 6B:
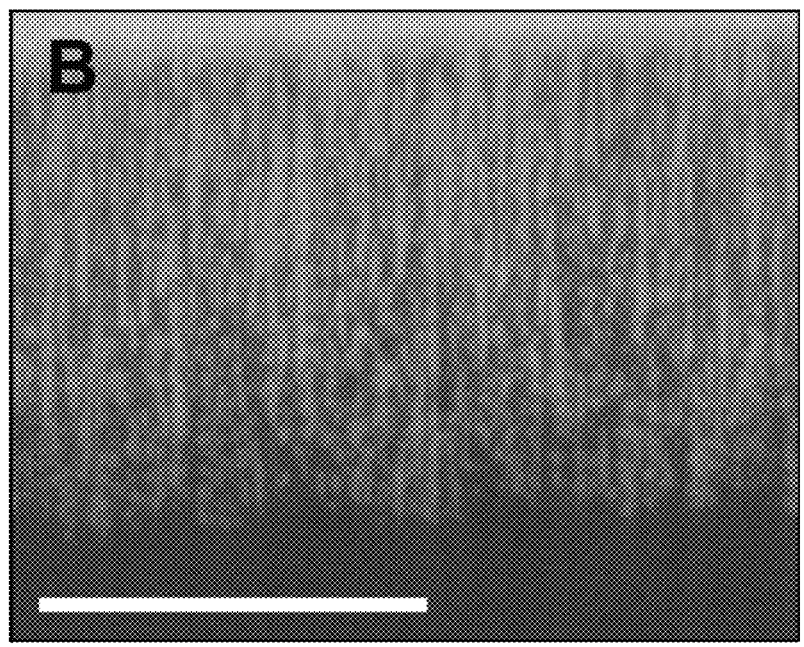
FIG. 6B is a reproduction of an SEM cross-sectional image of FIB milled NPSi produced via a modified MACE process with 5 nm $SiO_2$-AuNPs and an etching time of 60 minutes, according to one example.

In addition to pore size and inter-pore spacing, pore depth and aspect ratio are essential metrics for the application of NPSi in membranes and thin films. This was investigated following MACE processing by filling the resulting NPSi pores with aluminum oxide ($Al_2O_3$) using atomic layer deposition (ALD). ALD was used for the dual purpose of: (1) preserving the nanoporous structure and (2) enhancing the image contrast of pores against the Si matrix during cross-sectional milling and SEM imaging respectively. Cross-sections were milled from 60 minute MACE samples using focused ion beam milling (FIB) and were then imaged by SEM. FIGS. 5A-5B show SEM cross-sectional images of FIG milled NPSi produced via the modified MACE process with drop-cast 5 nm (FIG. 5A) and 10 nm (FIG. 5B) $SiO_2$-AuNPs (scale bars are 500 nm). The cross-sections were analyzed within (spot 1) and below (spot 2) the porous area using energy dispersive x-ray spectroscopy (EDS) as shown in FIG. 5C. The highly conformal nature of the ALD growth and its ability to fill narrow, high aspect ratio structures allows for an accurate representation of the NPSi cross-section. Pore filling was verified using EDS analysis within the pore area to show presence of Al and O within bright regions (e.g. Spot 1), and absence of these elements in dark regions (e.g. Spot 2) (FIGS. 5B-5C). EDS analysis revealed pore depths of over 500 nm for NPSi produced with both 5 nm (FIG. 5A) and 10 nm (FIG. 5B) $SiO_2$-AuNPs, yielding aspect ratios of over 100:1 for the 5 nm NPSi when coupled with the pore size data (FIG. 4B). Such aspect ratios have not been previously demonstrated in MACE produced NPSi, with the best recent result being the fabrication of nano-trenches with aspect ratios of 65:1. A possible explanation for this result is the close proximity and consistent spacing of the catalytic AuNPs, which results in uniform hole injection across the entire substrate, yielding excellent anisotropy and producing high aspect ratio pores. Further support for this is provided by the observation that 10 nm $SiO_2$—AuNP catalysts produced shallower nanopores than their 5 nm counterparts after an identical etching time (FIGS. 5A-5B). Close observation of the inter-pore spacing for the 5 nm and 10 nm samples reveals more tightly packed pores in the 5 nm case. It is likely that the closer proximity of gold particles allowed for more homogenous hole injection, and therefore a greater etching rate, resulting in deeper pores. To characterize the etching rate over time, cross-sectional samples of NPSi etched with 5 nm $SiO_2$—AuNP catalysts were imaged after 30 and 60 minutes. As shown in FIG. 6A, after 30 minutes of etching, pore depth reached approximately 200 nm, while 60 minutes of etching produced pores approximately 600 nm in depth, as shown in FIG. 6B (the scale bars in FIGS. 6A-6B are 500 nm). The slower rate over the first 30 minutes of etching may be a result of the time required for the consumption of the silica shell and the initiation of etching. Therefore, a more accurate etch rate is obtained by considering the final 30 minutes of etching, during which pores are produced in a direction normal to the surface at a rate of approximately 13 nm/minute. This rate is not expected to be constant for increased etching times, due to the diffusion-limited nature of the etching process.

Figure 7A:
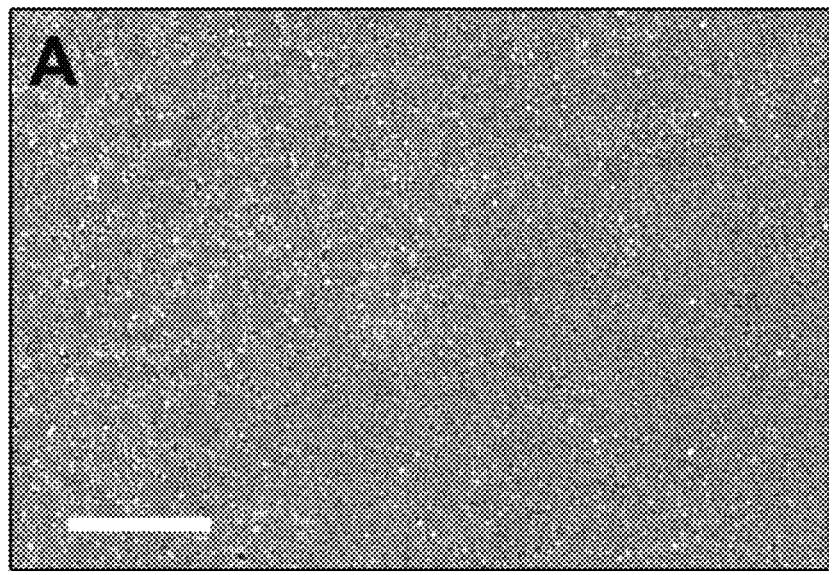
FIG. 7A is a reproduction of an SEM image of an NPSi sample produced via a modified MACE process with drop-cast 5 nm $SiO_2$-AuNPs and an etching times of 30 minutes, immediately after etching, according to one example.
Figure 7B:
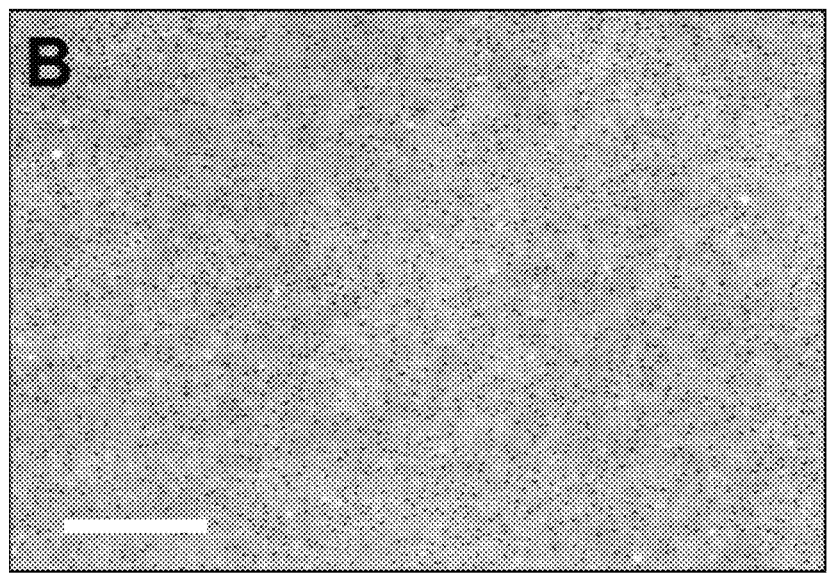
FIG. 7B is a reproduction of an SEM image of the NPSi sample of FIG. 7A after allowing the sample to sit in air for two months.

A final important property of merit for the produced NPSi is chemical and physical stability. The demonstrated ability to deposit ultra-stable materials such as $Al_2O_3$ onto the high aspect ratio pore walls of the produced NPSi (FIG. 5) shows that the material can be optimized both for many different applications and for maximum chemical stability. The physical stability of the NPSi was investigated by comparing images of a just-produced sample with one stored in air for two months. In particular, FIGS. 7A-7B show SEM images of NPSi produced via the modified MACE process with drop-cast 5 nm $SiO_2$-AuNPs and etching times of 30 minutes. Imaging was performed immediately after the etching process (FIG. 7A), and following a time period of two months during which the sample sat in air (FIG. 7B); the scale bars are 500 nm. The morphological similarity between the two samples demonstrates the structural stability of the material over time.

Example 2—Noble Metal Island Catalysts

In another set of illustrative examples, a modified MACE process is used to produce NPSi with sub-10 nm pore sizes and pore aspect ratios as high as 400:1. As discussed in more detail below, the method leverages the nucleation of sputtered noble metals on a silicon surface to form noble metal islands, which catalyze the etching process to form the high aspect-ratio pores. After etching, the porous structure is characterized with scanning electron microscopy (SEM) and transmission electron microscopy (TEM), as well as vertical and horizontal focused ion beam (FIB) cross-sectional milling at a depth of several microns within the silicon substrate. Moreover, as explained in more detail below, the NPSi is functionalized with $Al_2O_3$ and $TiO_2$ via atomic layer deposition (ALD). $TiO_2$-functionalized NPSi exhibits reflectivity of 6-8% for visible wavelengths, and 2-3% in the infrared—showing its promise as a robust and functional porous substrate. The developed approach of employing MACE with sputtered nucleated catalysts facilitates the scalable fabrication of functional ultra-high aspect-ratio nanopores in silicon.

Moreover, using the deposition of nucleated noble metal islands to catalyze the etching of nanopores via a MCE process offers the benefit of forming homogenous arrays of pores without the need to carefully control the parameters of the wet chemical processes associated with monolayer formation, as may be required for nanoparticle catalysts. Instead, the deposited noble metal may naturally form highly ordered arrays of homogeneously sized and spaced catalysts. In this manner, the methods described herein may allow for a simple two-step MACE process for producing NPSi. Further, this method is capable of forming NPSi without any intrinsic limitations on scaling to form nanoporous structures over large areas.

(100) Silicon wafers (B-doped, thickness: 275±25 µm, resistivity: 0.001-0.01 Ω·cm) were solvent cleaned using a standard Acetone-IPA-DI Water rinse. The dried wafers were sputtered with AJA ATC 2200 UHV Sputter Coater under pre-deposition pressure of $5$-$10 \times 10^{-8}$ Pa, Ar flow of 40 sccm, and deposition pressure of 4 mTorr. The targets were DC magnetron sputtered at 125 W. The deposition rates were 3.2 Å/s for gold (Au) and 4.0 Å/s for silver (Ag). Following deposition of the noble metals, and the subsequent formation of islands of the deposited noble metals, the substrates were placed into the MACE solution (5.33M HF, 0.12 M $H_2O_2$) to etch the substrate and form the NPSi. The reaction was terminated by washing with water and removal of substrates, followed by drying with a $N_2$ gun.

For functionalized samples, the NPSi was coated using a benchtop ALD system. In the case of alumina-functionalized samples, $Al_2O_3$ was coated via a static-flow process at 200° C.; the precursors were trimethylaluminum and $H_2O$, with calculated a growth rate of 1.14 Å/cycle. In the case of titania-functionalized samples, $TiO_2$ was coated via a static process at 190° C.; the precursors were tetrakis(dimethylamido)titanium and $H_2O$ with a calculated growth rate of 0.45 Å/cycle.

The process of sputtering nominally thin-films of metal causes the nucleation of homogenously spaced and sized islands. The size and morphology of islands is influenced by surface defects on the substrate and the interfacial energies of the metals with Si, where the metal surface energies (γ) are $\gamma_{Ag}$=1.246-1.250 J m², and $\gamma_{Au}$=1.500-1.506 J m⁻². Due to their wetting behavior on the native oxide surface, Au and Ag films nucleate as isolated islands instead of a continuous film.

Figure 8A:
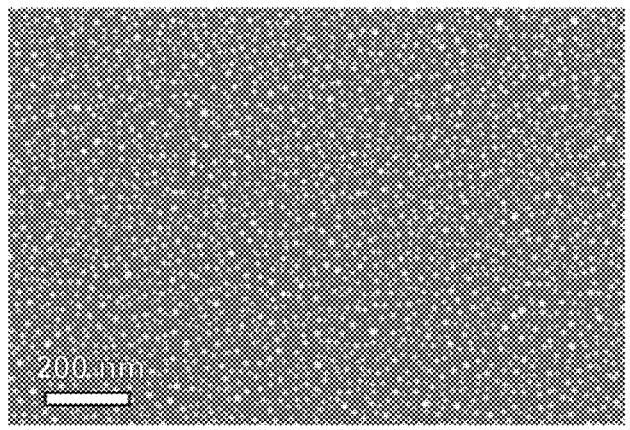
FIG. 8A is a reproduction of an SEM image of sputtered Ag islands on a Si substrate, according to one example.
Figure 8B:
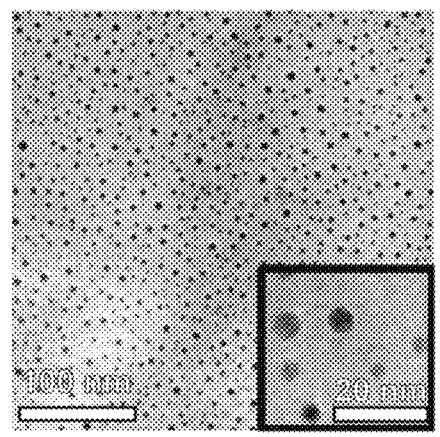
FIG. 8B is a reproduction of a TEM image of sputtered Ag islands on a Si substrate, according to one example.
Figure 8C:
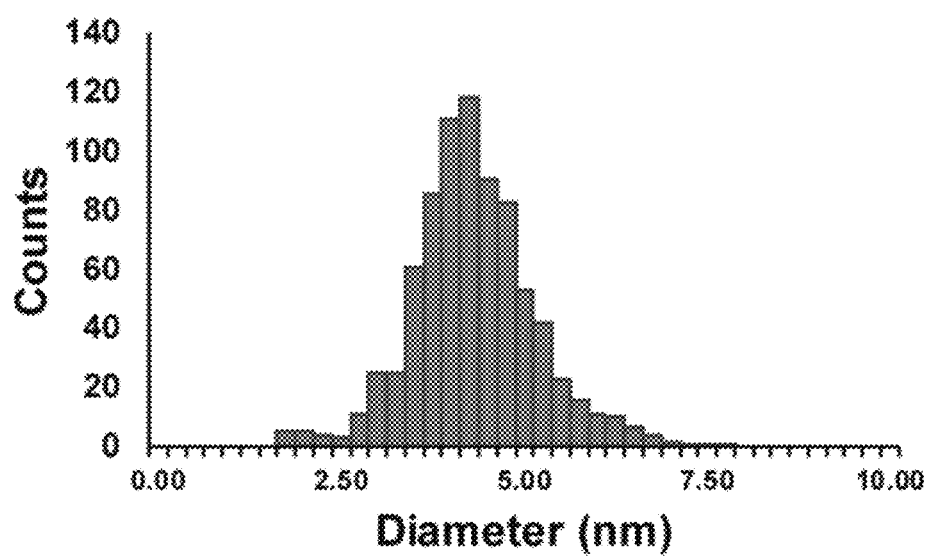
FIG. 8C is a plot showing a histogram of Ag island sizes calculated from the TEM image of FIG. 8B.
Figure 9A:
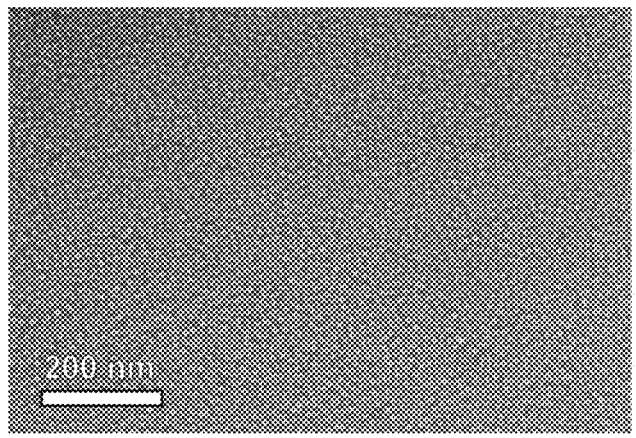
FIG. 9A is a reproduction of an SEM image of sputtered Au islands on a Si substrate, according to one example.
Figure 9B:
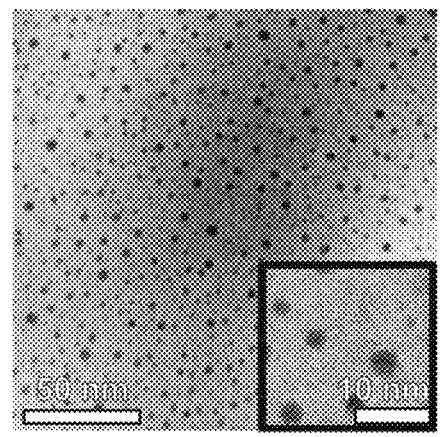
FIG. 9B is a reproduction of a TEM image of sputtered Au islands on a Si substrate, according to one example.
Figure 9C:
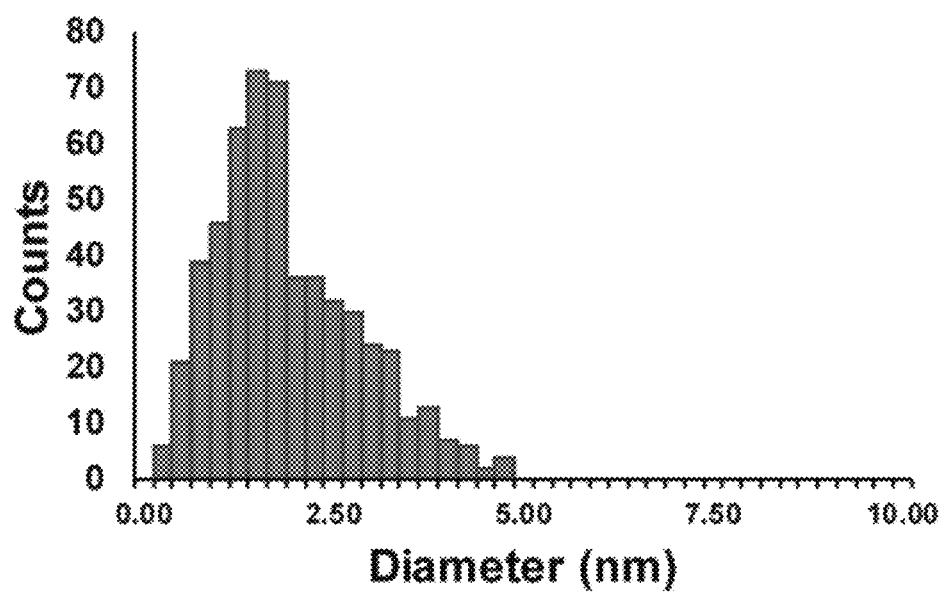
FIG. 9C is a plot showing a histogram of Au island sizes calculated from the TEM image of FIG. 9B.

FIGS. 8-9 show SEM and TEM images of nucleated islands resulting from sputtering 3 Å of Au and Ag, along with corresponding histograms of island size. In particular, FIGS. 8A and 8B show SEM and TEM images, respectively, of sputtered nucleated Ag islands, and a histogram of the Ag island sizes is shown in FIG. 8C. Similarly, FIGS. 9A and 9B show SEM and TEM images, respectively, of Au islands, and a histogram of the Au island sizes is shown in FIG. 9C. Observed diameters of nucleated islands are 4.4±0.9 nm for Ag (FIGS. 8A-C) and 2.0±0.9 nm for Au (FIGS. 9A-C). The SEM images demonstrate the large-area coverage of the Au and Ag islands over the silicon substrate. This island formation is homogeneous over the entire sputtered and etched region of the silicon wafer. TEM images show the Volmer-Weber film nuclei. The advantages to this method over using conventional nanoparticle deposition or in situ nanoparticle growth are superior substrate-metal interface contact area, smaller particle size, narrower particle size distribution, and uniform catalyst spacing over large areas.

Figure 10A:
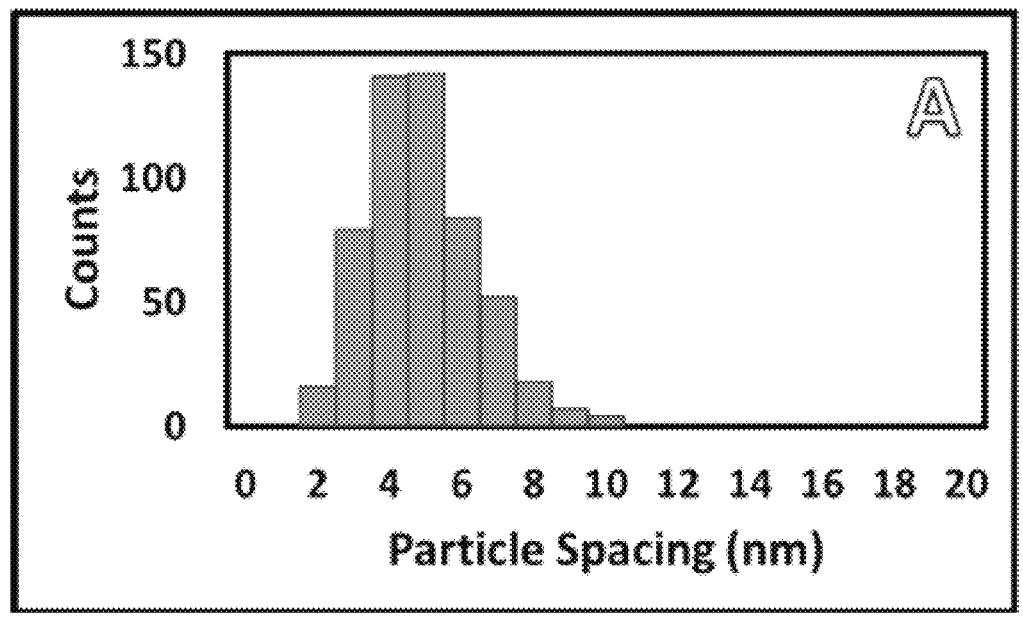
FIG. 10A is a plot showing a histogram of the spacing between the Ag islands calculated from the TEM image of FIG. 8B.
Figure 10B:
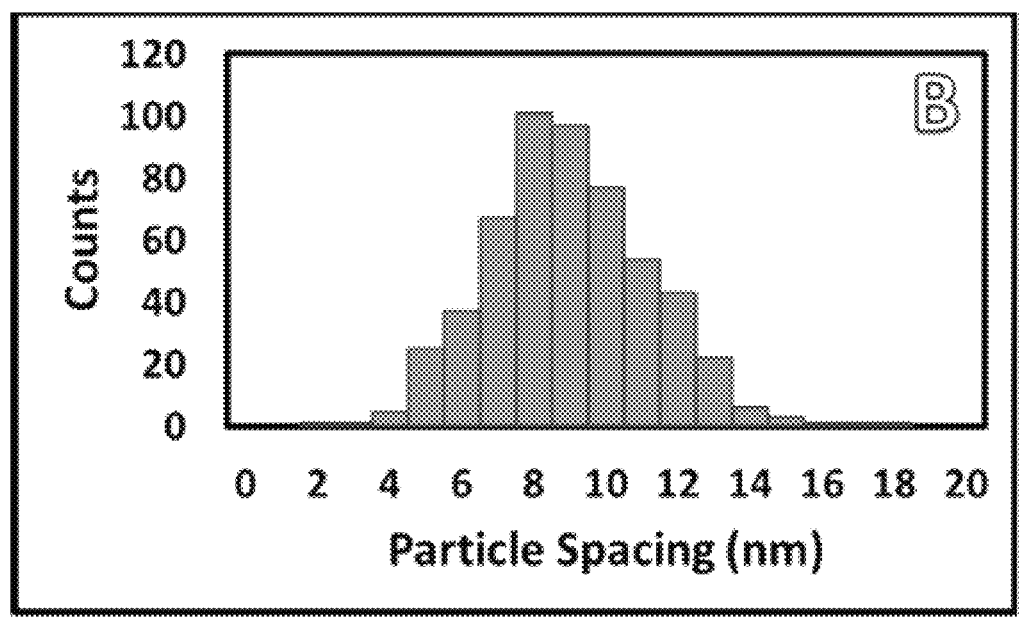
FIG. 10B is a plot showing a histogram of the spacing between the Au islands calculated form the TEM image of FIG. 9B.

FIGS. 10A-B show histograms of the island spacing for the Au and Ag samples, respectively; the histograms are calculated from the TEM images shown in FIGS. 8B and 9B, respectively. The spacing is defined as the separation distance between the center of one island and the center of its closest neighboring island.

Following sputter deposition, the wafer is placed in the MACE etchant solution. Etching of silicon is enabled by localized silicon oxidation, facilitated via catalytic reduction of $H_2O_2$ on noble metal nanoparticles. This is followed by etching of $SiO_2$ by HF, allowing the metal islands to continue etching normal to the Si surface. In some instances, after etching, the nanopores of the NPSi are filled with $Al_2O_3$ via ALD to enhance imaging contrast and to preserve the porous morphology prior to characterization.

In some cases, a further degree of control over island size could be employed via silicon surface treatment prior to catalyst nucleation. Removal of native oxide with HF prior to noble metal deposition increases wettability of the films. This in turn is expected to cause a lower metal island contact angle, but also higher likelihood of silicide formation. The effect of contact angle on etching characteristics can be elucidated by comparing the etching behavior of Au and Ag metal islands, which exhibit different wetting behavior. With its lower surface energy, Ag has a higher contact angle with Si than does Au, thus forming more pronounced islands, as seen in the SEM images shown in FIGS. 8A and 8D. This, in turn, leads to more lateral etching on the surface prior to etching in the <100> direction. This is observed as linear tracks surrounding pores as shown in FIG. 11B, which is an SEM image of a porous Si surface etched with Ag. In contrast Au has a lower contact angle, and does not exhibit the same degree of lateral etching as evidenced by FIG. 11A, which is an SEM image of a porous Si surface etched with Au. FIGS. 11C and 11D show SEM images of focused ion beam (FIB) milled cross-sections for the Au and Ag etched NPSi samples, respectively, with a 1 hour etch time. The pores were back filled with $Al_2O_3$ via ALD prior to FIB milling.

Figure 12A:
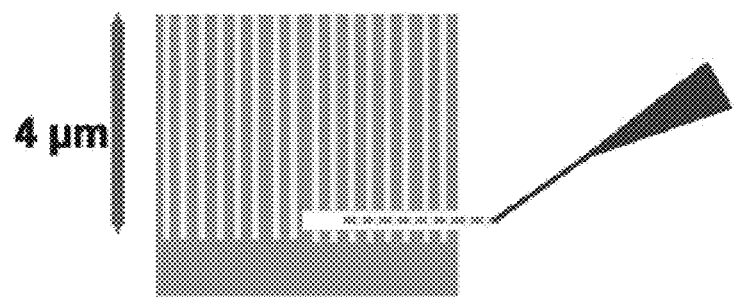
FIG. 12A is a schematic representation of a method for preparing a planar lamella of an NPSi sample, according to one example.
Figure 12B:
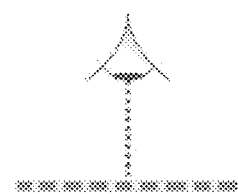
FIG. 12B is a schematic representation of the TEM perspective of a planar lamella, according to one example.
Figure 12C:
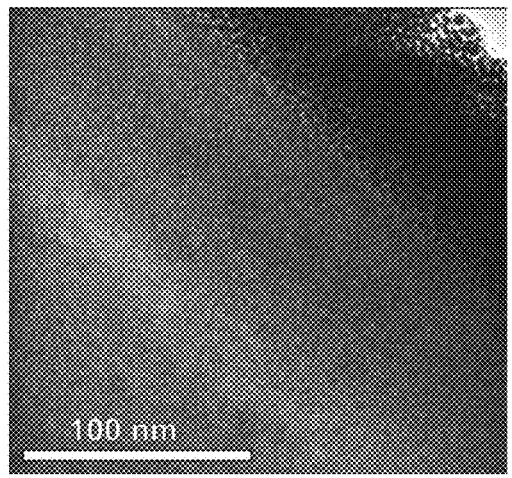
FIG. 12C is a reproduction of a TEM image of a planar lamella sample of native Si not exposed to a MACE process, according to one example.
Figure 12D:
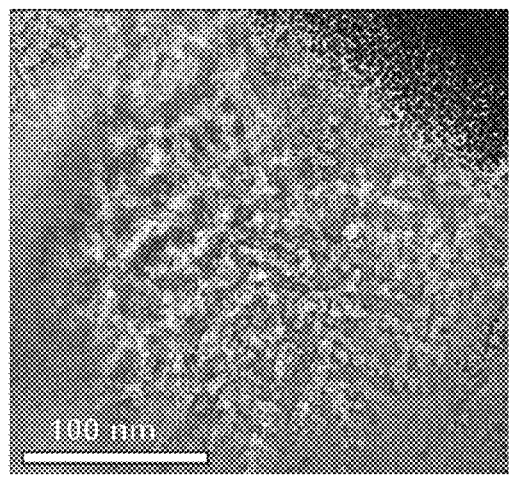
FIG. 12D is a reproduction of a TEM image of a planar sample of NPSi etched with sputtered Au catalysts, according to one example.

To verify the presence of nanopores and examine the morphology within the bulk of the sample following etching, TEM images of horizontal cross-sections (i.e., planar lamellae) of NPSi and a control Si sample prepared via FIB at a depth of 4 μm are compared. A schematic representation of the process for preparing the planar lamellae is shown in FIGS. 12A-B. In particular, FIG. 12A illustrates removal of a lamella from an NPSi sample via an Omniprobe, and FIG. 12B illustrates the TEM viewing perspective. FIG. 12C shows a TEM image of a lamella of a native Si sample not exposed to the MACE process, and FIG. 12D shows a TEM image of a lamella of a sample sputtered with a gold catalyst and immersed in the MACE solution for one hour. The darker contrast area in the top right corner of FIGS. 12C and 12D is due to a platinum protective layer deposited prior to planar sectioning. The TEM image shown in FIG. 12D demonstrates the presence of pores at depths beyond 4 μm into the substrate for the sample etched with sputtered Au. The ability to extract a 100 nm lamella at a 4 mm depth while maintaining the porous morphology also demonstrates the structural stability of the porous structure.

Figure 13:
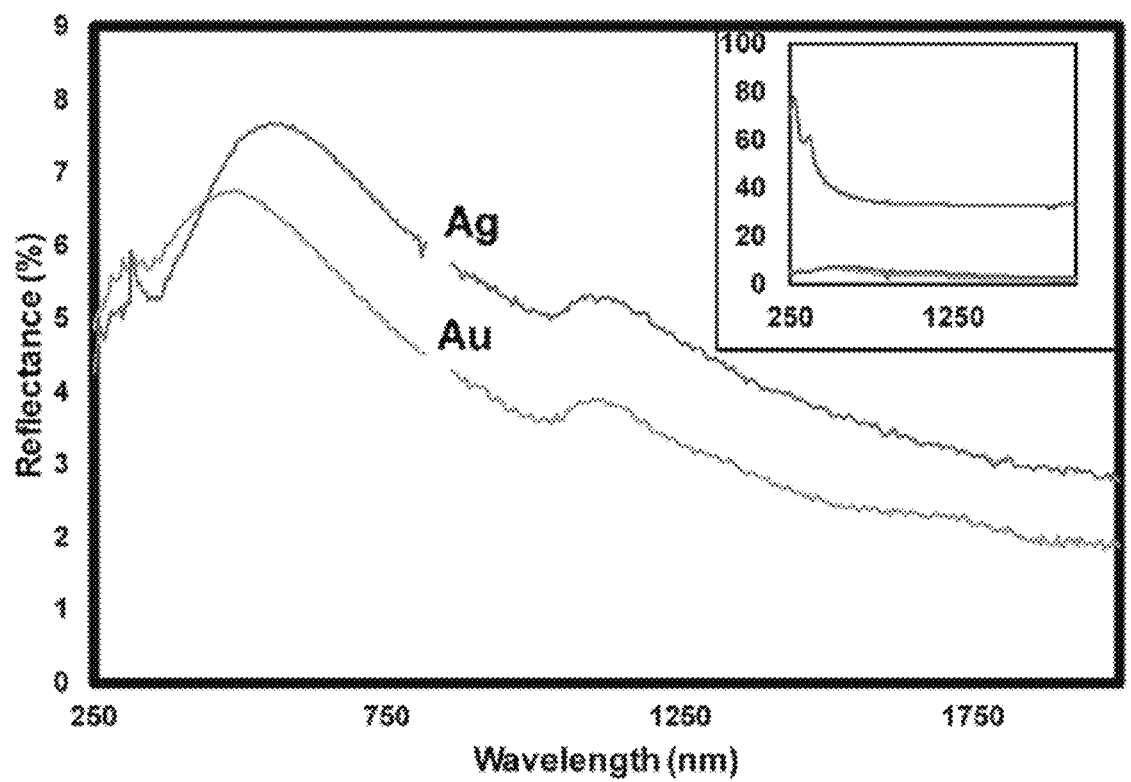
FIG. 13 is a plot showing the reflectance spectra for NPSi etched with sputtered Au and Ag catalysts and coated with $TiO_2$, according to one example.

In addition to the deposition of $Al_2O_3$, ALD is utilized here for the conformal coating of the NPSi pore walls with $TiO_2$. This process yields a porous, high surface-area functional substrate, while its porosity results in antireflective properties. Nanostructured $TiO_2$ has been explored for applications owing to its anti-reflective and self-cleaning properties. FIG. 13 shows reflectivity measurements for $TiO_2$-functionalized NPSi, demonstrating reflectance values between 2% and 8% over the UV-visible and short-IR wavelengths for both Au- and Ag-etched Si. The NPSi produced here demonstrates promise due to its small pore sizes, and high aspect ratios; with these metrics, higher pore densities can be achieved, which correlate to higher functional surface area. Thus, these results demonstrate NPSi functionalized with a deposited nanometer-thick layer of $TiO_2$, with the potential of being a material with competitive light absorption and conversion properties.

Figure 14A:
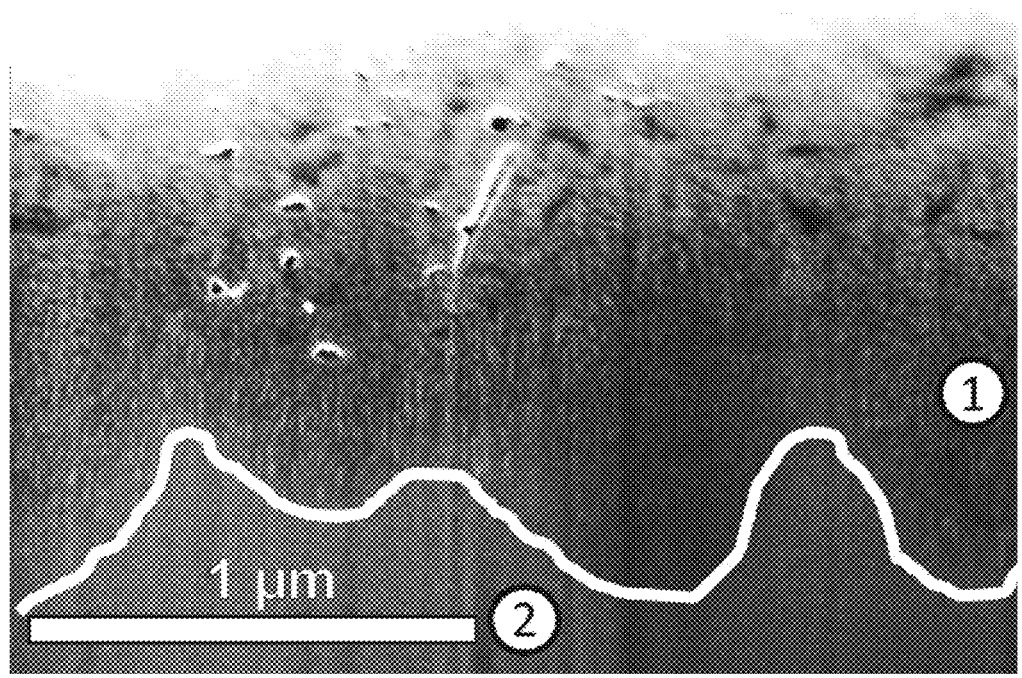
FIG. 14A is a reproduction of an SEM cross-sectional image of NPSi etched with sputtered Au islands and coated with $TiO_2$, according to one example.
Figure 14B:
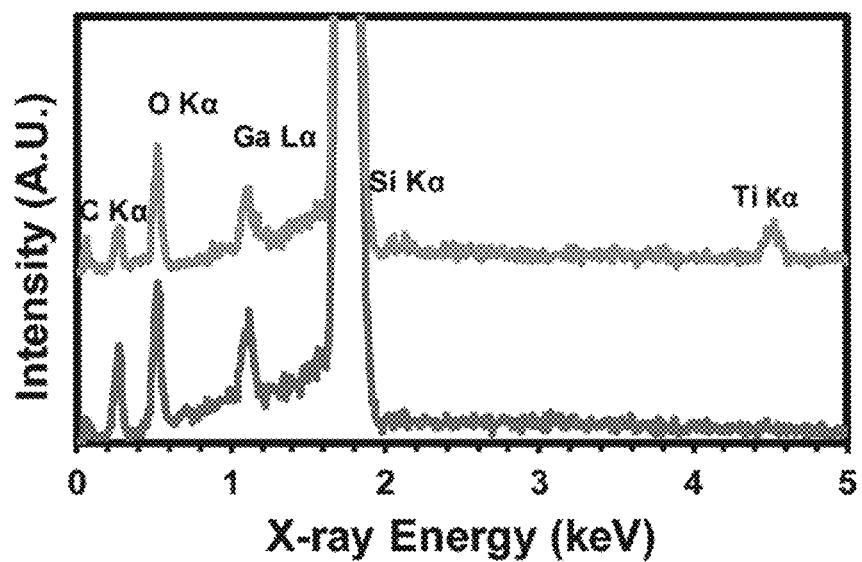
FIG. 14B is a plot showing the EDS spectra of the SEM image of FIG. 14A at two different spots, according to one example.

Turning now to FIG. 14A, an SEM image is shown for a FIB milled cross-section of a $TiO_2$ functionalized NPSi sample that was etched with Au. The $TiO_2$-filled pore area is lighter in comparison to the silicon background. The white line illustrates the lowest visible pore depth along the cross-section. FIG. 14B shows an EDS analysis of the SEM region shown in FIG. 14A for two different spots, labeled 1 and 2 in FIG. 14A. Spot 1 is at a depth of 700 nm below the surface and shows the presence of $TiO_2$, while spot 2 is at a depth of 1300 nm below the surface and does not show $TiO_2$. The Si peak is cut off due to the strong signal from the underlying substrate. These results confirm conformal $TiO_2$ deposition into high aspect ratio pores to depths of roughly 1 μm below the substrate surface. Ti and O are both present above the dotted line (700 nm, EDS point 1) (FIG. 12B). The pores shown in FIG. 14A are fully filled with $TiO_2$ for characterization, but can also be partially filled to maintain the nanoporous structure of the substrate. EDS point 2, at 1300 nm, shows no Ti presence. C and Ga are present due to the substrate and surface contamination and ion implantation, respectively. The lack of a Ti signal indicates the absence of the porous regime.

Figure 15:
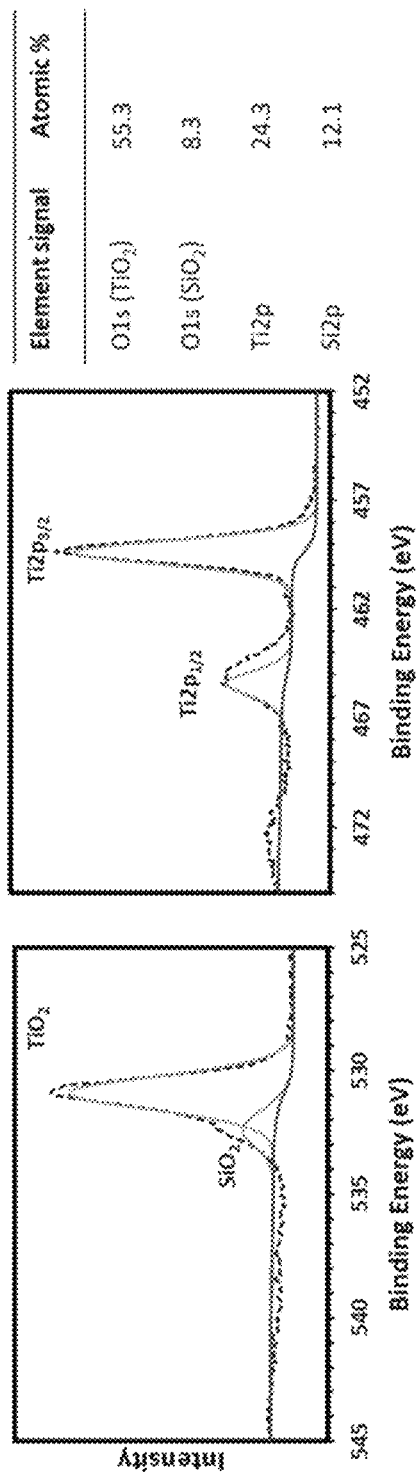
FIG. 15 shows plots of an XPS analysis of ALD-coated NPSi, according to one example.

The coated NPSi surface was characterized via XPS to confirm the composition of the ALD coating. FIG. 15 shows high resolution XPS scans of O and Ti from ALD-processed NPSi. The O1 signal is deconvoluted to separate peaks associated with $SiO_2$ and $TiO_2$ oxygen signals. These high resolution element scans confirm the stoichiometry of the $TiO_2$ coating: deconvolution of the O is peak into $TiO_2$ and $SiO_2$ yields an O:Ti ratio of 2.3:

These results demonstrate the realization of NPSi with sub-10 nm, ultra-high aspect ratio pores, which can be made functional via the ALD deposition of $TiO_2$. By leveraging interfacial effects and the nature of film formation, sub-5 nm noble metal islands are nucleated on silicon uniformly over multiple square centimeters. The developed technique is advantageous when compared to other MACE schemes due to the islands' narrow size distribution and planar interface with the Si, reducing the occurrence of unwanted etching effects resulting from nanoparticle facets and substrate contact surface area. These islands are shown to etch pores with aspect ratios as high as 400:1 for both Au and Ag catalysts. The resulting highly porous substrates are then coated with a functional layer of $TiO_2$ via ALD to demonstrate the potential functionality of NPSi.

Example 3—Patterning of Two-Dimensional Materials

In a further set of illustrative examples, nanoporous silicon (NPSi) membranes are used as mask materials for the patterning of $MoS_2$ via oxygen plasma etching. This example takes advantage of the methods herein, which allow for the production of NPSi having sufficiently small (e.g., sub-30 nm) pores in silicon with aspect ratios greater than 10:1, such that the pores penetrate sufficiently thick free-standing films so as to provide mechanical stability over large areas. By leveraging the methods described herein for producing porous silicon membranes containing nanopores with aspect ratios greater than 1000:1 and diameters less than 20 nm, this example demonstrates the direct applicability of NPSi as an etch mask for the patterning of $MoS_2$, and 2D materials in general, over arbitrarily large areas. In particular, this example demonstrates the patterning of areas with porosity, which is realized by the use of silicon masks where nanoporous areas are confined to the micron scale. Upon the generation of nanoporous 2D monolayers, the pore size is further controlled by facile thermal annealing in air, which is monitored by optical spectroscopy and electron microscopy.

Robust, large-area NPSi membrane masks are fabricated by first sputtering silver films of 1 Å nominal thickness onto a (100) Si surface, resulting in the nucleation of hemispherical nanoislands. Samples are then submerged in a solution of hydrogen peroxide and hydrofluoric acid (HF) for varying amounts of time, facilitating the etching of nanopores via a metal-assisted chemical etching (MACE) process, whereby oxidation occurs locally at the silicon-catalyst interface, and oxide is subsequently consumed by HF. This electroless etching process is only limited by the presence of reactants in solution, and when performed over extended periods of time can produce pores of aspect ratio over 1000:1 which completely penetrate Si substrates many microns in thickness.

Figure 16A:
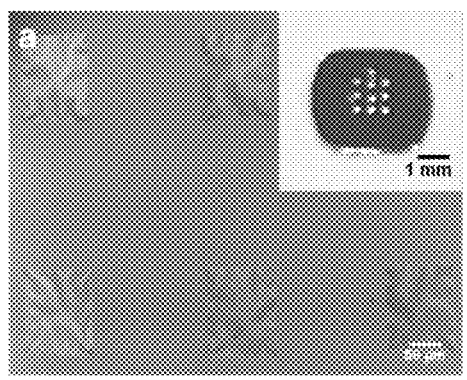
FIG. 16A shows an optical microscope image of five crystalline Si windows on a single silicon mask chip, according to one example.
Figure 16B:
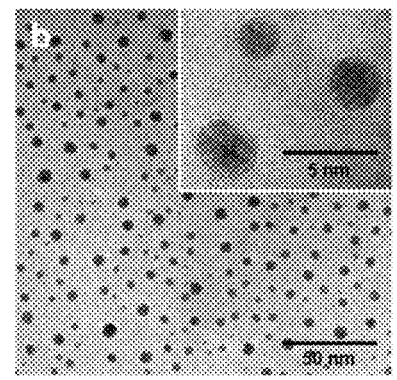
FIG. 16B shows a TEM image of a Si window coated with Ag nanoisland catalysts, according to one example.
Figure 16C:
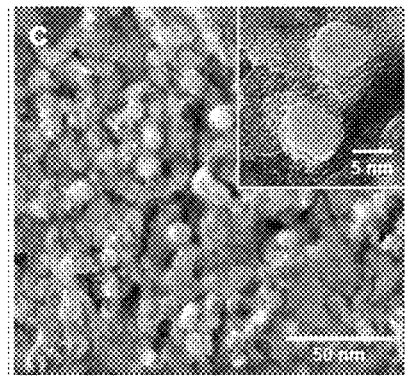
FIG. 16C shows a TEM image of a porous Si window following 1 min of MACE, according to one example.

Two types of mask are explored in this example. The first type of mask is a 50 nm-thick (100) NPSi layer, etched for 1-2 min following catalyst deposition, as shown in FIGS. 16A-16C. In particular, FIG. 16A shows an optical microscope image of five crystalline Si (c-Si) windows (100 μm by 100 μm) of 50 nm thickness on a single silicon mask chip (3 mm by 3 mm). The patterned mask defines the areas to be porous after etching. The inset in FIG. 16A shows a photograph of an entire silicon mask chip containing ten 50 nm-thick c-Si windows. FIG. 16B shows a TEM image of a 50 nm-thick c-Si window coated with Ag nanoisland catalysts via radio frequency (RF) sputtering, and FIG. 16C shows a TEM image of a porous 50 nm-thick c-Si window following 1 min of MACE. The inset in FIG. 16C shows sub-10 nm pores in the NPSi layer etched via the MACE process.

Figure 16D:
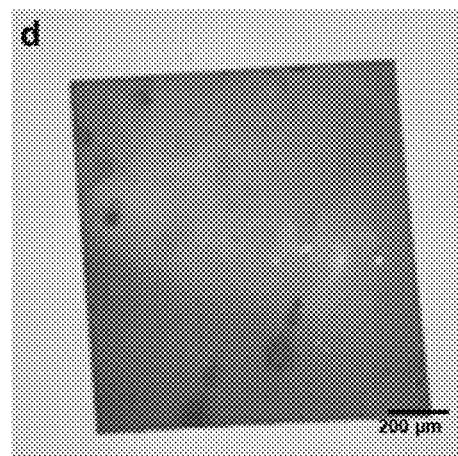
FIG. 16D shows a photograph of an approximately 1 $cm^2$ NPSi mask of 15 μm thickness, according to one example.
Figure 16E:
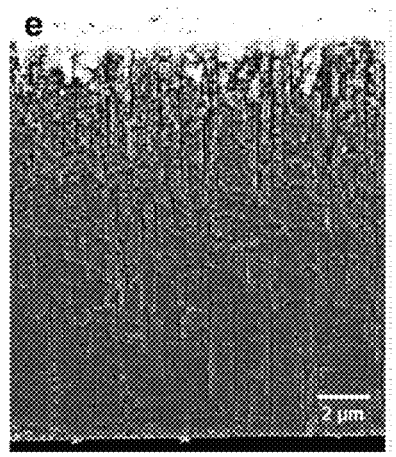
FIG. 16E shows an SEM cross-sectional image of the 15 μm-thick NPSi mask of FIG. 16D.
Figure 16F:
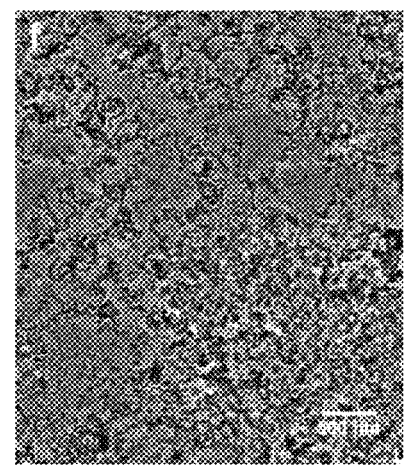
FIG. 16F shows an SEM image of the bottom surface of the NPSi mask of FIG. 16E.

The second type of mask is an approximately 15 μm-thick (100) NPSi layer, etched for 24 hours, and is shown in FIGS. 16D-16F. In particular, FIG. 16D shows a photograph of an approximately 1 $cm^2$ NPSi mask of 15 μm thickness. FIG. 16E shows an SEM cross-sectional image of the 15 NPSi mask of FIG. 16D. Porosity is observed to decrease with depth due to the lack of completely anisotropic etching in the MACE process. FIG. 16F shows an SEM image of the bottom surface of the NPSi mask of FIG. 16E, which is the surface in contact with the $MoS_2$ flakes during oxygen plasma exposure.

While the 50 nm-thick mask allows for pore diameters less than 10 nm after 1 min etching (FIG. 16C) or ~15 nm upon 2 min etching, it is fragile, and therefore only available as a free-standing film in 100 μm by 100 μm windows. In contrast, the 15 μm-thick mask may be produced over many $cm^2$ of area, but has a larger average pore diameter of 13.5 nm as indicated by Brunauer-Emmett-Teller (BET) nitrogen desorption analysis. Part of the pore size increase in the thick mask as measured by BET can be attributed to the heavily roughened surface and the underlying few micrometers of highly perforated material (FIG. 16E), though imaging of the smoother back surface in contact with the $MoS_2$ during patterning (FIG. 16F) also reveals larger pore diameters than are present in the thin masks. For the 50 nm-thick masks, transmission electron microscopy (TEM) imaging of thousands of pores indicates a porosity of approximately 2.8% (FIG. 16C).

Figure 17A:
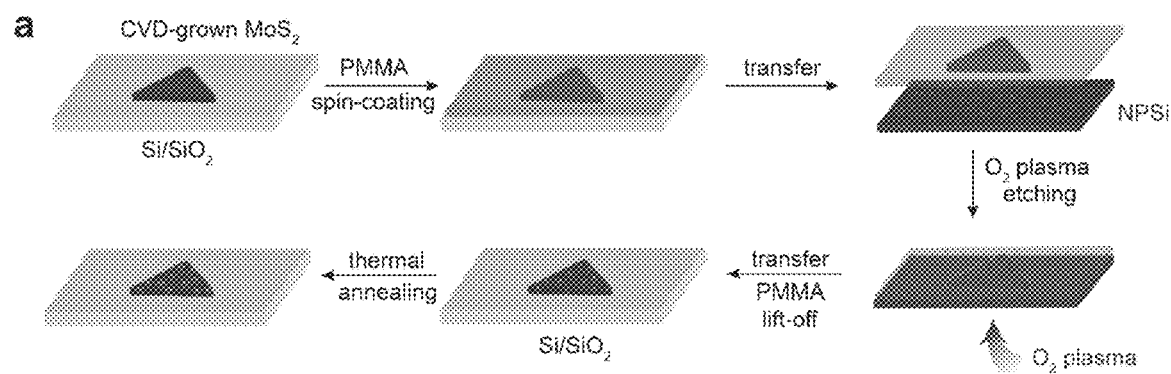
FIG. 17A is a schematic illustration of a NPSi-assisted patterning process for nanoporous monolayer materials and the subsequent thermal annealing process to control the porosity, according to one example.

A schematic illustration of the patterning process of this example is shown in FIG. 17A. Specifically, FIG. 17A illustrates the NPSi-assisted patterning process for nanoporous monolayer materials and the subsequent thermal annealing process to control the porosity. Chemical vapor deposition (CVD)-grown $MoS_2$ domains (10-100 μm) on silicon wafer with a 300 nm silicon oxide layer are spin-coated with poly(methyl methacrylate) (PMMA) and transferred onto a NPSi substrate via KOH-assisted etching of the silicon oxide layer. The substrate is exposed to $O_2$ plasma selectively on the opposite side of $MoS_2$/PMMA in order to etch only the nanoscale fractional areas of the $MoS_2$ that are in contact with the nanopore areas of the NPSi mask. Subsequently, the NPSi mask is removed by KOH-assisted etching, and the $MoS_2$/PMMA layer is transferred to another silicon wafer. After removing the PMMA coating with acetone, the nanoporous $MoS_2$ domains are examined by optical microscopy, scanning electron microscopy (SEM), and photoluminescence (PL) and Raman spectroscopy. The initial porous structures are subsequently further modified by thermal annealing in air, and the structural changes are investigated by the above-noted microscopy and spectroscopy techniques.

Figure 17B:
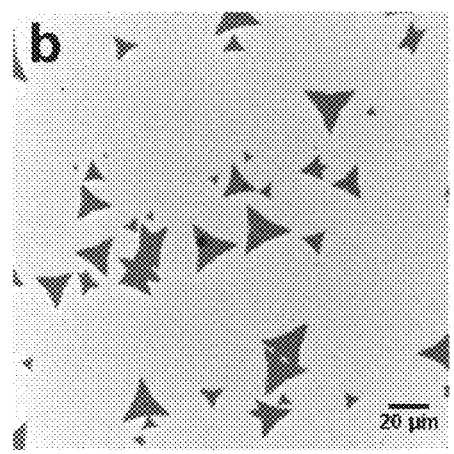
FIG. 17B shows an SEM image of pristine $MoS_2$ domains on a $Si/SiO_2$ substrate, according to one example.
Figure 17C:
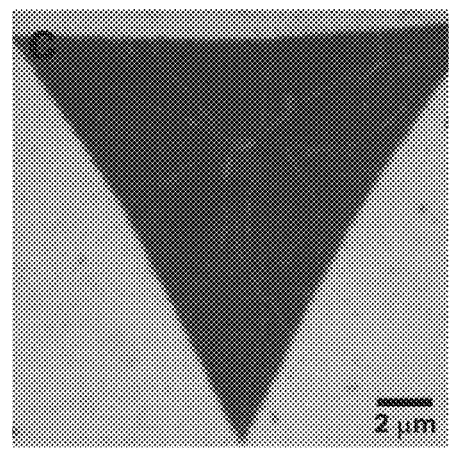
FIG. 17C shows an SEM image of a single triangular $MoS_2$ domain after undergoing a patterning process, according to one example.
Figure 17D:
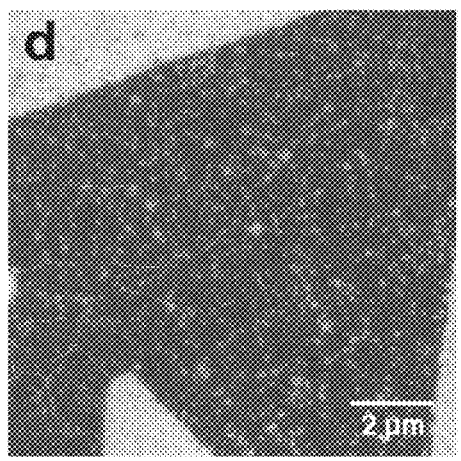
FIG. 17D shows an SEM image of a nanoporous $MoS_2$ domain produced via selective etching through a thin NPSi mask, according to one example.
Figure 17E:
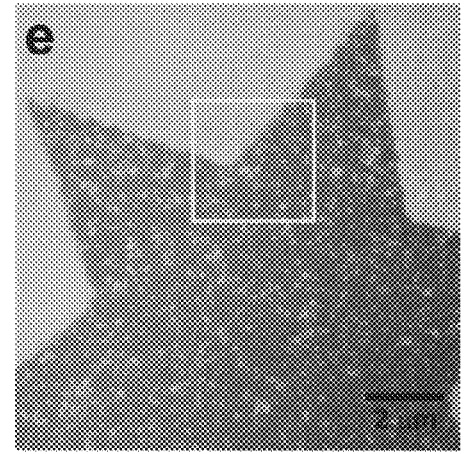
FIG. 17E shows an SEM image of a star-shaped nanoporous $MoS_2$ domain from the same substrate as shown in FIG. 17D.
Figure 17F:
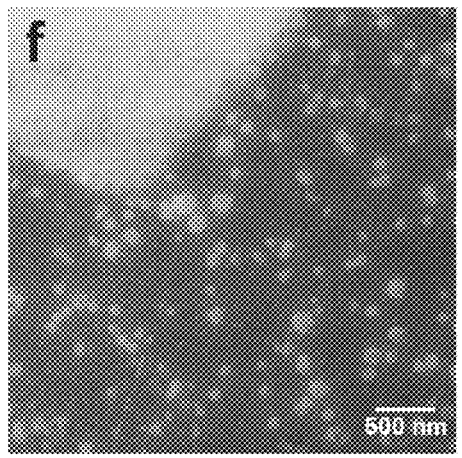
FIG. 17F depicts a magnified view of the region indicated with the box in FIG. 17E.
Figure 17G:
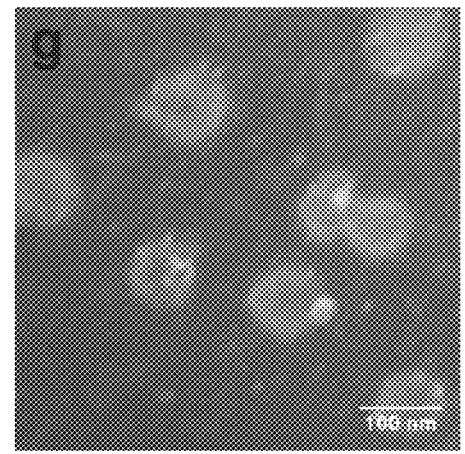
FIG. 17G sows a high magnification SEM image of a nanoporous $MoS_2$ domain, according to one example.

Imaging of the $MoS_2$ domains following oxygen plasma exposure through the NPSi mask reveals the introduction of significant porosity in the material. This is exemplified via comparison between pristine MoS$_2$ domains shown in FIGS. 17B and 17C, and those patterned by selective etching through a thin (50 nm) NPSi mask, as shown in FIGS. 17D-17G. In particular, FIG. 17B shows an SEM image of pristine MoS$_2$ domains on a Si/SiO$_2$ substrate, and FIG. 17C shows an SEM image of a single triangular MoS$_2$ domain that underwent the patterning process without being exposed to O$_2$ plasma as covered by the silicon mask chip. FIG. 17D shows an SEM image of a nanoporous MoS$_2$ domain produced via selective etching through a thin (50 nm) NPSi mask for 2 min, FIG. 17E shows an SEM image of a star-shaped nanoporous MoS$_2$ domain that is found on the identical substrate as shown in FIG. 17D. FIG. 17F depicts a magnified view of the region indicated with the yellow box in FIG. 17E, and shows the nanoscale pores with a range of diameters, and FIG. 17G sows a high magnification SEM image of a nanoporous MoS$_2$ domain. The MoS$_2$ domain patterned with the thin NPSi mask (FIGS. 17D-17G) possesses an average porosity of 8.5%, with a pore diameter of 65.9±13.3 nm.

Referring now to FIG. 17H, a WS$_2$ domain patterned with a 15 μm-thick NPSi mask (1 cm by 1 cm) over 4-5 μm continuous area is depicted, Specifically, FIG. 17H is an SEM image of a nanoporous WS$_2$ domain following 30 sec of O$_2$ plasma etching using a 1 cm$^2$ NPSi mask of 15 μm thickness. FIG. 17I is a magnified view of the sample shown in FIG. 17H, showing less round and connected morphology of nanopores on WS$_2$ domains, and FIG. 17J is another magnified view of the sample of FIG. 17H showing the comparable size of pores to those in FIG. 17G. These magnified views indicate the morphology of the nanoporous domain resembling that of the 15 μm-thick NPSi mask. The density and size of pores generated by the large-scale free-standing mask is comparable to those observed in FIGS. 17D-17G, which indicates the scalability of this patterning method over a range of Si mask thicknesses and lateral dimensions. Given the successful patterning of WS$_2$ domains, it is expected the application of the etching technique may to be extended to general sets of 2D materials including graphene, h-BN, and other transition metal dichalcogenides (TMDs).

In this example, the O$_2$ plasma etching through NPSi masks completed in different time scales depending on the thickness of the masks. The plasma treatment of 2 min was used to pattern TMD domains through 50 nm-thick Si masks with sub-10 nm pores, while 30 sec exposure to plasma through 15 μm-thick Si masks was sufficient to generate similar scale pores on the domains.

Further, following initial O$_2$ plasma treatment of 2 min, which generates round pores as determined by the shape of the NPSi structures, an effective strategy to control the pore size of monolayer MoS$_2$ domains is demonstrated via thermal treatment at 300° C. in air. Defect sites of MoS$_2$ flakes are prone to oxidative etching under high temperature conditions, and thus the size of the nanopores may be controlled via gradual thermal annealing. The nanopore size and density increases with heating time, indicating that mass loss occurs from the edge of existing nanopores, most likely in the form of S depletion. The enlargement of these holes results in an increased edge-to-area ratio in the MoS$_2$ sample. The increase of edge sites, which have implications in the optical and catalytic properties, can be effectively modified by the simple heating processes without the need of a furnace or inert conditions. Depending on the application, the optimal edge-to-area ratio can be selected, and diverse nanoscale patterns can be achieved.

Figure 18A:
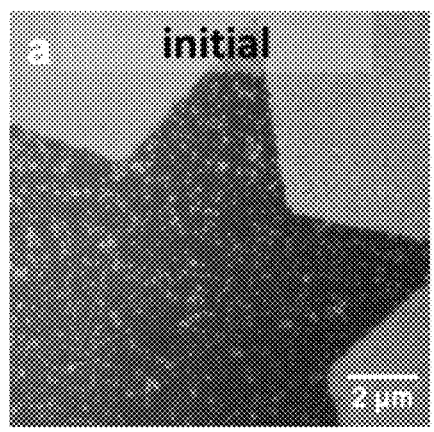
FIG. 18A shows an SEM image of a $MoS_2$ domain after an $O_2$ plasma treatment through a NPSi mask, according to one example.
Figure 18B:
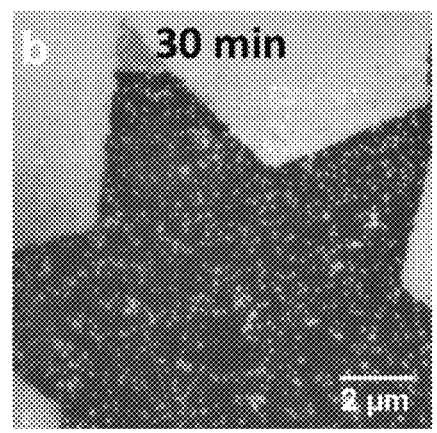
FIG. 18B shows SEM image of the $MoS_2$ domain of FIG. 18A after 30 minutes of thermal annealing in air.
Figure 18C:
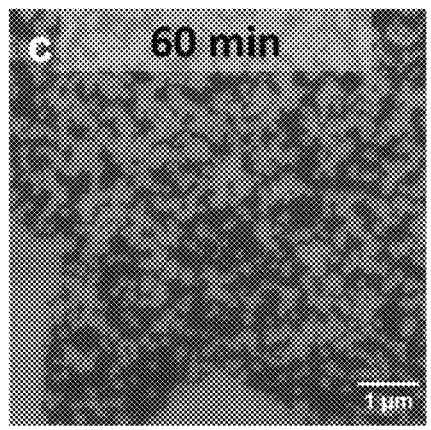
FIG. 18C shows an SEM image of a $MoS_2$ domain from a sample identical to the sample of FIG. 18B after 60 minutes of annealing.
Figure 18D:
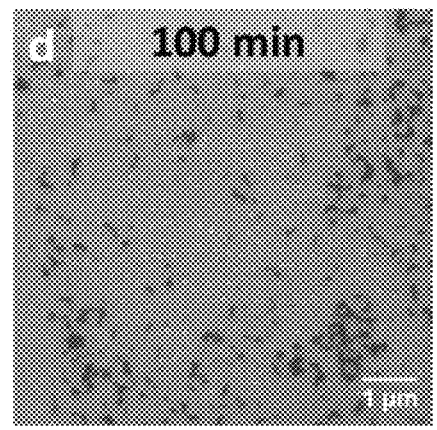
FIG. 18D shows an SEM image of a $MoS_2$ domain from a sample identical to the sample of FIG. 18B after 100 minutes of annealing.
Figure 18E:
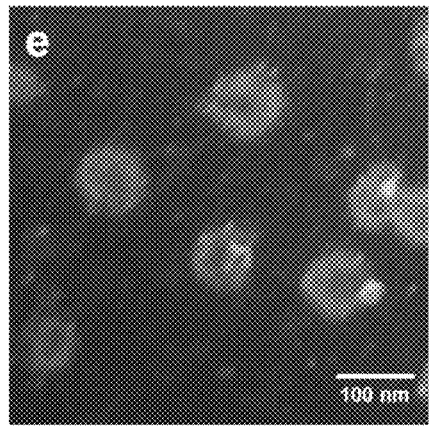
FIG. 18E shows a magnified view of the sample of FIG. 18A and shows individual pores with diameters of about 70 nm.
Figure 18F:
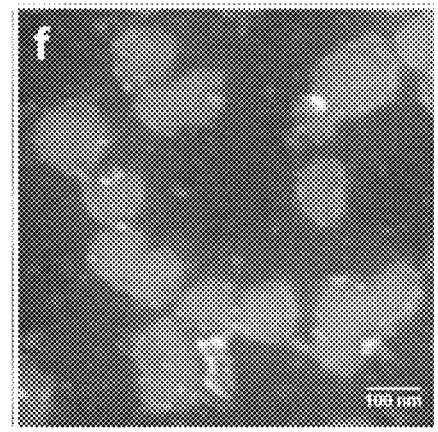
FIG. 18F shows a magnified view of the sample of FIG. 18B, and shows nano-patterns of enlarged pores produced in the monolayer $MoS_2$.
Figure 18G:
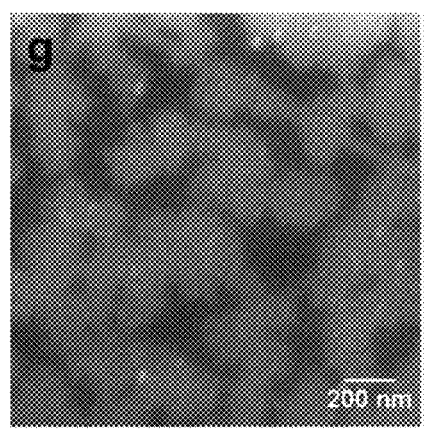
FIG. 18G shows a magnified view of the sample of FIG. 18C, and shows further expanded and converged pores.
Figure 18H:
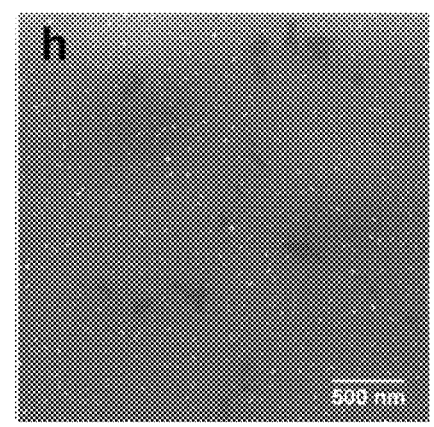
FIG. 18H shows a magnified view of the sample of FIG. 18D, and shows $MoS_2$ flakes and oxidized $MoS_2$ particles.

Up to 30 min of annealing, the oxidation does not lead to any visible change on the morphology of the nano-pattern under SEM. The effect of annealing for 30, 60, and 100 minutes is shown in FIGS. 18A-18H, which show expansion of pores and their convergence due to the oxidation of the edge sites of patterned MoS$_2$. FIG. 18A shows an SEM image of a MoS$_2$ domain after an initial 2 minute O$_2$ plasma treatment through a 50 nm-thick NPSi mask. FIG. 18B shows SEM image of the MoS$_2$ domain of FIG. 18A after 30 minutes of thermal annealing in air. FIG. 18C shows an SEM image of a MoS$_2$ domain from an identical sample after 60 minutes of annealing, and FIG. 18D shows an SEM image of a MoS$_2$ domain from an identical sample after 100 minutes of annealing. FIG. 18E shows a magnified view of the sample of FIG. 18A showing individual pores with diameters of about 70 nm. FIG. 18F shows a magnified view of the sample of FIG. 18B showing nano-patterns of enlarged pores produced in the monolayer MoS$_2$, and FIG. 18G shows a magnified view of the sample of FIG. 18C, showing further expanded and converged pores. FIG. 18H shows a magnified view of the sample of FIG. 18D, showing MoS$_2$ flakes and oxidized MoS$_2$ particles. The product of oxidation, MoO$_3$ particles, is visible in the magnified images as bright dots in FIG. 18H.

Figure 18I:
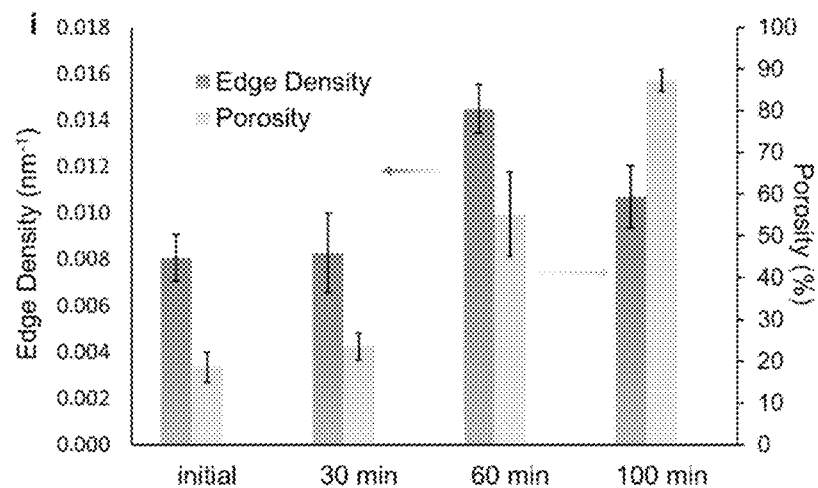
FIG. 18I is a plot of $MoS_2$ edge density and porosity with respect to thermal annealing time for $O_2$ plasma etched samples, according to one example.

FIG. 18I summarizes the effect of thermal annealing on the edge density and porosity of the MoS$_2$ domains following plasma treatment. Specifically, FIG. 18I is a plot of MoS$_2$ edge density and porosity with respect to thermal annealing time for O$_2$ plasma etched samples. N=3 for all data in FIG. 18I. Porosity increases monotonically with annealing time, gradually over the first 30 minutes, then more aggressively, reaching 87.3±2.61% after 100 minutes at 300° C. The effect of annealing time on edge density is also depicted. Edge density is observed to remain statistically similar after 30 minutes of annealing time. This can be explained by the convergence of pores as they expand, resulting in the decrease in edge-to-area ratio within the porous MoS$_2$ domain. This balancing effect is observed to dissipate by 60 minutes of annealing, primarily due to drastically increased pore intercalation corresponding with a significantly greater porosity of 55.2±10.1%, resulting in a near doubling of edge density from 0.00827±0.00170 nm$^{-1}$ after 30 min to 0.0145±0.00106 nm$^{-1}$. Further annealing is observed to have a negative impact on edge density, as an increase in porosity to 87.3±2.61% after 100 min corresponds to a drop in edge density to 0.0107±0.00135 nm$^{-1}$, as connectivity between remaining MoS$_2$ regions is diminished. This result provides valuable insight for optimizing edge densities in MoS$_2$ and other 2D materials via nano-patterning and thermal annealing.

Figure 18J:
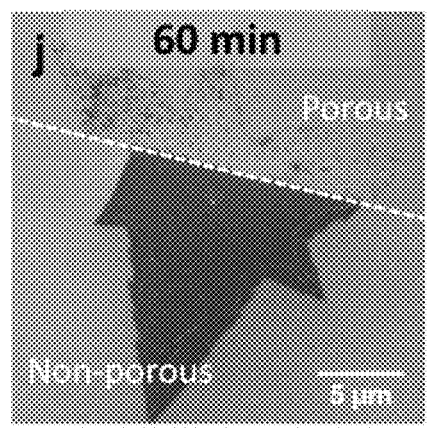
FIG. 18J shows an SEM image of a $MoS_2$ domain located half on a NPSi etch mask and half on non-porous silicon after $O_2$ plasma treatment and 60 minutes of thermal annealing, according to one example.
Figure 18K:
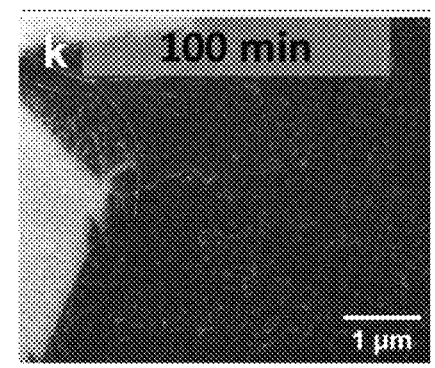
FIG. 18K shows an SEM image of a pristine $MoS_2$ domain after 100 minutes of thermal annealing in air, according to one example.

FIG. 18J demonstrates the efficacy of the developed process, where half of a MoS$_2$ domain resting over a 50 nm thick NPSi porous mask region is nearly effectively patterned following O$_2$ plasma exposure, while the other half located on a non-porous region remains in a pristine state. In particular, FIG. 18J shows an SEM image of a MoS$_2$ domain located half on a 50 nm thick NPSi etch mask and half on non-porous silicon after O$_2$ plasma treatment and 60 minutes of thermal annealing. This shows the seamless attachment of MoS$_2$ domains on the mask across the boundary of the 50 nm-thick NPSi window and the supporting silicon chip, enabled by the PMMA-assisted transfer and mild drying process at 100° C. The SEM image showing the half-patterned MoS$_2$ domain after 60 min of thermal annealing also confirms that the oxidation occurs more extensively on the nanoporous side rather than on the pristine area under identical annealing conditions. FIG. 18K is an SEM image of a pristine MoS$_2$ domain after 100 minutes of thermal annealing in air, and depicts the formation of nanopores smaller than 50 nm in diameter on a pristine MoS$_2$ domain after 100 min of thermal annealing in air. These pores formed in a lower density than that of O$_2$ plasma etched pores are expected to grow via the preferential oxidation of defect sites on the basal plane of MoS$_2$ and more severely around the domain edges and the present cracks.

The understanding of the gradual morphology changes induced by thermal annealing gives valuable insight for the optimization of porosity, which is essential for developing porosity-dependent applications such as nanoporous filtration and edge-site-specific applications including sensing and electrocatalysis.

Figure 19A:
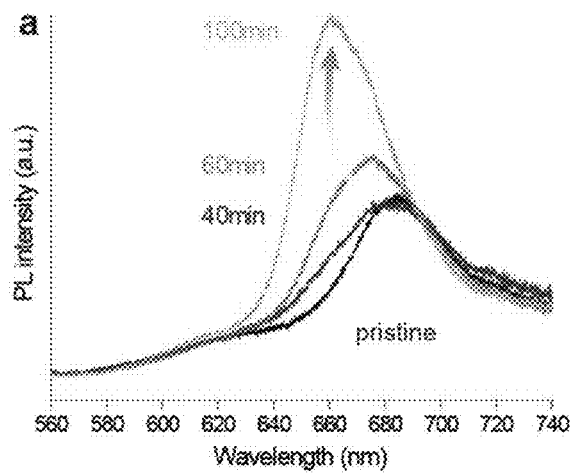
FIG. 19A is a plot of normalized photoluminescence spectra of pristine $MoS_2$ domains upon thermal annealing, according to one example.

The visual changes of the domain morphology corroborate the optical property changes measured by PL and Raman spectroscopy on the pristine and nanoporous MoS$_2$, as shown in FIGS. 19A-19F. Optical properties of MoS$_2$ samples are first measured by PL spectroscopy on selected spots of approximately 1 µm size within MoS$_2$ domains. FIG. 19A shows a plot of normalized photoluminescence (PL) spectra of pristine MoS$_2$ domains upon thermal annealing, and shows that the pristine MoS$_2$ domains before thermal annealing exhibit PL spectra with a peak at 683 nm upon excitation at 514.5 nm. As thermally annealed at 300° C., the PL increases and the peaks blue-shift to 680 nm after 40 min, 675 nm after 60 min, and 660 nm after 100 min of heating. Prior work on block copolymer (BCP)-assisted nano-patterned MoS$_2$ domains showed that increasing edge density causes PL quenching, which is different than the observations in this example. This is due to the differences in edge density formation, where nanodots, nanorods, and nanomeshes in the prior work are not subjected to oxidation at high temperature and were shown by ADF-STEM to have non-reconstructed edges.

Figure 19B:
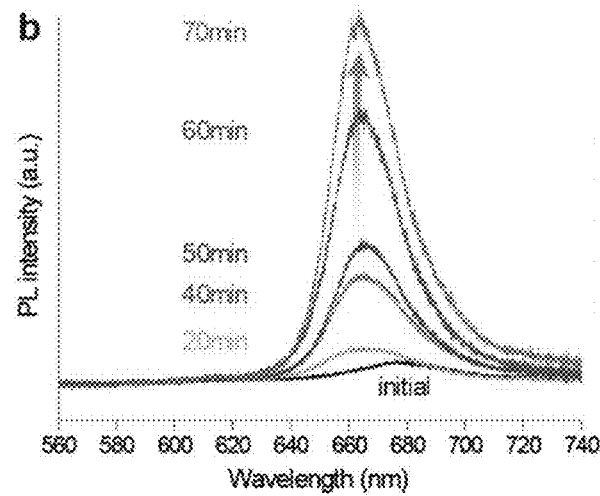
FIG. 19B is a plot of normalized PL spectra of nanoporous $MoS_2$ domains upon thermal annealing up to 70 min, according to one example.
Figure 19C:
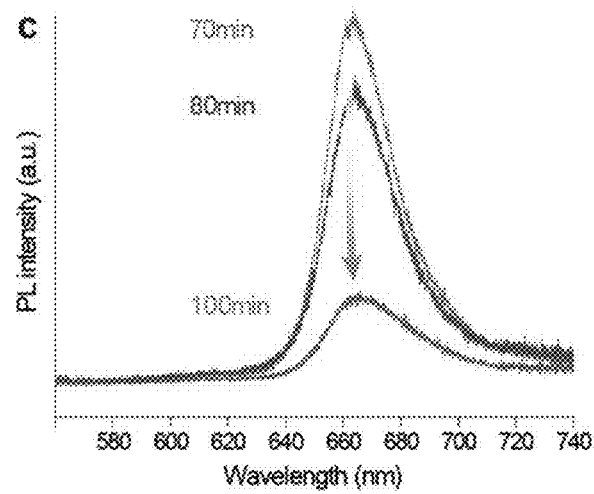
FIG. 19C is a plot of normalized PL spectra of the nanoporous $MoS_2$ domains of the example of FIG. 19B upon continued thermal annealing.

As shown in FIGS. 19B-19C, more remarkable PL increase and blue-shift are observed in the case of the nanoporous MoS$_2$ sample. Specifically, FIG. 19B shows the normalized PL spectra of nanoporous MoS$_2$ domains upon thermal annealing up to 70 min, and FIG. 19C shows normalized PL spectra of nanoporous MoS$_2$ domains upon continued thermal annealing. The O$_2$-plasma etched domains exhibit PL spectra with a peak at 677 nm which blue-shifts to 664 nm after 20 min of thermal annealing at 300° C. After the peak shift, the PL intensity increases as the domains are heated up to 70 min, then further annealing results in the quenching of PL due to severe degradation of the material. The PL change seen in the nanoporous MoS$_2$ sample follows the trend of edge/area ratio as determined by analyzing SEM images.

It has been reported that laser induced chemisorbed oxidation of CVD-grown pristine MoS$_2$ causes PL increase due to the reduction in n-doping followed by PL decrease after continued oxidation, and that heating exfoliated MoS$_2$ in air also causes rapid PL enhancements. Another report illustrates that defect areas or cracks on MoS$_2$ layers exhibit a huge PL enhancement upon thermal annealing compared to pristine area due to heavy p-doping and less non-radiative recombination around the defective sites. A similar effect is seen in the nanoporous MoS$_2$ samples shown in FIG. 19. The NPSi mask etched sample has more rapid PL increase compared to the pristine MoS$_2$, which is associated with the higher edge density and defectiveness in the nanoporous domains. For the MoS$_2$ sample that is not etched, only a slight PL increase is observed within the same time frame of high temperature heating.

Decoupling the contributions of exciton and trion emission to the PL spectra is performed by multiple peak fitting in order to explain the overall blue-shift and PL changes as a function of thermal annealing time. For pristine MoS$_2$, which was not etched but transferred multiple times during the nanopore fabrication process on the same substrate (FIG. 17A), the PL mostly consists of strong trion emission at about 1.83 eV, and the continued thermal annealing induces exciton emission at about 1.87 eV. After 100 min annealing, the exciton/trion ratio was calculated to be 0.77. The nanoporous MoS$_2$ exhibits similar behavior, as the exciton contribution increases and dominates after thermal annealing. The trion emission observed at about 1.83 eV and exciton at about 1.87 eV both grow rapidly following thermal oxidation, and the exciton/trion ratio increases from 0.53 after 20 min to 1.07 after 50 min, 1.19 after 60 min, 1.32 after 70 min, and 1.43 after 80 min annealing. The exciton/trion ratio then drops to 0.77 after 100 min thermal treatment. This analysis indicates that both nanoporous and non-porous samples are heavily n-doped before thermal annealing due to the PMMA transfer and O$_2$ plasma etching process, as revealed by the initially dominating trion contribution. Both samples have a similar degree of surface residue, and the comparison of the PL from both the etched and protected areas before the high temperature treatments shows similar spectra indicating that the doping and defect densities are similar in both cases.

Figure 19D:
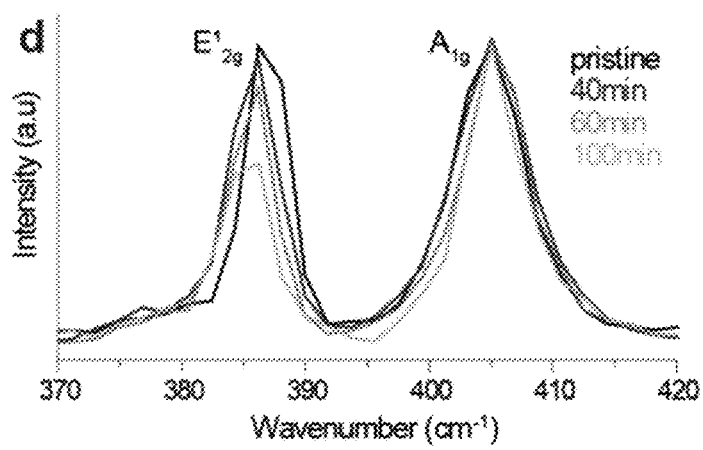
FIG. 19D is a plot of normalized Raman spectra of pristine $MoS_2$ domains upon thermal annealing, according to one example.
Figure 19E:
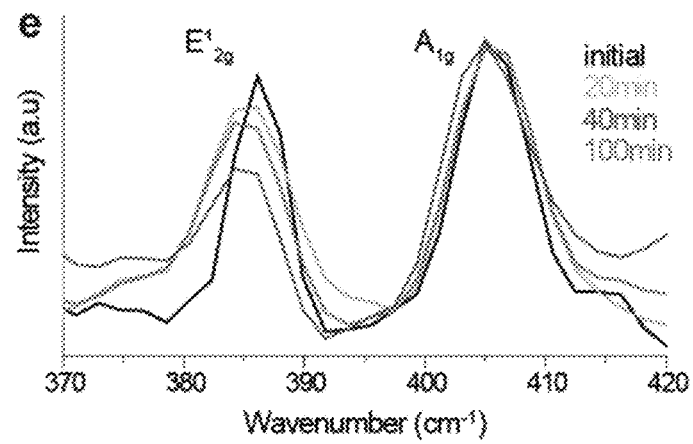
FIG. 19E is a plot of normalized Raman spectra of nanoporous $MoS_2$ domains upon thermal annealing, according to one example.
Figure 19F:
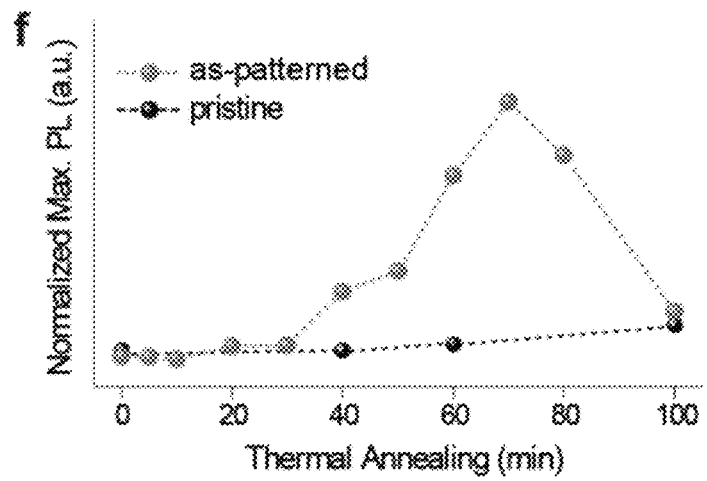
FIG. 19F is a plot of relative maximum PL intensity change as a function of annealing time for nano-patterned and pristine $MoS_2$ domains, according to one example.

As shown in FIGS. 19D-19E, Raman spectroscopy of both samples exhibit an unchanging A$_{1g}$ mode and decreasing E$^1_{2g}$ mode with thermally annealing. FIG. 19D shows normalized Raman spectra of pristine MoS$_2$ domains upon thermal annealing, and FIG. 19E shows normalized Raman spectra of nanoporous MoS$_2$ domains upon thermal annealing. The increasing A$_{1g}$/E$^1_{2g}$ ratio indicates doping level changes occurring to the monolayer MoS$_2$ flakes upon thermal annealing, consistent with the PL spectra changes. The negligible softening of the E$^1_{2g}$ mode suggests insignificant changes in strain within the MoS$_2$ monolayers. Analysis of the time dependence of the heating process shows an initial stage where minimal PL increase is observed, which is likely due to a cleaning of surface residue, then a rapid onset of PL increase at 30-40 min (porous sample). The time scale of the rapid onset of PL is similar to prior studies on exfoliated MoS$_2$ materials, where approximately 25 min at 300° C. causes the PL maxima to be reached, followed by a rapid PL quench during the next 25 min. The PL increase of pristine sample is much slower than that of nanoporous sample, which is associated with the larger surface area of pristine MoS$_2$ covered with amorphous carbon protecting layers and with the less available edge sites that are prone to oxidation process. The PL spectra were normalized to the Raman A$_{1g}$ peak, which normalizes the impact of different sample areas and materials quantity. FIG. 19F shows the relative maximum PL intensity change as a function of annealing time for nano-patterned and pristine MoS$_2$ domains.

Figure 20A:
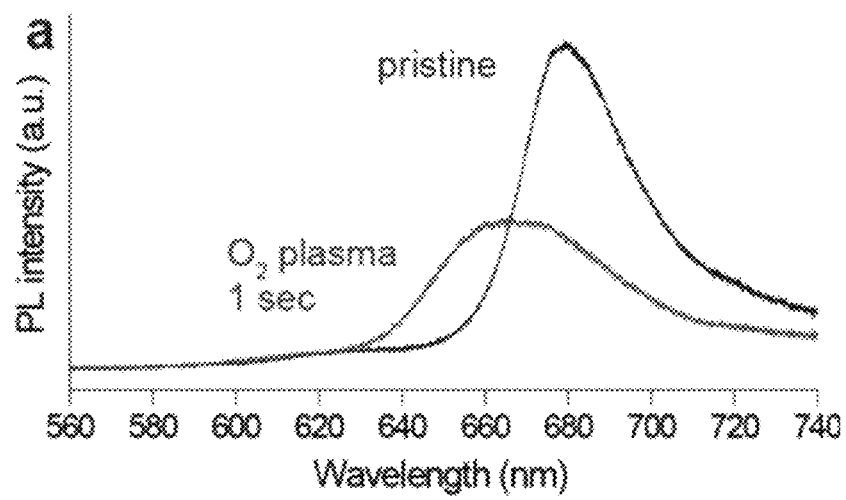
FIG. 20A is a plot of normalized PL spectra of pristine $MoS_2$ domains before and after direct $O_2$ plasma treatment, according to one example.
Figure 20B:
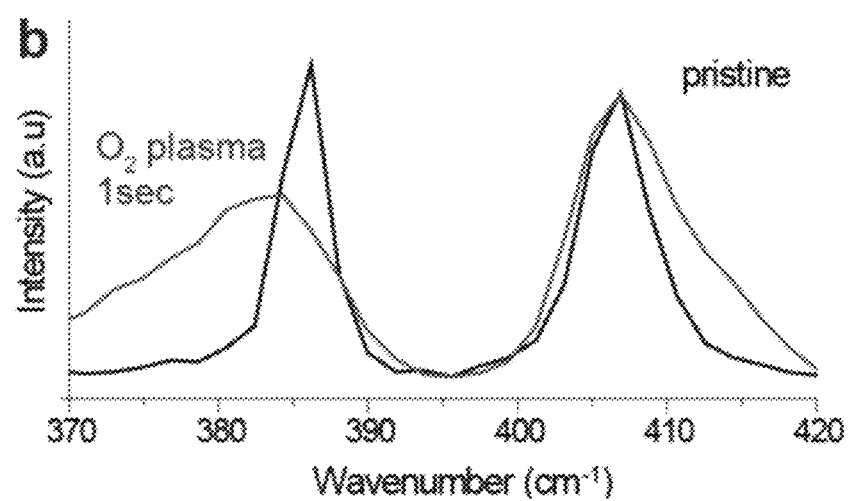
FIG. 20B is a plot of normalized Raman spectra of pristine $MoS_2$ domains before and after direct $O_2$ plasma treatment, according to one example.

The selective etching of monolayers through NPSi masks was confirmed via a control experiment where the CVD-grown pristine MoS$_2$ domains were directly exposed to O$_2$ plasma for short (1 second, 10 second, and 30 second) times. The drastically different result of the direct plasma etching could exclude the possibility of NPSi being a layer which reduces the concentration and penetration of O$_2$ plasma. After 1 second of exposure, the PL decreases and blue-shifts from 678 nm to 663 nm, as shown in FIG. 20A, which shows a normalized PL spectra of pristine MoS$_2$ domains before and after 1 sec direct O$_2$ plasma treatment. This is not observed in the plasma etching process through NPSi masks. Based on the Raman spectra in FIG. 20B, which shows normalized Raman spectra of pristine $MoS_2$ domains before and after 1 sec direct $O_2$ plasma treatment, the impact of p-doping on pristine $MoS_2$ upon the short plasma treatment can be monitored. Any treatment longer than 1 sec destroys the materials, resulting in the absence of PL or Raman signal from the samples.

Figure 20C:
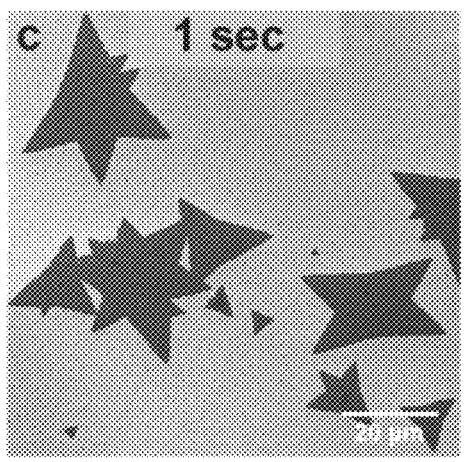
FIG. 20C shows an SEM image of pristine $MoS_2$ domains after 1 second of direct $O_2$ plasma treatment, according to one example.
Figure 20D:
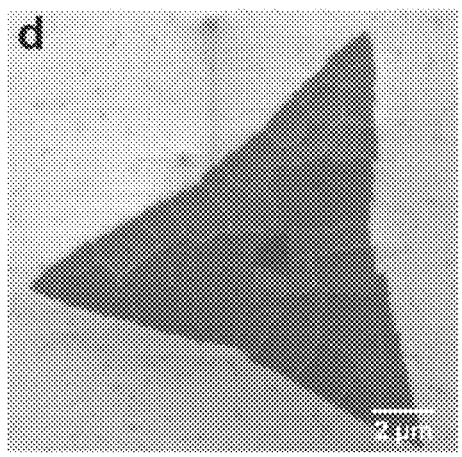
FIG. 20D shows an SEM image of the example of FIG. 20C at a higher magnification.
Figure 20E:
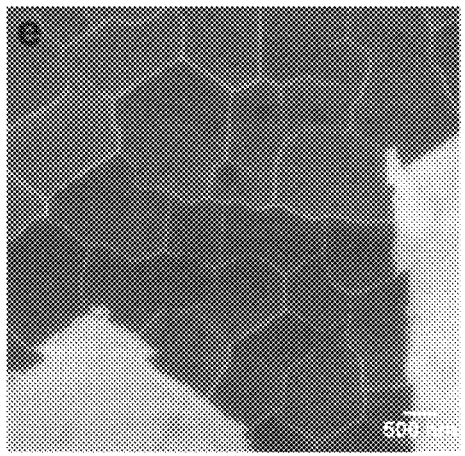
FIG. 20E shows an SEM image of the example of FIG. 20D at a higher magnification.
Figure 20F:
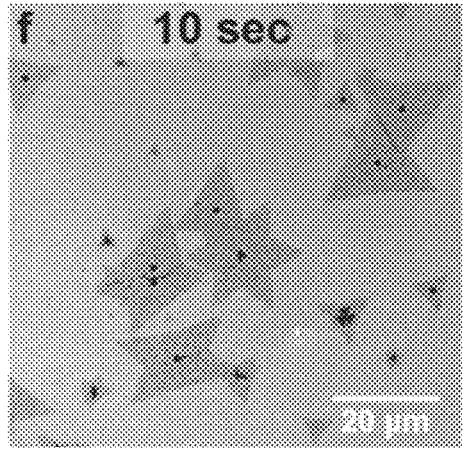
FIG. 20F shows an SEM images of pristine $MoS_2$ domains after 10 seconds of direct $O_2$ plasma treatment, according to one example.
Figure 20G:
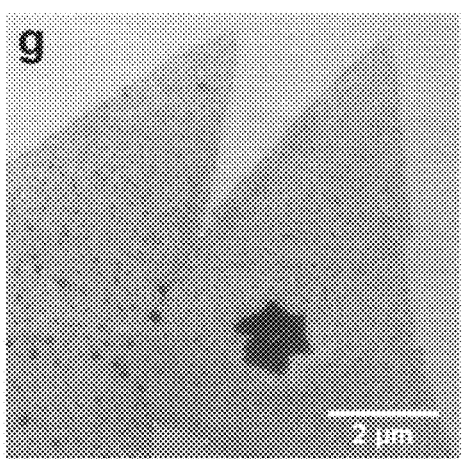
FIG. 20G shows an SEM image of the example of FIG. 20F at a higher magnification.
Figure 20H:
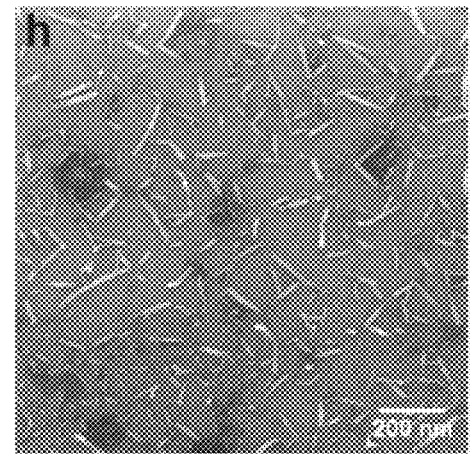
FIG. 20H shows an SEM image of the example of FIG. 20G at a higher magnification.

As shown in FIGS. 20C-20H, the morphology changes upon the direct plasma treatment are investigated by SEM. FIGS. 20C-20E show SEM images of pristine $MoS_2$ domains after 1 second of direct $O_2$ plasma treatment with varied magnification. After 1 second of exposure to $O_2$ plasma, the domains exhibit homogeneous cracking across the materials without significant changes of nanoscale morphology such as pore formation or defect enlargement. FIGS. 20F-20H show SEM images of pristine $MoS_2$ domains after 10 seconds of direct $O_2$ plasma treatment with varied magnification. The longer treatment generates domains with lighter contrast and bright needle-shaped materials of tens and hundreds of nm in length. The conversion of $MoS_2$ to the oxidation product is responsible for the annihilated PL and Raman signals. This control experiment demonstrates the unique capability of NPSi masks in the selective formation of nanopores on 2D materials that exhibit bright PL even after the nano-patterning and severe etching.

In the above-described example, NPSi masks were fabricated from 50 nm thick (100) crystalline Si films (SiMPore Inc.) and 15 μm thick (100) crystalline Si films, initially 300 μm thick (100) DSP wafers, resisitivity 1-10 Ω·cm, p-type (boron doped), which were thinned via potassium hydroxide in 30 wt. % aqueous solution at 70° C. Both types of substrate were cleaned in acetone, isopropanol, and DI water, and dried under nitrogen prior to catalyst deposition. The hemispherical nanocatalysts were deposited via RF magnetron sputtering using an ATC 6-target sputtering tool (AJA International). In all experiments, Ag was deposited to a nominal thickness of 1 Å at an RF power of 30 W Immediately after catalyst deposition, samples were submerged in MACE solution containing 5.33 M HF and 0.12 M $H_2O_2$ for 1 minute in the case of the 50 nm thick masks and 24 hours for the 15 μm thick masks. Masks were rinsed extensively with DI water upon completion of the etching and dried under nitrogen.

On the substrate with CVD-grown monolayer $MoS_2$, PMMA A7 solution was spin-coated (500 rpm for 5 seconds, 2000 rpm for 10 seconds, and 4500 rpm for 45 seconds). The sample was annealed at 180° C. for 90 seconds to evaporate anisole, and the $Si/SiO_2$ substrate was removed by dissolving in 1 M KOH solution overnight. The PMMA layer containing $MoS_2$ domains was then rinsed with DI water and transferred to NPSi substrate. The sample was dried at 150° C. for 10 minutes and turned upside-down to be selectively exposed to oxygen plasma. The oxygen plasma etching of $MoS_2$ through NPSi mask was conducted by using Harrick Scientific PDC-32G Plasma Cleaner (18 W, oxygen flow rate of 0.6 SCFH (standard cubic feet per hour)). The porous $MoS_2$ formed on PMMA layer was then transferred to a new $Si/SiO_2$ substrate via KOH etching of NPSi as described for the initial transfer process.

PL and Raman spectra were acquired using a Horiba LabRAM 800 HR spectrometer equipped with an $Ar^+$ (514.5 nm) excitation source and a Peltier-cooled CCD detector. The laser was focused on the sample with a 400 nm confocal hole using the 100× objective under reflected illumination. The laser spot on the sample was about 1 μm in diameter and had a power of about 4 mW at the sample surface. Scanning electron microscopy was performed using Zeiss Ultra Plus FESEM.

Example 4—Nanofiltration Membranes

In another set of illustrative examples, inorganic nanofiltration (NF) membranes materials formed nanoporous silicon (NPSi) are investigated. The NPSi membranes are capable of performing separations on the sub-1 nm molecular scale, while enduring a variety of chemically and thermally harsh environments. The membrane, is produced in three steps, facilitating economically feasible manufacturing at scale. This example presents an in-depth description of the fabrication process, characterization of the resulting membrane material, and evaluation of filtration performance for four NPSi membranes using industrially relevant feed streams, including a demonstration of zero liquid discharge (ZLD) performance Taken together, these results demonstrate a NF membrane with superior scalability, cost and rejection performance relative to ceramic membranes at the sub-1 nm scale.

Figure 21A:
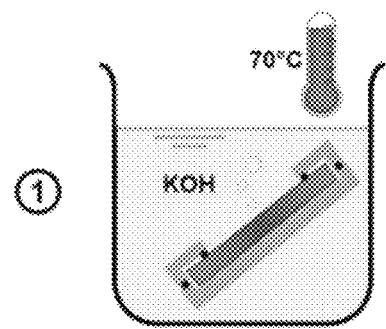
FIG. 21A is a schematic representation of a method for producing an NPSi membrane, according to one example.
Figure 21A:
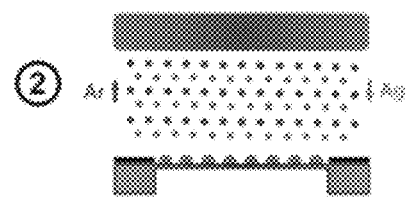
Figure 21A:
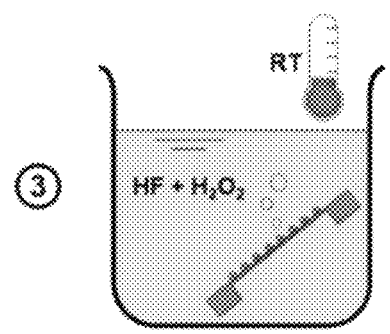
Figure 21B:
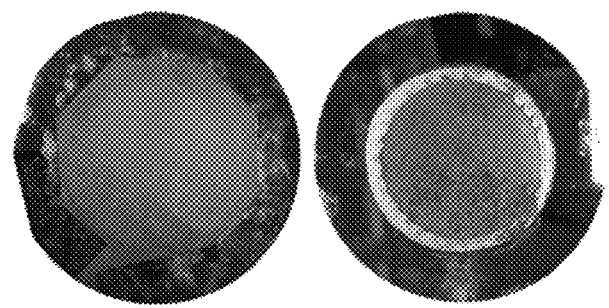
FIG. 21B shows photographs of front and back surfaces of a pristine membrane, according to one example.
Figure 21C:
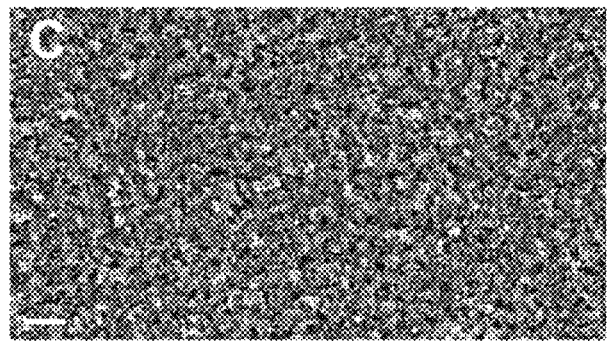
FIG. 21C shows an SEM of an initial etch surface, according to one example.
Figure 21D:
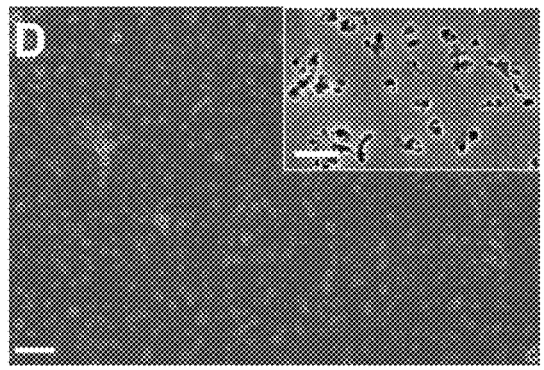
FIG. 21D shows an SEM image of a surface opposite the initial etch surface shown in FIG. 21C.
Figure 21E:
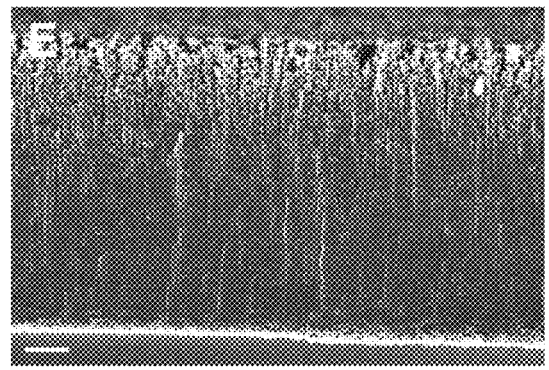
FIG. 21E is a cross-sectional SEM image of a membrane, according to one example.
Figure 21F:
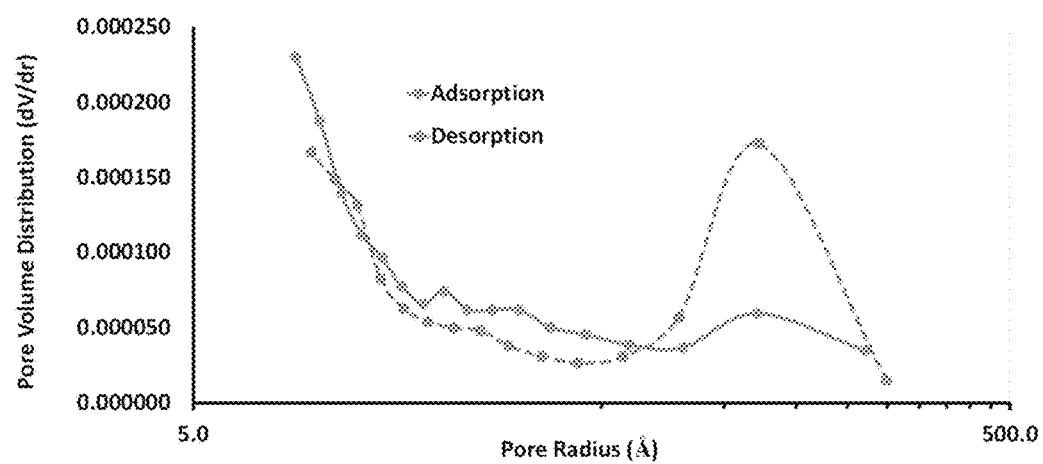
FIG. 21F is a plot of BJH pore size distribution calculated from BET nitrogen adsorption and desorption experiments, according to one example.

The NPSi membranes are produced via a three step process shown schematically in FIG. 21A. The process includes chemical thinning of commercial Si, deposition of metal catalyst, and top-down chemical etching of ultrahigh aspect ratio nanopores through the thinned Si layer. For all samples, a 5 cm crystalline Si wafer with (100) orientation is selectively exposed to a hot potassium hydroxide (KOH) bath for multiple hours to produce a thin Si foil of 30 mm diameter across the center of the wafer. A nominal sub-nm layer of silver is then deposited by sputtering on the un-etched reverse side of the wafer over very short exposure times at low power. Finally, wafers are inserted in a chemical bath containing hydrogen peroxide ($H_2O_2$) and hydrofluoric acid (HF), facilitating selective oxidation and removal of Si at the Ag—Si interface through the metal-assisted chemical etching (MACE) process. The result is a monolithic Si membrane with an outer handling layer the thickness of the initial wafer. Specific fabrication conditions for each of the four membranes discussed in this example are shown in Table 1 below. The planar surface of the wafer from which MACE originates exhibits a beige coloring due to its roughness on the microscale, while the opposite surface appears matte grey due to nanoscale roughness from the KOH etching and penetration of the surface by Ag catalyst particles during MACE as shown in FIGS. 21B-21D. Specifically, FIG. 21B shows photographs of front and back surfaces of pristine membrane, FIG. 21C shows an SEM of the initial etch surface, and FIG. 21D shows an SEM image of a surface opposite the initial etch surface. Cross-sectional imaging, e.g., as shown in the SEM image of the membrane cross section shown in FIG. 21E, reveals decreasing porosity with increasing depth through the Si, leading to an asymmetric structure. All scale bars are 2 μm, and the scale bar for the inset of FIG. 21D is 200 nm. Fabrication is carried out in such a way that the smoother side of the membrane is exposed to the feed stream in the filtration process, as decreased surface roughness is understood to be one approach for minimizing membrane fouling. The BJH pore size distribution calculated from BET nitrogen adsorption and desorption experiments is shown in FIG. 21F, and is discussed throughout this example as it relates to filtration performance

TABLE 1

| | Sputter Time (s) | Sputter Power (W) | Etch Time (mins) | Piranha Treatment | Thickness (microns) |
|---|---|---|---|---|---|
| M1 | 2 | 30 | 150 | No | 34.3 |
| M2 | 2 | 30 | 90 | Yes | Not Measured |
| M3 | 4 | 15 | 90 | Yes | Not Measured |
| M4 | 2 | 45 | 90 | Yes | Not Measured |

Figure 22A:
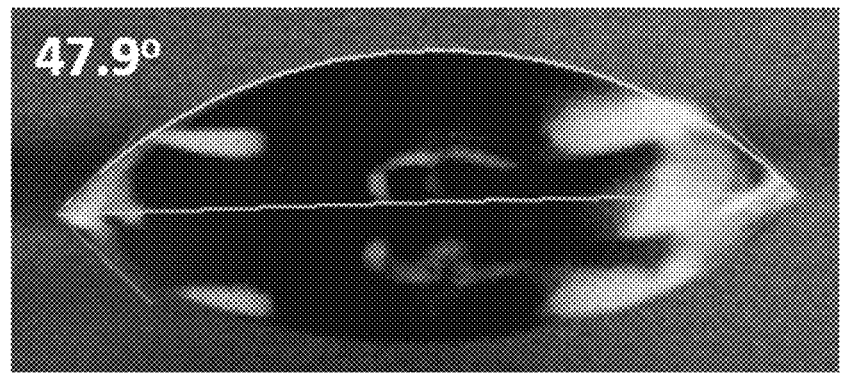
FIG. 22A is an image of a static water contact angle on a pristine membrane, according to one example.
Figure 22B:
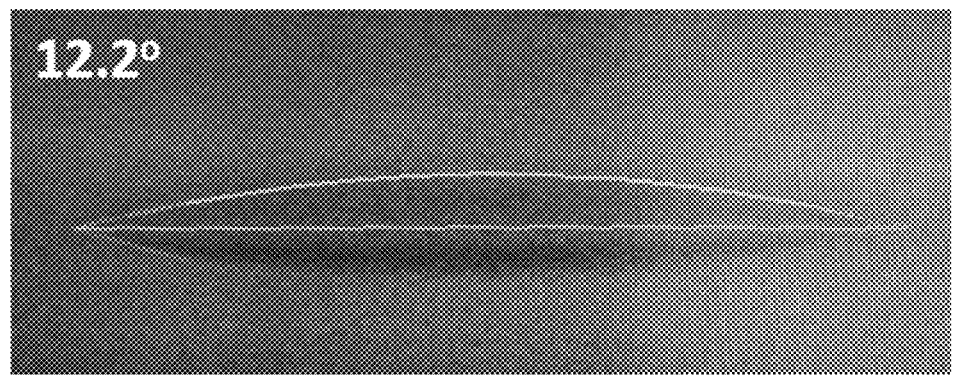
FIG. 22B is an image of a static water contact angle on a membrane following piranha treatment, according to one example.

NPSi membranes were characterized for thickness, surface hydrophilicity, and pore size distribution prior to filtration testing. The static surface contact angle for pristine membranes is observed to be 47.9°±2.1°. In some samples, membranes were treated using piranha solution immediately following MACE in order to aggressively oxidize their surfaces. Following this treatment, the same membrane sample exhibits a decreased contact angle of 12.2°±1.7°. Increased hydrophilicity is generally understood to be an important metric for reducing membrane fouling rate. FIGS. 22A and 22B show images of static water contact angles on a pristine membrane and a membrane following piranha treatment, respectively.

For membranes produced via the standard approach, nitrogen adsorption measured a Brunauer-Emmett-Teller (BET) surface area of 6.20 m$^2$/g and a Barrett-Joyner-Halenda (BJH) average pore size of 18.96 nm, calculated using the adsorption isotherm. The pore size distribution shows a well-defined peak around a pore diameter of 24 nm, with a more complex profile for pore diameters below 10 nm, including a monotonic increase in the number of pores with decreasing pore size below 3.6 nm. The most likely explanation for this observation is the presence of multiple types of porous morphologies within the membrane layer, the first being the larger porosity found within a few microns of the initial etch surface, and the second being deep dead-end and through pores within the membrane bulk. The latter structures are most often etched only by a single Ag catalyst particle, and are less prone to pore-enlargening given their high aspect ratio and depth within the bulk film. Therefore these pores are expected to have a significantly smaller diameter, which is indicated by the presence of a large number of pores below 3.6 nm as shown in FIG. 21F.

The filtration of 5 nm diameter gold nanoparticles (AuNPs) suspended in aqueous solutions was studied in a dead-end membrane configuration with no stirring to characterize the rejection and permeability behavior of the NPSi membranes over time. A pristine membrane (M1) was inserted into the cell, then fully submerged in 5 mL IPA at a pressure of 10.34 bar (150 psi) in order to maximize pore wetting. 100 mL DI water was then added to the cell and placed under 10.34 bar to assess pure water permeability.

Figure 23:
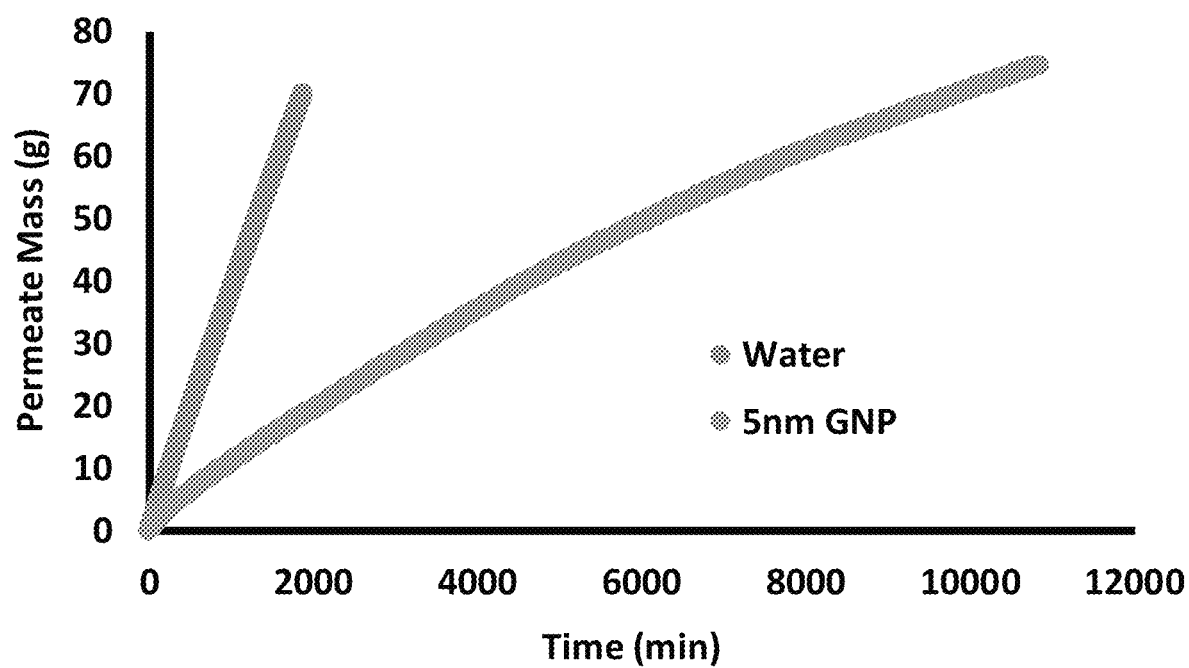
FIG. 23 is a plot of permeate mass versus time during pure water and 5 nm AuNP rejection tests, according to one example.
Figure 24A:
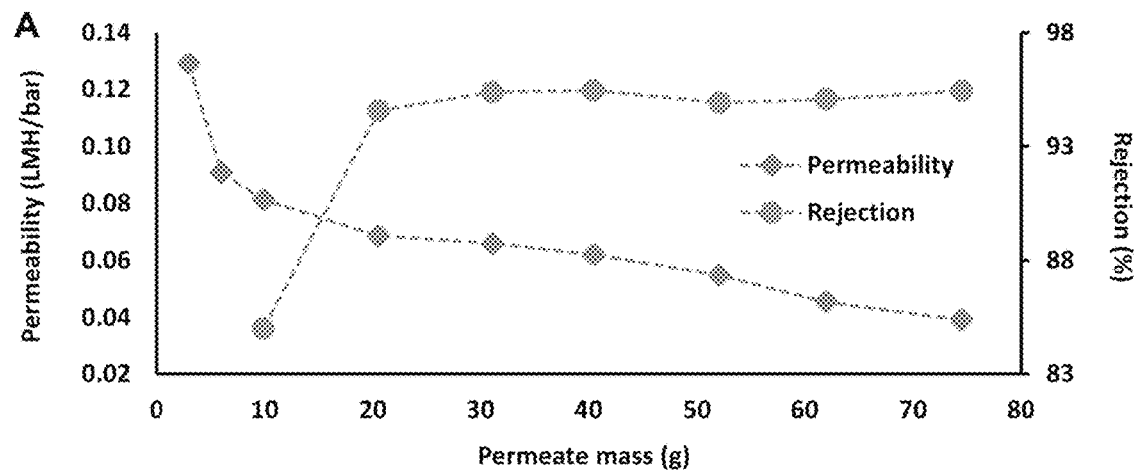
FIG. 24A is a plot of permeability and rejection during a 5 nm AuNP filtration experiment, according to one example.
Figure 24B:
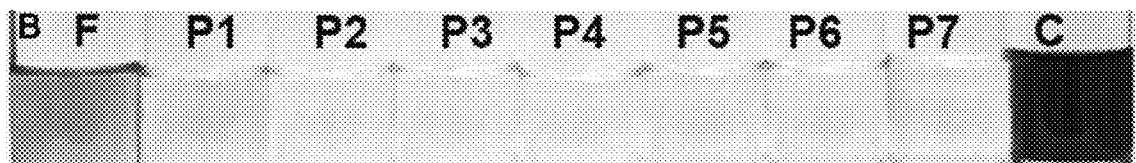
FIG. 24B shows photographs of aliquots collected over the course of the experiment of FIG. 24A.

Following an initial stabilization period, permeability was observed to be constant at 0.31 LMH/bar over a period of 30 hours, as shown in FIG. 23, which shows a plot of permeate mass versus time for M1 at a constant pressure during pure water and 5 nm AuNP rejection tests. Without drying the membrane, an aqueous suspension of 5 nm AuNPs was added to the cell to produce a feed concentration of 3.7e13 particles/mL, and pressure was reapplied at 10.34 bar. Constant monitoring of permeability and collection of aliquots for roughly every 10 g of permeate revealed a tradeoff between permeability and rejection, as shown in FIG. 24A, which depicts a plot of permeability and rejection for M1 during a 5 nm AuNP filtration experiment. While permeability decreases from the pure water value to 0.13 LMH/bar within the first three minutes of the experiment and ultimately falls to less than a third of its initial value (FIG. 23), rejection increases from an initial value of 84% and rapidly plateaus above 94%. This is confirmed by the photographs of aliquots collected over the course of the experiment shown in FIG. 24B, thus demonstrating rejection of the 5 nm Au particles, and the concentrated retentate solution.

Figure 24C:
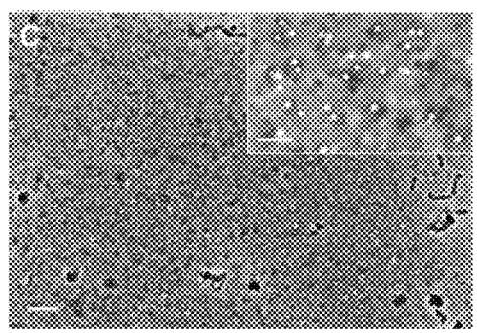
FIG. 24C shows an SEM image of the surface of the membrane from the example of FIG. 24A following the test.
Figure 24D:
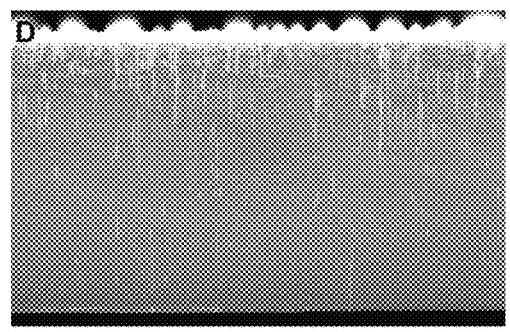
FIG. 24D shows a cross-sectional SEM image of the membrane from the example of FIG. 24A.

These findings indicate that the pristine membrane is capable of rejecting a significant fraction of the 5 nm particles, where rejection can be attributed primarily to steric size exclusion effects, as evidenced by the BJH pore size distribution. As filtration continues, flux decline in conjunction with improving rejection indicates blockage of pores either at pore entrance or within the membrane bulk. SEM imaging of the membrane surface following the experiment indeed reveals minor adsorption of AuNPs to the membrane surface (FIG. 24C), which likely occur preferentially at areas where higher flux of solute into pore openings is present. Specifically, FIG. 24C is an SEM image of the surface of M1 following the test. Comparison of the initial feed and final retentate concentrations reveals a particle concentration factor of 3.83, while the volume concentration factor neglecting evaporation is 3.72. Though the permeate collection vial was isolated from the surrounding environment, a lack of air-tight seal would have allowed for evaporation to occur, meaning that the actual volume concentration factor is greater than 3.72. Nevertheless, the closely corresponding particle and volume concentration factors indicates that the Au particles did not accumulate to a significant extent on the membrane surface or within the membrane bulk, despite the concentration polarization arising due to lack of stirring during filtration. SEM cross-sectional imaging shown in FIG. 24D reveals a thickness of 34.3 μm and a low percentage of pores penetrating from the feed to the permeate side of the active layer. The low porosity on the feed stream side of the membrane is unsurprising, considering the known propensity of MACE catalyst particles to etch laterally along the <110> directions in the Si lattice, with a similar frequency to the <100> direction normal to the Si surface. For a catalyst to produce a pore passing directly through the Si film, the pore aspect ratio would need to exceed 9500:1 in the case of pore diameters below 3.6 nm, translating to a high likelihood that a directional change in etching would occur. The result is an estimated surface porosity less than 1% on the feed stream side of the membrane, which is hypothesized to be a primary cause of the generally observed low permeability measurements.

Figure 25A:
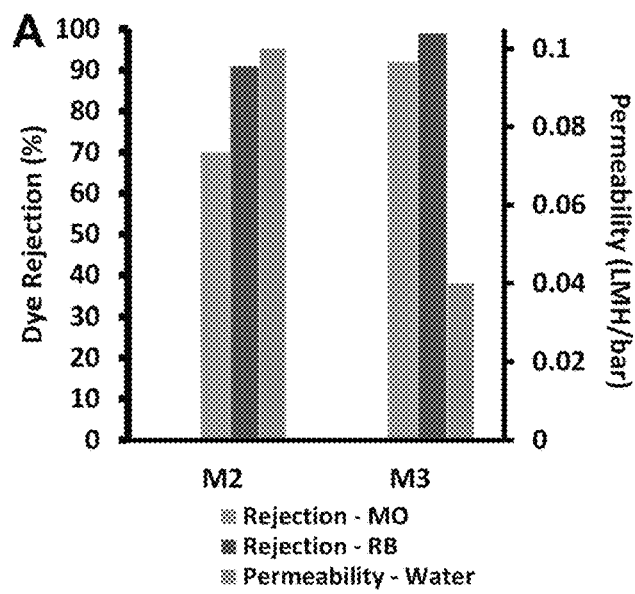
FIG. 25A shows a plot of pure water permeability and rejection of two molecular dyes with two filtration membranes, according to one example.
Figure 25B:
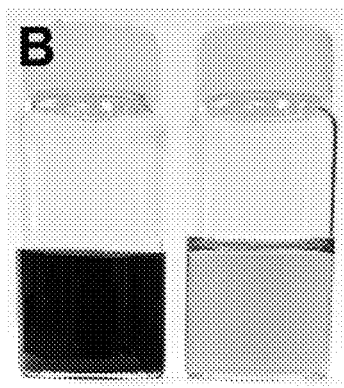
FIG. 25B shows photographs of the feed (left) and permeate (right) samples for the filtration of one molecular dye using one filtration membrane from the example of FIG. 25A.
Figure 25C:
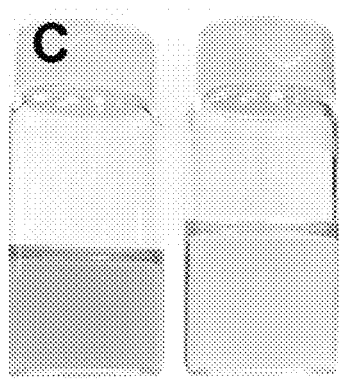
FIG. 25C shows photographs of the feed (left) and permeate (right) samples for the filtration of a second molecular dye using the same filtration membrane as in FIG. 25B.
Figure 25D:
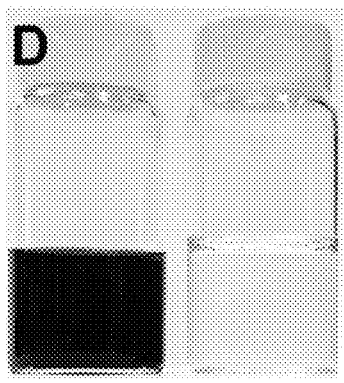
FIG. 25D shows photographs of the feed (left) and permeate (right) samples for the filtration of the same molecular dye as in FIG. 25B using a second filtration membrane from the example of FIG. 25A.
Figure 25E:
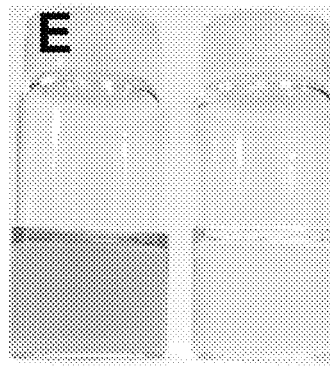
FIG. 25E shows photographs of the feed (left) and permeate (right) samples for the filtration of the same molecular dye as in FIG. 25C using the same filtration membrane as in FIG. 25D.

To probe the ability of NPSi membranes to reject charged solvated species smaller than 5 nm AuNPs, filtration experiments were conducted using feed streams consisting of aqueous molecular dye solutions of Reactive Black (RB) and Methyl Orange (MO), both negatively charged dyes with MW of 992 g/mol and 327 g/mol respectively. Such dye species not only serve as effective analogs for many industrially important small charged molecules, but are also directly relevant to the textile industry, a $870B market which is increasingly in need of utilizing nanofiltration for removal of dyes from effluent. Dye experiments were performed in a similar manner to the AuNP experiments discussed above, with pure water, and then subsequently 10$^{-4}$ M dye solutions, passed through the membrane in a dead-end configuration under 10.34 bar applied pressure. Membranes were not pre-wetted with IPA in this case. Two pristine membranes, M2 and M3, were tested, with each membrane being flushed extensively with pure water between dye tests. Pure water permeability is shown for both membranes alongside RB and MO rejection in FIGS. 25A-25E. In particular, FIG. 25A shows a plot of pure water permeability and rejection of molecular dyes MO and RB for M2 and M3, and FIGS. 25B-25D show photographs of the feed (left) and permeate (right) samples for the filtration of RB (FIGS. 25B and 25D) and MO (FIGS. 25C and 25E) with M2 (FIGS. 25B and 25C) and M3 (FIGS. 25D and 25E).

Produced using an identical process to M1, but with a shorter etching time, M2 exhibited a lower initial pure water permeability of 0.11 LMH/bar, likely owing to the lack of pore wetting with IPA, as well as general variability in the pore etching process. Following the permeability test, M2 rejected 91% RB and 70% MO respectively (FIGS. 25A-25C), with extensive flushing with pure water in between each test. Minimal permeability drop was observed over the course of each test. With the goal of obtaining a tighter MWCO, M3 was produced using slightly modified catalyst deposition parameters (sputter time of 4 seconds and power of 15 W versus 2 seconds and 30 W), with the aim of decreasing the average catalyst and subsequent pore size. This membrane exhibited a decreased pure water permeability of 0.04 LMH/bar, and an improved rejection of both dye species to 99% and 92% for RB and MO respectively (FIGS. 25A, 25D, and 25E). This result demonstrates the ability to reject molecules with a size of 327 g/mol, owing to steric and charge-based interactions.

A crucial property of a filtration membrane is its ability to resist the accumulation of foulants and scalants on its surface, a characteristic understood to be influenced primarily by surface roughness and hydrophilicity. Oil-water separation, an important process in multiple industries including oil & gas and food & beverage, in many cases proves especially difficult for polymeric membranes due to extensive fouling. To evaluate the performance of NPSi membranes with regard to fouling resistance and cleanability in the oil-water separation application, feed solutions of emulsified 30 wt. % hexadecane-in-water were introduced into the dead-end cell, and fed through a pristine sample (M4) at 3.45 bar (50 psi). M4 was produced using identical conditions to the previous three samples, however sputter power was increased to 45 W with the goal of increasing porosity and subsequently permeability. The resulting pure water permeability was 0.67 LMH/bar for the pristine membrane prior to piranha treatment, and with no IPA pre-wetting. The feed hexadecane emulsions were characterized by DLS to reveal an average particle size of 389.4±5.1 nm, with PDI of 0.257±0.003 (FIG. 6K). A series of experiments was performed with approximately 50% volume recovery, proceeding in series from pure water to similar emulsion feed streams, with different cleaning protocols being employed with the goal of regenerating membrane flux after each test. In order, the tests were pure water, emulsion, emulsion following piranha treatment, emulsion following 250° C. thermal treatment, and emulsion following IPA rinse. A final test was conducted in which maximum permeate volume was obtained by leaving the feed emulsion under applied pressure until no further permeate could be extracted, representing ZLD operation.

Figure 26A:
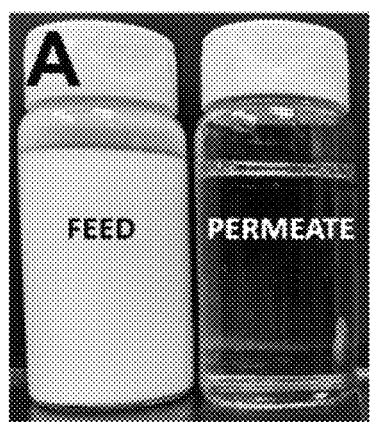
FIG. 26A shows photographs of feed permeate for an oil-water separation test, according to one example.
Figure 26B:
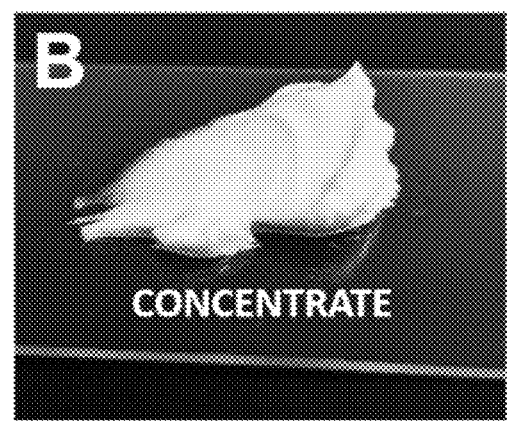
FIG. 26B shows the concentrate from the oil-water separation test of the example of FIG. 26A.
Figure 26C:
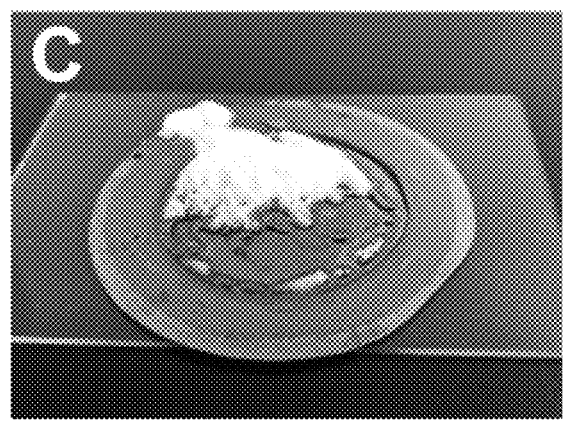
FIG. 26C is a photograph showing hexadecane wicking off the surface of the membrane following the experiment of FIG. 26A.

The series of tests revealed promising oil-water separation performance in conjunction with flux regeneration following hydrocarbon fouling. FIGS. 26A and 26B show photographs of feed, permeate, and concentrate for the oil-water separation test, performed using M4. FIG. 26C is a photograph showing hexadecane wicking off the surface of M4 following the experiment.

Figure 26D:
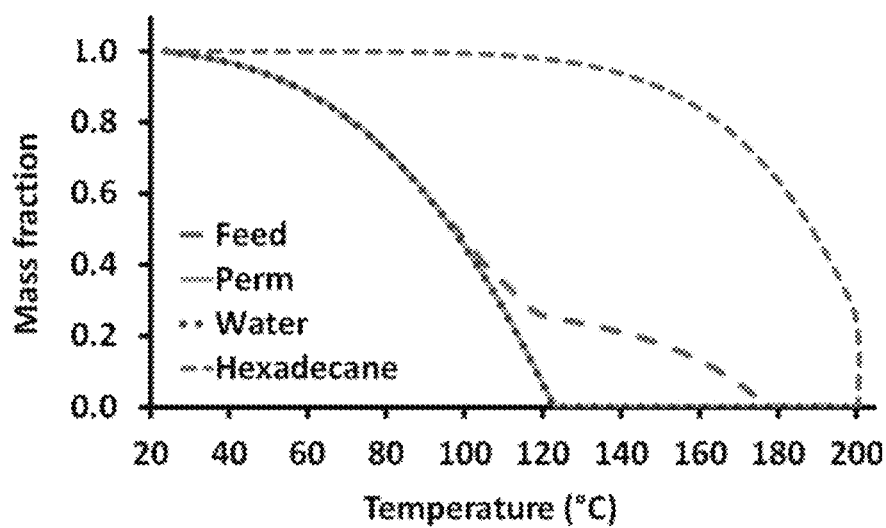
FIG. 26D is a plot showing TGA measurements from th example of FIG. 26A.
Figure 26E:
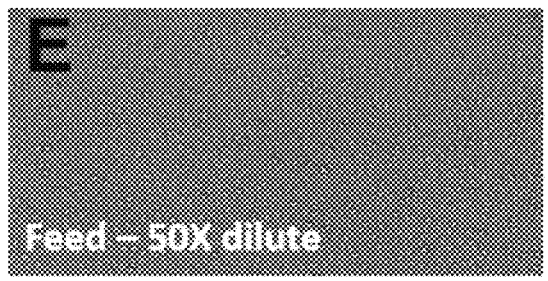
FIG. 26E shows an optical microscopy image of the 50× dilute feed from the example of FIG. 26A.
Figure 26F:
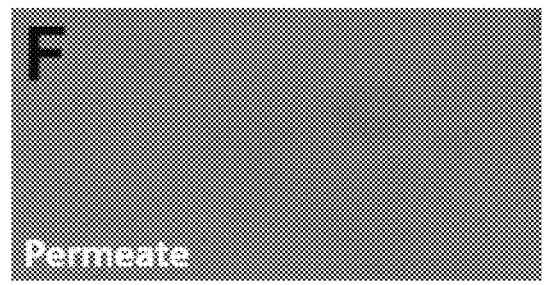
FIG. 26F shows an optical microscopy image of the non-dilute permeate from the example of FIG. 26A.

Thermal gravimetric analysis of all feed and permeate samples demonstrates a similar permeate purity, while permeability in every test is shown to be greater than the initial emulsion test, peaking after piranha treatment, likely due to increased surface hydrophilicity. TGA measurements of pure water and hexadecane, superimposed on the feed and permeate are shown in FIG. 26D. Optical microscopy images of the 50× dilute feed and non-dilute permeate are shown in FIGS. 26E and 26F, respectively.

Figure 26G:
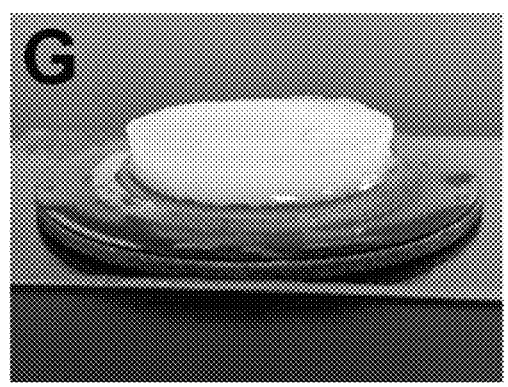
FIG. 26G shows a photograph of solid recovered hexadecane during a ZLD test, according to one example.
Figure 26H:
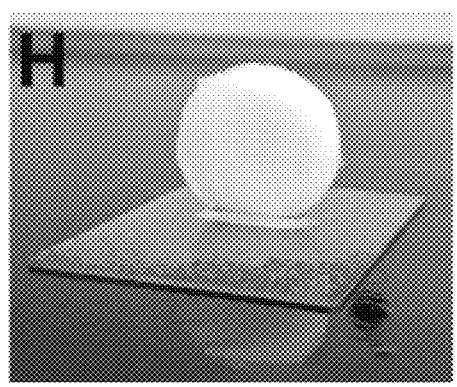
FIG. 26H shows another photograph of solid recovered hexadecane during the ZLD test of the example of FIG. 26G.
Figure 26I:
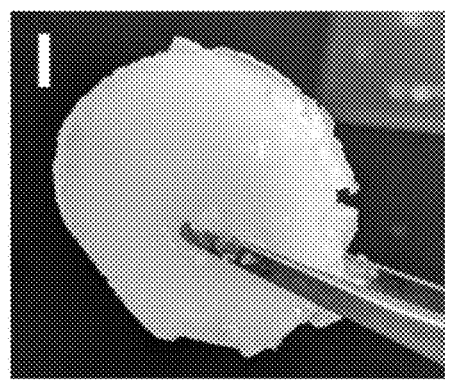
FIG. 26I shows another photograph of solid recovered hexadecane during the ZLD test of the example of FIG. 26G.
Figure 26J:
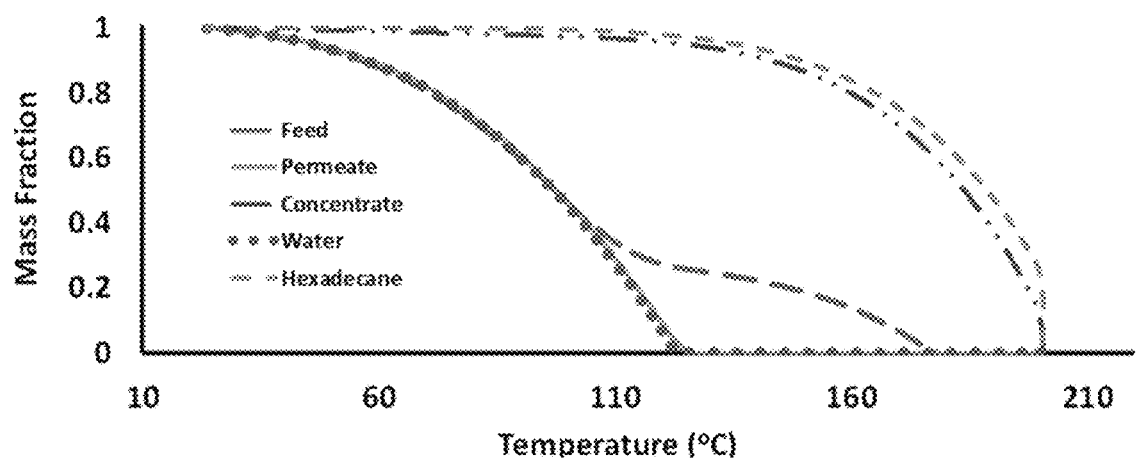
FIG. 26J is a plot o TGA measurements from the ZLD test of the example of FIG. 26G.
Figure 26K:
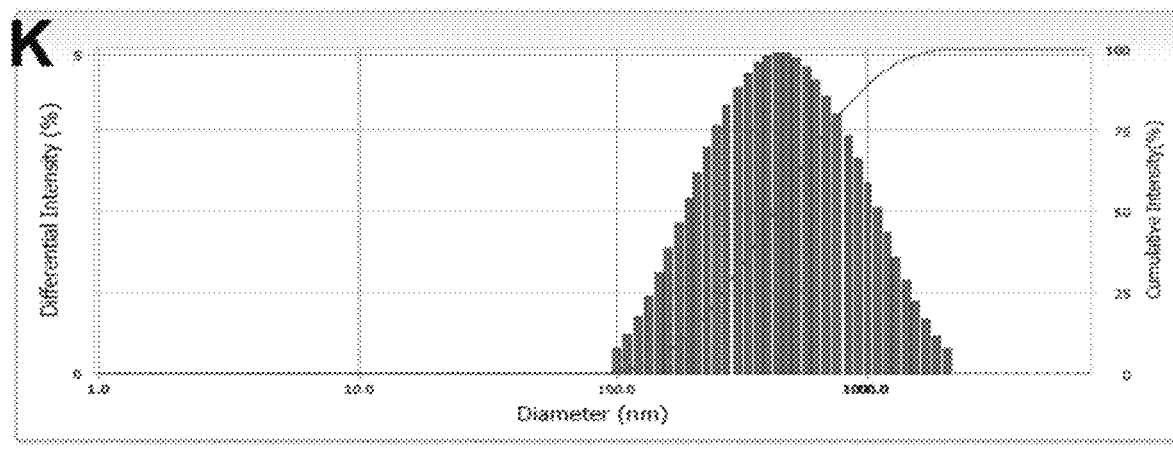
FIG. 26K is a plot showing droplet size distribution for the emulsified hexadecane emulsion feed solution, measured using DLS, from the ZLD test of the example of FIG. 26G.

The final ZLD test was able to obtain 62.9% total mass recovery in the permeate from a feed solution consisting of 30 wt % hexadecane. Assuming pure water permeate, as indicated by TGA, 89.8% mass recovery of water was achieved, with no stirring in a dead-end configuration. Photos of the solid recovered hexadecane during the ZLD test are shown in FIGS. 26G-26I, and TGA measurements of the results from the ZLD test, including feed, permeate, and concentrate, are shown in FIG. 26J, demonstrating that effective separation of the hydrocarbon and water is achieved. Droplet size distribution for the emulsified hexadecane emulsion feed solution, measured using DLS, is shown in FIG. 26K.

Figure 27:
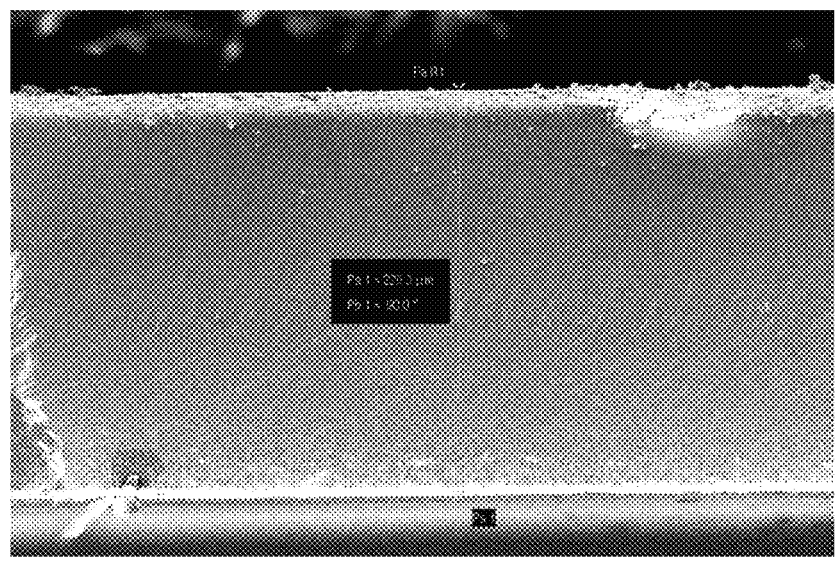
FIG. 27 is a cross-sectional SEM image of a catalyst is deposited directly on opposing sides of a thick Si wafer, according to one example.

Each of the attempted cleaning protocols proved effective at regenerating membrane flux, including simply rinsing with IPA and water, though the membrane was also shown to be extremely chemically and thermally resilient, withstanding piranha solution and Example 5—Thick Membranes Etched from Both Sides In yet another illustrative example, another approach for forming membranes is investigated, which may provide benefits in terms of improved commercial viability. Unlike the examples discussed above, in this example, the silicon is not thinned prior to etching, and a catalyst is deposited directly on opposing sides of a thicker Si wafer (e.g., 200-400 µm thickness), as shown in the cross-sectional SEM image shown in FIG. 27.

Figure 28:
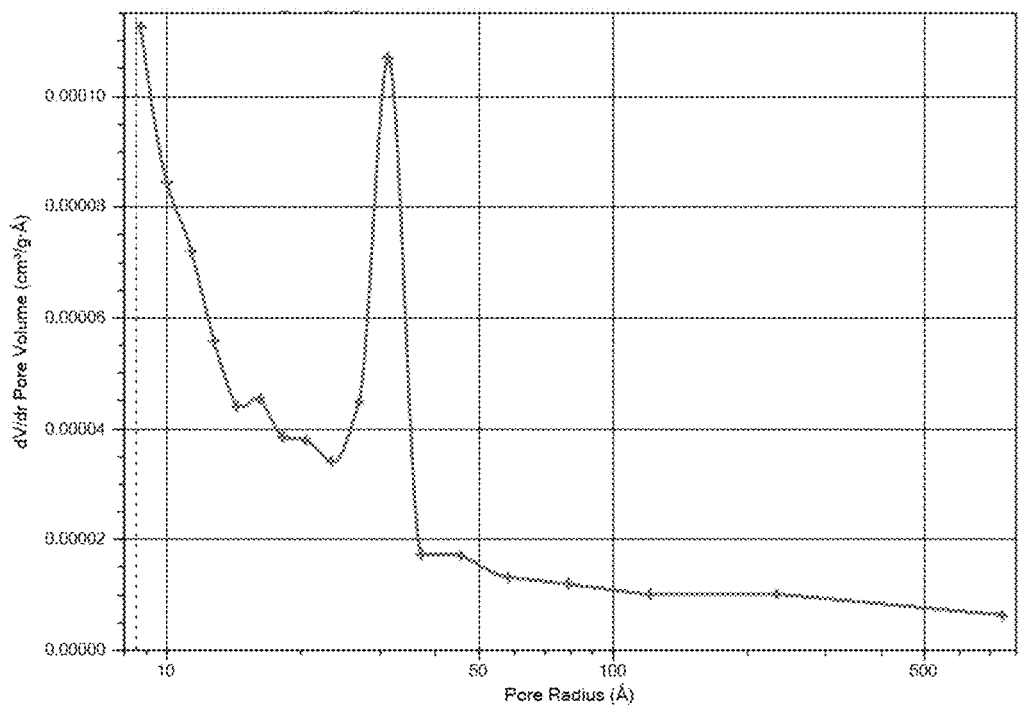
FIG. 28 is a plot of pore size distribution for a 400 μm thick membrane, according to one example.

The catalyst deposition step is the same as in the above examples, (silver, 30 W, 2 seconds), but in this example it is done on each side of the wafer. Additionally, the etching of the pores is performed in an identical chemical solution as the previous examples, but it is carried out for much longer, such as for 24-48 hours, in order to allow for significant etching to take place. Using these methods, the aspect ratios of pores penetrating entirely through the thicker membranes may be extremely high. For instance, FIG. 28 shows a pore size distribution for a 400 µm thick membrane, and demonstrates a significant presence of pores with a diameter of approximately 6 nm. To penetrate the entire thickness of the wafer, these pores would have an aspect ratio greater than 65,000:1.

While several embodiments and examples of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Any terms as used herein related to shape and/or geometric relationship of or between, for example, one or more articles, structures, and/or subcomponents thereof and/or combinations thereof and/or any other tangible or intangible elements not listed above amenable to characterization by such terms, unless otherwise defined or indicated, shall be understood to not require absolute conformance to a mathematical definition of such term, but, rather, shall be understood to indicate conformance to the mathematical definition of such term to the extent possible for the subject matter so characterized as would be understood by one skilled in the art most closely related to such subject matter. Examples of such terms related to shape and/or geometric relationship include, but are not limited to terms descriptive of: shape—such as, round, square, circular/circle, rectangular/rectangle, triangular/triangle, cylindrical/cylinder, elliptical/ellipse, (n)polygonal/(n)polygon, etc.; surface and/or bulk material properties and/or spatial/temporal resolution and/or distribution—such as, smooth, reflective, transparent, clear, opaque, rigid, impermeable, uniform(ly), inert, non-wettable, insoluble, steady, invariant, constant, homogeneous, etc.; as well as many others that would be apparent to those skilled in the relevant arts. As one example, a fabricated article that would described herein as being "square" would not require such article to have faces or sides that are perfectly planar or linear and that intersect at angles of exactly 90 degrees (indeed, such an article can only exist as a mathematical abstraction), but rather, the shape of such article should be interpreted as approximating a "square," as defined mathematically, to an extent typically achievable and achieved for the recited fabrication technique as would be understood by those skilled in the art or as specifically described.

What is claimed is:

1. A porous semiconductor material comprising:
   a semiconductor material; and
   a plurality of pores in the semiconductor material, the plurality of pores having an average pore diameter of less than 20 nm, and wherein the plurality of pores define a total volumetric porosity, measured as the total pore volume divided by the total pore volume plus solid material volume, of at least 0.1%,
   wherein at least 0.05% of the pores pass through the material from one surface to an opposite or different surface, and
   wherein the material has a thickness which is the material's minimum cross-section and which thickness is at least 0.05 micron.

2. The porous semiconductor material of claim 1, wherein the plurality of pores define a total volumetric porosity less than about 50%.

3. The porous semiconductor material of claim 2, wherein the plurality of pores define a total volumetric porosity of between about 1% and about 30%.

4. The porous semiconductor material of claim 1, wherein less than about 30% of the pores pass through the material from one surface to an opposite or different surface.

5. The porous semiconductor material of claim 4, wherein between about 0.5% and about 20% of the pores pass through the material from one surface to an opposite or different surface.

6. The porous semiconductor material of claim 5, wherein between about 1% and about 10% of the pores pass through the material from one surface to an opposite or different surface.

7. The porous semiconductor material of claim 1, wherein the material has a thickness of less than about 400 microns.

8. The porous semiconductor material of claim 7, wherein the material has a thickness of at least about 10 microns.

9. The porous semiconductor material of claim 8, wherein the material has a thickness of at least about 100 microns.

10. The porous semiconductor material of claim 9, wherein the material has a thickness of at least about 200 microns.

11. The porous semiconductor material of claim 10, wherein the material has a thickness of at least about 250 microns.

12. The porous semiconductor material of claim 1, wherein the plurality of pores are etched into the semiconductor material.

13. The porous semiconductor material of claim 1, wherein the plurality of pores have an average inter-pore spacing of less than 10 nm.

14. The porous semiconductor material of claim 1, wherein the plurality of pores have an average aspect ratio of greater than 100:1.

15. The porous semiconductor material of claim 1, wherein the plurality of pores have an average aspect ratio of greater than 1000:1.

* * * * *